(12) United States Patent
Ikeda et al.

(10) Patent No.: US 8,467,229 B2
(45) Date of Patent: Jun. 18, 2013

(54) VARIABLE RESISTANCE NONVOLATILE MEMORY DEVICE

(75) Inventors: Yuichiro Ikeda, Hyogo (JP); Kazuhiko Shimakawa, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/511,787

(22) PCT Filed: Nov. 24, 2011

(86) PCT No.: PCT/JP2011/006519
§ 371 (c)(1),
(2), (4) Date: May 24, 2012

(87) PCT Pub. No.: WO2012/070236
PCT Pub. Date: May 31, 2012

(65) Prior Publication Data
US 2012/0236628 A1 Sep. 20, 2012

(30) Foreign Application Priority Data
Nov. 24, 2010 (JP) ................................. 2010-261854

(51) Int. Cl.
*G11C 11/00* (2006.01)

(52) U.S. Cl.
USPC ........................................................ 365/148

(58) Field of Classification Search
USPC ................. 365/46, 51, 52, 94, 100, 129, 148, 365/158, 163; 257/2–4, E21.35; 438/135
See application file for complete search history.

(56) References Cited

U.S. PATENT DOCUMENTS

| 5,910,695 A | 6/1999 | Lotz |
| 6,879,505 B2 | 4/2005 | Scheuerlein |
| 6,917,532 B2 | 7/2005 | Van Brocklin et al. |

(Continued)

FOREIGN PATENT DOCUMENTS

| JP | 2004-031948 | 1/2004 |
| JP | 2005-311322 | 11/2005 |

(Continued)

OTHER PUBLICATIONS

I. G. Baek et al., "Multi-layer Cross-point Binary Oxide Resistive Memory (OxRRAM) for Post-NAND Storage Application", IEDM2005 (IEEE International Electron Devices meeting 2005), Session 31 (Fig. 7, Fig. 11), Dec. 5, 2005, pp. 769-772.

*Primary Examiner* — Harry W Byrne
(74) *Attorney, Agent, or Firm* — Wenderoth, Lind & Ponack, L.L.P.

(57) ABSTRACT

In a nonvolatile memory device, basic array planes (0 to 3) have respective first via groups (121 to 124) that interconnect only even-layer bit lines in the basic array planes, and respective second via groups (131 to 134) that interconnect only odd-layer bit lines in the basic array planes, the first via group in a first basic array plane and the second via group in a second basic array plane adjacent to the first basic array plane in a Y direction are adjacent to each other in the Y direction, and the first via group in the second basic array plane is connected to an unselected-bit-line dedicated global bit line (GBL_NS) having a fixed potential when the first via group in the first basic array plane is connected to a first global bit line related to the first basic array plane.

11 Claims, 29 Drawing Sheets

U.S. PATENT DOCUMENTS

| | | |
|---|---|---|
| 7,394,680 B2 | 7/2008 | Toda et al. |
| 7,400,522 B2 | 7/2008 | Toda et al. |
| 7,606,059 B2 | 10/2009 | Toda |
| 7,692,951 B2 | 4/2010 | Toda et al. |
| 7,778,062 B2 | 8/2010 | Toda et al. |
| 7,826,249 B2 | 11/2010 | Toda |
| 7,920,408 B2 | 4/2011 | Azuma et al. |
| 8,102,697 B2 | 1/2012 | Toda |
| 2003/0235063 A1 | 12/2003 | Van Brocklin et al. |
| 2005/0230724 A1 | 10/2005 | Hsu |
| 2006/0268594 A1* | 11/2006 | Toda ............................ 365/100 |
| 2007/0132049 A1 | 6/2007 | Stipe |
| 2007/0285966 A1 | 12/2007 | Toda et al. |
| 2007/0285967 A1 | 12/2007 | Toda et al. |
| 2007/0285968 A1 | 12/2007 | Toda et al. |
| 2008/0304308 A1 | 12/2008 | Stipe |
| 2008/0310211 A1 | 12/2008 | Toda et al. |
| 2009/0052225 A1 | 2/2009 | Morimoto |
| 2009/0168493 A1* | 7/2009 | Kim et al. ..................... 365/148 |
| 2010/0046273 A1* | 2/2010 | Azuma et al. ................. 365/148 |
| 2010/0165702 A1 | 7/2010 | Toda |
| 2011/0019462 A1 | 1/2011 | Toda |

FOREIGN PATENT DOCUMENTS

| | | |
|---|---|---|
| JP | 2006-514393 | 4/2006 |
| JP | 2006-203098 | 8/2006 |
| JP | 2007-165873 | 6/2007 |
| JP | 4280320 | 6/2009 |
| WO | 2004/084229 | 9/2004 |
| WO | 2009/001534 | 12/2008 |

* cited by examiner

Bipolar type memory cell

Unipolar type memory cell

Single-layer crosspoint memory cells

Multilayer crosspoint memory cells

When accessing BL_e2

When accessing BL_e3

When accessing BL_e2

When accessing BL_e3

VARIABLE RESISTANCE NONVOLATILE MEMORY DEVICE

TECHNICAL FIELD

The present invention relates to a variable resistance nonvolatile memory device having memory cells that use so-called variable resistance elements.

BACKGROUND ART

In recent years, progressive research and development has been conducted on variable resistance nonvolatile memory devices having memory cells that use so-called variable resistance elements (hereinafter, also simply referred to as "nonvolatile memory devices"). A variable resistance element is an element that has a property of changing its resistance value according to an electrical signal, and enables information to be written due to such a change in the resistance value.

One structure of memory cells that use variable resistance elements is a crosspoint structure. In the crosspoint structure, each memory cell is placed at a different one of crosspoints of orthogonally arranged bit lines and word lines so as to be interposed between a corresponding one of the bit lines and a corresponding one of the word lines. Conventionally, various configurations of a nonvolatile memory device having such a crosspoint structure have been proposed (Patent Literatures (PTLs) 1 to 6, Non-Patent Literature (NPL) 1, etc.).

PTL 1 discloses a nonvolatile memory device that uses bidirectional variable resistors as memory cells. PTL 1 discloses that a varistor, for example, is used for a diode of a memory cell, as a bidirectional nonlinear element, in order to reduce a so-called leakage current that flows into unselected cells. PTL 1 also discloses the crosspoint structure.

PTL 2 discloses a nonvolatile memory device including a three-dimensional crosspoint variable resistance memory cell array having a multilayer structure.

NPL 1 discloses a memory cell structure having a combination of a variable resistance film and a unidirectional diode. NPL 1 also discloses a multilayer structure.

PTL 3 discloses a multilayer memory structure in which memory cells including Zener diodes and variable resistance memory elements that can be rewritten with a bipolar voltage are used.

PTL 4 discloses a multilayer memory structure using memory cells including memory elements and unidirectional control elements.

PTL 5 discloses a nonvolatile memory that has a three-dimensional structure, and uses memory cells having polysilicon diodes and including variable-resistance memory elements (RRAMs) that can be rewritten with a unipolar voltage. As shown in FIG. 24, PTL 5 discloses a word line structure in which odd-layer word lines and even-layer word lines within the same array plane are connected to respective different vertical wires (tree trunks). Here, odd-layer word lines and even-layer word lines in a certain array plane are connected to respective different drive circuits via drivers. Further, a driver that selects odd-layer word lines and a driver that selects even-layer word lines in a certain array plane, and a driver that selects odd-layer word lines and a driver that selects even-layer word lines in an array plane adjacent to the certain array plane are controlled by respective different control signals. It should be noted that although PTL 5 discloses the case of word lines, it is easily inferred that such a structure can be applied to bit lines rather than word lines.

CITATION LIST

Patent Literature

[PTL 1] Japanese Unexamined Patent Application Publication No. 2006-203098 (FIGS. 2 and 5)
[PTL 2] Japanese Unexamined Patent Application Publication No. 2005-311322 (FIG. 4)
[PTL 3] Japanese Unexamined Patent Application Publication No. 2006-514393
[PTL 4] Japanese Unexamined Patent Application Publication No.
[PTL 5] Japanese Unexamined Patent Application Publication No. 2007-165873 (FIGS. 5 and 9)
[PTL 6] International Patent Application Publication No. 2009/001534

Non Patent Literature

[NPL 1] Baek, I. G. et al., "Mufti-layer Cross-point Binary Oxide Resistive Memory (OxRRAM) for Post-NAND Storage Application" IEDM2005 (IEEE International Electron Devices Meeting 2005), Dec. 5, 2005, pp. 769-772, Session 31 (FIGS. 7 and 11)

SUMMARY OF INVENTION

Technical Problem

However, there is a problem that when a conventional nonvolatile memory device as described above is realized as an integrated circuit, high integration is difficult due to an increase in the layout area therefor.

For example, in the structure described in PTL 5, a driver that drives odd-layer word lines and a driver that drives even-layer word lines within the same array plane are controlled by respective different control signals and connected to respective different drive circuits. Further, drivers in a certain array plane and those in an array plane adjacent to that array plane are controlled by respective different control signals and connected to respective different drive circuits. Therefore, four drivers are necessary for two array planes, and in addition, the four drivers need to be connected to respective different drive circuits, and one terminal of each of the drivers cannot be shared. Thus, the layout area for the drive circuits is increased, which results in a problem of difficulty in high integration of a nonvolatile memory device.

To address this problem, PTL 6 discloses that with a hierarchical bit line structure in which odd-layer bit lines and even-layer bit lines within the same array plane are connected to respective common contact vias, the contact vias to which the odd-layer bit lines and the even-layer bit lines are connected are further selected using respective selection switches, and one diffusion region of each of the selection switches is shared, thereby enabling suppression of an increase in a layout area. Furthermore, PTL 6 also discloses that gates of selection switches for odd-layer bit lines in a plurality of planes are commonly connected, and similarly gates of selection switches for even-layer bit lines are commonly connected, thereby constituting blocks, and accesses are made on a block-by-block basis, and thus the layout area can be reduced.

Here, in designing of a memory cell array in general, the area therefor is required to be decreased as much as possible, and bit lines and word lines are each wired at minimum intervals allowed in the implementing process. However, when the interval between adjacent lines is decreased due to miniaturization, coupling capacitance between lines is increased, and thus a signal is transmitted to an unselected bit line or an unselected word line adjacent to a selected bit line and a selected word line due to capacitive coupling, which exerts an influence on the behavior of a signal in the selected bit line and the selected word line. With the structure disclosed in PTL 6 (FIG. 25), in a basic array plane group 400, the behavior of a signal in an unselected bit line adjacent to a selected bit line is different in the case of selecting a memory cell in an array plane located in an inner part of a block and in the case of selecting a memory cell in an array plane located at the end portion of the block, and thus even when the resistance value written in the memory cells is the same, there is a difference in the behavior of signals in selected lines depending on the position of the selected memory cells, and variations in read speed occur, which is a problem (details of this operation will be described below). Accordingly, it is necessary to take one of the following measures, namely, designing a circuit with a margin for the variation provided in the read speed and designing a layout with a margin provided in the wiring intervals between bit lines and in the wiring intervals between word lines.

In view of the problem stated above, an object of the present invention is to provide a nonvolatile memory device that uses variable resistance nonvolatile memory elements, the device enabling the wiring of bit lines and word lines of a memory cell array at minimum intervals allowed in the implementing process, without providing a margin in the design of a read circuit.

Solution to Problem

In order to achieve the above object, a variable resistance nonvolatile memory device according to an aspect of the present invention is a variable resistance nonvolatile memory device including memory cells each having a variable resistance element, a resistance state of which reversibly changes based on an electrical signal, the device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, and the Z direction being a direction in which the layers are stacked above the main surface of the substrate; word lines in a plurality of layers which are stacked in the Z direction and formed at respective intervals between the layers of the bit lines, and in which the word lines extending in the Y direction are aligned in the X direction; a memory cell array having the memory cells which are formed at respective crosspoints of the bit lines in the layers and the word lines in the layers, and each of which is interposed between a corresponding one of the bit lines and a corresponding one of the word lines, the memory cell array including basic array plane groups arranged in a matrix in the X and Y directions, the basic array plane groups each including a plurality of basic array planes which are aligned in the Y direction and each of which has memory cells included in the memory cells and interposed between, among the bit lines in the layers, bit lines in the layers at the same position in the Y direction and the word lines crossing the bit lines at the same position; selected-bit-line dedicated global bit lines provided in one-to-one correspondence with the basic array planes; an unselected-bit-line dedicated global bit line provided in correspondence with the basic array planes; and sets each including a first selection switch element, a second selection switch element, a third selection switch element, and a fourth selection switch element, the sets being provided in one-to-one correspondence with the basic array planes, wherein each of the basic array planes further includes a first internal wire interconnecting only even-layer bit lines among the bit lines in the basic array plane, and a second internal wire interconnecting only odd-layer bit lines among the bit lines in the basic array plane, and for each of the basic array planes, the first internal wire in the basic array plane is connected to the selected-bit-line dedicated global bit line corresponding to the basic array plane via one of the first selection switch element and the second selection switch element that are included in the set corresponding to the basic array plane, and the second internal wire in the basic array plane is connected to the corresponding selected-bit-line dedicated global bit line via the other of the first selection switch element and the second selection switch element that are included in the corresponding set, and when one of the basic array planes included in the basic array plane groups is a first basic array plane, and a different one of the basic array planes is a second basic array plane, the different one being adjacent to the first basic array plane in the Y direction, the first internal wire in the first basic array plane and the second internal wire in the second basic array plane are adjacent to each other in the Y direction, and the second internal wire in the first basic array plane and the first internal wire in the second basic array plane are adjacent to each other in the Y direction, the first internal wire in the first basic array plane is connected to the selected-bit-line dedicated global bit line corresponding to the first basic array plane via the first selection switch element corresponding to the first basic array plane or is connected to the unselected-bit-line dedicated global bit line via the third selection switch element corresponding to the first basic array plane, and the second internal wire in the first basic array plane is connected to the selected-bit-line dedicated global bit line corresponding to the first basic array plane via the second selection switch element corresponding to the first basic array plane or is connected to the unselected-bit-line dedicated global bit line via the fourth selection switch element corresponding to the first basic array plane, the second internal wire in the second basic array plane is connected to the selected-bit-line dedicated global bit line corresponding to the second basic array plane via the first selection switch element corresponding to the second basic array plane or is connected to the unselected-bit-line dedicated global bit line via the third selection switch element corresponding to the second basic array plane, and the first internal wire in the second basic array plane is connected to the selected-bit-line dedicated global bit line corresponding to the second basic array plane via the second selection switch element corresponding to the second basic array plane or is connected to the unselected-bit-line dedicated global bit line via the fourth selection switch element corresponding to the second basic array plane, and with regard to the first selection switch elements, the second selection switch elements, the third selection switch elements, and the fourth selection switch elements corresponding to the basic array planes, electrical connection and disconnection of the first the selection switch elements are controlled by a common first bit line selection signal, electrical connection and disconnection of the second selection switch elements are controlled by a common second bit line selection signal, electrical connection and disconnection of the third selection switch elements are controlled by a common third bit line selection signal, and electrical connection and disconnection of the fourth selection switch elements are controlled by a common fourth bit line selection signal.

Accordingly, the first internal wire in the first basic array plane and the second internal wire in the second basic array plane adjacent to the first basic array plane in the Y direction are adjacent to each other in the Y direction, and the second internal wire in the first basic array plane and the first internal wire in the second basic array plane are adjacent to each other in the Y direction, and thus irrespective of the position of a bit line to be selected, an unselected bit line adjacent to the selected bit line in the same wiring layer (i.e., in the Y direction) is connected to the unselected-bit-line dedicated global bit line, so that the potential thereof is fixed. Consequently, a problem does not occur that the behavior of a signal in the selected bit line differs depending on the position of the selected bit line. Further, bit lines and word lines of a memory cell array can be wired at minimum intervals allowed in the implementing process, without providing a margin in the design of a read circuit.

Here, it is preferable that in each of the basic array planes, the first selection switch element and the third selection switch element are respectively controlled by the first bit line selection signal and the third bit line selection signal, such that one of the first and third selection switch elements is disconnected when the other is connected, the second selection switch element and the fourth selection switch element are respectively controlled by the second bit line selection signal and the fourth bit line selection signal, such that one of the second and fourth selection switch elements is disconnected when the other is connected, and the first selection switch element and the second selection switch element are respectively controlled by the first bit line selection signal and the second bit line selection signal, such that one of the first and second selection switch elements is disconnected when the other is connected. Accordingly, when the first bit line selection signal is selected (when the first selection switch element is connected), the second and third bit line selection signals are unselected (the second and third selection switch elements are disconnected), and the fourth bit line selection signal is selected (the fourth selection switch element is connected), and thus irrespective of the position of a bit line to be selected, an unselected bit line adjacent to the selected bit line in the same wiring layer (i.e., in the Y direction) is controlled so as to be connected to the unselected-bit-line dedicated global bit line, and have its potential fixed.

Here, it is preferable that the first selection switch elements each include one of an N-channel metal-oxide semiconductor (N-MOS) transistor and a P-channel metal-oxide semiconductor (P-MOS) transistor, and the third selection switch elements each include the other, the second selection switch elements each include one of the N-MOS transistor and the P-MOS transistor, and the fourth selection switch elements each include the other, the same signal serves as the first bit line selection signal and the third bit line selection signal, the same signal serves as the second bit line selection signal and the fourth bit line selection signal, one of the first bit line selection signal and the second bit line selection signal performs control such that corresponding ones of the first to fourth selection switch elements are connected, and the other of the first bit line selection signal and the second bit line selection signal performs control such that corresponding ones of the first to fourth selection switch elements are disconnected. Accordingly, a common signal serves as the first bit line selection signal and the third bit line selection signal, and furthermore a common signal serves as the second bit line selection signal and the fourth bit line selection signal, and thus it is possible to perform control such that using only two types of bit line selection signals, one of the two internal wires in each of the basic array planes is connected to the corresponding selected-bit-line dedicated global bit line, and the other is connected to the unselected-bit-line dedicated global bit line, thereby simplifying the control thereof.

Here, it is preferable that the first selection switch elements and the second selection switch elements each include the N-MOS transistor, and the third selection switch elements and the fourth selection switch elements each include the P-MOS transistor. Accordingly, N-channel metal-oxide semiconductor (N-MOS) transistors are used for the first and second selection switch elements that are selection switch elements on the selected bit line side and need to have a high driving capability, and P-channel metal-oxide semiconductor (P-MOS) transistors are used for the third and fourth selection switch elements that are selection switch elements on the unselected bit line potential fixing side and do not need to have a high driving capability, and thus the layout area can be further decreased.

Further, the variable resistance nonvolatile memory device may further include: a global bit line decoder/driver that selects at least one of the selected-bit-line dedicated global bit lines, applies a read voltage to the at least one selected-bit-line dedicated global bit line which is selected, and applies a precharge voltage previously determined to the unselected-bit-line dedicated global bit line; a read circuit that reads a resistance state of a memory cell in the basic array plane corresponding to the at least one selected-bit-line dedicated global bit line selected by the global bit line decoder/driver; and a control circuit that controls the global bit line decoder/driver, wherein when an operation of reading from a memory cell in one of the basic array planes is performed, the control circuit may control the global bit line decoder/driver such that the precharge voltage is applied to a bit line of the basic array plane via the unselected-bit-line dedicated global bit line. Accordingly, the precharge voltage is applied to a bit line of a basic array plane via the unselected-bit-line dedicated global bit line when reading from a memory cell, and thus a precharge operation can be performed at an increased speed.

Here, the variable resistance nonvolatile memory device may further include: a global bit line decoder/driver that selects at least one of the selected-bit-line dedicated global bit lines, applies a read voltage to the at least one selected-bit-line dedicated global bit line which is selected, and drives the unselected-bit-line dedicated global bit line; a read circuit that reads a resistance state of a memory cell in the basic array plane corresponding to the at least one selected-bit-line dedicated global bit line selected by the global bit line decoder/driver; and a control circuit that controls the global bit line decoder/driver, wherein when an operation of reading from a memory cell in one of the basic array planes is performed, the control circuit may control the global bit line decoder/driver such that the unselected-bit-line dedicated global bit line is caused to be in a floating state. The capacitance of the unselected-bit-line dedicated global bit line is usually large, and thus in many cases, a voltage thereof hardly changes even when the line is caused to be in the floating state. Therefore, the consumption of electric current can be reduced by not driving the unselected-bit-line dedicated global bit line, and causing the line to be in the floating state.

Further, the unselected-bit-line dedicated global bit line may be disposed so as to be parallel and adjacent to the selected-bit-line dedicated global bit line corresponding to the first basic array plane, and to the selected-bit-line dedicated global bit line corresponding to the second basic array plane. Accordingly, the unselected-bit-line dedicated global bit line functions as a shielding wire for the selected-bit-line dedicated global bit lines, and thus noise from other lines during the read operation is reduced.

Further, for each of the basic array planes, the first internal wire in the basic array plane may connect all the even-layer bit lines in the basic array plane using a single via, and the second internal wire in the basic array plane may connect all the odd-layer bit lines in the basic array plane using a single via, the even-layer bit lines being adjacent to each other in the Z direction with the odd-layer bit lines in the basic array plane interposed, and the odd-layer bit lines being adjacent to each other in the Z direction with the even-layer bit lines in the basic array plane interposed. Accordingly, by causing the first internal wire to have a single through via structure, an odd-layer through via is not formed at the point in time when forming even-layer bit lines, and thus an interval between sets of even-layer bit lines in via regions is twice as much as the interval between basic array planes, thereby allowing a manufacturing process to be performed with ease. Similarly, by causing the second internal wire to have a single through via structure, an even-layer through via is not formed at the point in time when forming odd-layer bit lines, and thus an interval between sets of odd-layer bit lines in via regions is twice as much as the interval between basic array planes, thereby allowing a manufacturing process to be performed with ease.

Further, the variable resistance nonvolatile memory device may further include, for each of the basic array planes, a current limiting circuit between the selected-bit-line dedicated global bit line corresponding to the basic array plane and terminals, one of the terminals being a terminal of the first selection switch element corresponding to the basic array plane, and the other of the terminals being a terminal of the second selection switch element corresponding to the basic array plane. Accordingly, a current limiting circuit is inserted between a corresponding global bit line for selected bit line and the first and second selection switch elements, and thus a problem is prevented that, for example, the resistance of the variable resistance element is excessively decreased, which causes the subsequent operation to be unstable.

Further, the variable resistance nonvolatile memory device may further include a reading control circuit that prevents, when an operation of reading from a memory cell in the first basic array plane is performed, an operation of reading from a memory cell in the second basic array plane from being simultaneously performed. At this time, it is preferable that when the operation of reading from a memory cell in the first basic array plane is performed, the reading control circuit further causes an operation of reading from a memory cell in a third basic array plane to be simultaneously performed, the third basic array plane not being adjacent to the first basic array plane in the Y direction. Accordingly, when memory cells in a plurality of given basic array planes in a basic array plane group are simultaneously selected (read), a bit line adjacent to each selected bit line in the Y direction is always an unselected bit line, and thus a problem does not occur that the behavior of a signal in an adjacent line in the Y direction differs depending on the position of a memory cell (bit line) to be selected, which causes variations in a read speed.

Advantageous Effects of Invention

According to the present invention, a variable resistance nonvolatile memory device that includes a memory cell array with a mufti-layer stack structure can be constituted without the need to design a read circuit having a margin provided in the read speed of a read circuit, and with use of minimum wiring intervals allowed in a process to be implemented as an integrated circuit, and thus the area for the variable resistance nonvolatile memory device can be decreased.

DESCRIPTION OF EMBODIMENTS

The following is a detailed description of embodiments of a variable resistance nonvolatile memory device according to the present invention, with reference to drawings.

<Configuration of Variable Resistance Nonvolatile Memory Device According to Present Invention>

(Memory Cell)

Figure 1A:
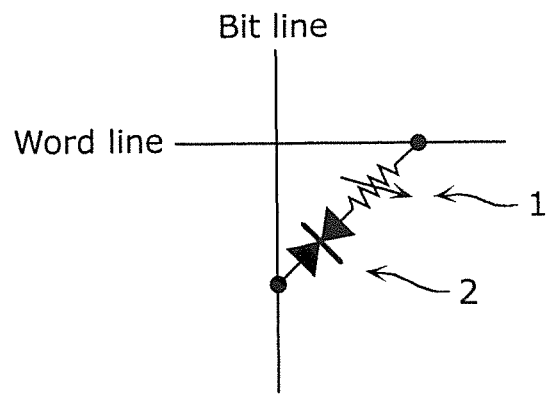
FIG. 1A is a circuit diagram of a memory cell in embodiments of the present invention.

FIG. 1A is a circuit diagram of a memory cell (crosspoint memory cell) included in a variable resistance nonvolatile memory device in the embodiments of the present invention. As shown in FIG. 1A, in the embodiments of the present invention, bipolar type memory cells are assumed to be used whose resistance value changes due to application of voltages or currents that are of different polarities and greater than or equal to a predetermined threshold value. Each bipolar type memory cell includes a variable resistance nonvolatile memory element 1 whose resistance changes due to bidirectional voltage or current application (hereinafter, also referred to as variable resistance element 1) and a bidirectional diode element 2 connected to the variable resistance element 1 in series. The variable resistance element 1 can be at least in a low resistance state and a high resistance state, and write information therein according to a reversible change in the resistance value (resistance state) based on applied electrical signals of different polarities. Specifically, the variable resistance element 1 has a property of changing its state to the high resistance state when a voltage applied to the variable resistance element 1 in the low resistance state has a first polarity and the absolute value of the voltage exceeds a first predetermined voltage, and changing its state to the low resistance state when an absolute value of a voltage applied to the variable resistance element 1 in the high resistance state in a direction opposite (second polarity) to the direction in which the first voltage is applied (application polarity) exceeds a second predetermined voltage. The bidirectional diode element 2 has a nonlinear current characteristic with respect to an applied voltage and is bidirectional, thus allowing a current to flow bidirectionally (into a positive voltage region and a negative voltage region).

Figure 2:
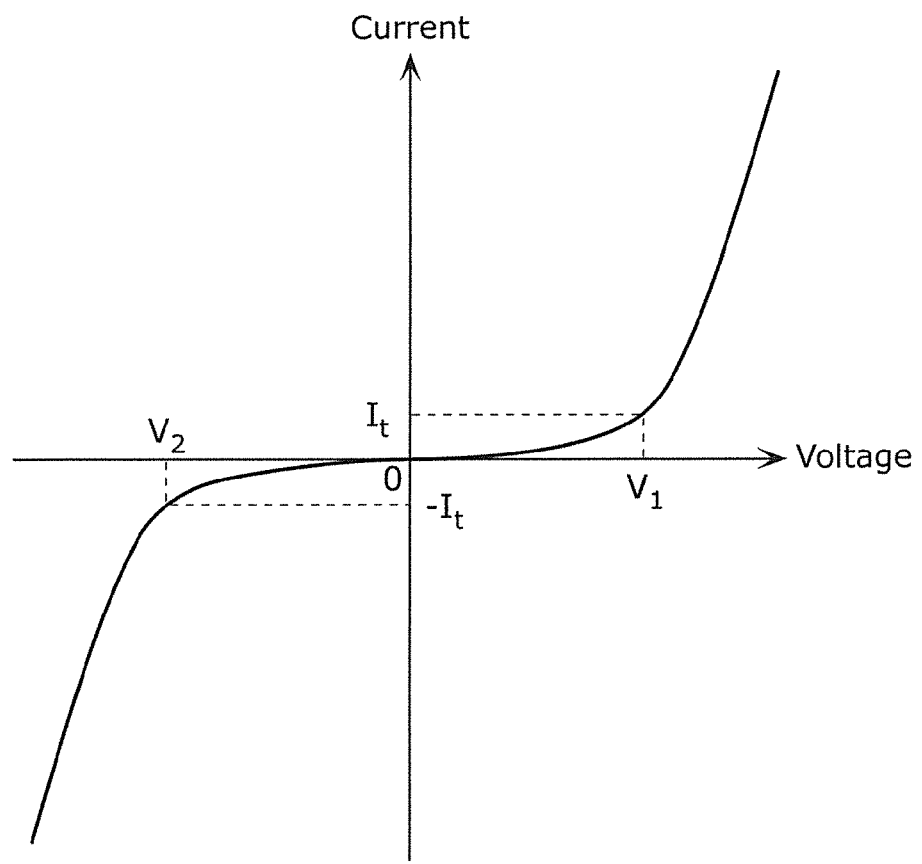
FIG. 2 is a graph showing an example of a voltage-current characteristic of a bidirectional diode element.

FIG. 2 shows an example of a voltage-current characteristic of the bidirectional diode element 2. It (>0) represents a predetermined current value for determining a threshold voltage of the bidirectional diode element 2, V1 represents a first threshold voltage (positive threshold voltage), and V2 represents a second threshold voltage (negative threshold voltage). As shown in FIG. 2, this characteristic is nonlinear, and a resistance is high in a region in which voltage V satisfies V2<V<V1, which substantially prevents a current from flowing. At this time, assuming that a current that flows through the bidirectional diode element 2 is I, I satisfies the following relationship:

$$-It < I < It$$

In contrast, in a region in which voltage V satisfies V≦V2 or V1≦V, a resistance value falls rapidly, which allows a large current to flow. At this time, It≦I is satisfied in a region in which V1≦V, and I≦It is satisfied in a region in which V≦V2.

A predetermined current (It) for determining a threshold voltage here is a value that can be arbitrarily determined, and is determined according to a characteristic of an element controlled by a diode, and a characteristic of a diode. Normally, a current at the point in time when a state in which a current does not substantially flow is shifted to a state in which a large current flows is determined as a threshold current.

It should be noted that although the magnitude of a current at the time of positive voltage and the magnitude of a current at the time of negative voltage are illustrated to have origin symmetry in FIG. 2, these do not necessarily need to be symmetrical. For example |V1| may be smaller than |V2|, or |V2| may be smaller than |V1|.

A memory element is realized using a bipolar type memory cell provided between a bit line and a word line.

Figure 1B:
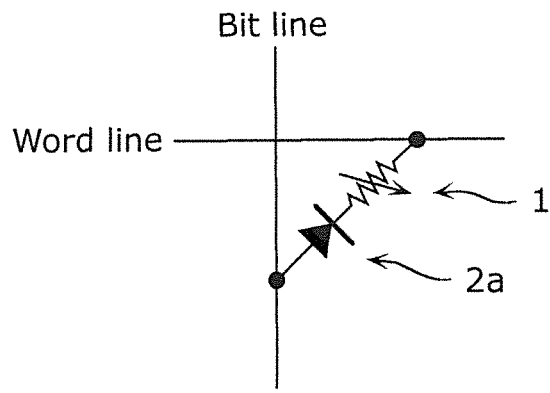
FIG. 1B is a circuit diagram of a unipolar type memory cell in the embodiments of the present invention.
Figure 1C:
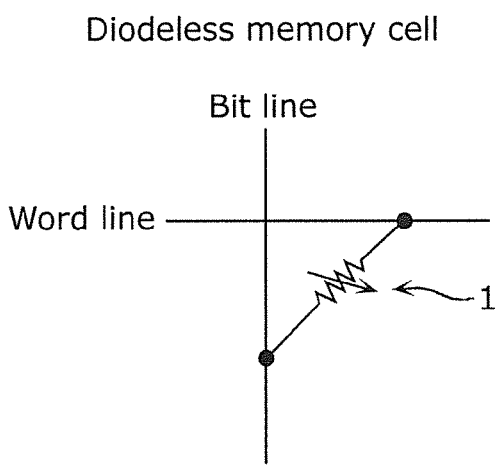
FIG. 1C is a circuit diagram of a diodeless memory cell in the embodiments of the present invention.

It should be noted that a unipolar type memory cell including the variable resistance element 1 and a unidirectional diode element 2a as shown in FIG. 1B or a diodeless memory cell including only the variable resistance element 1 as shown in FIG. 1C can be adopted as a configuration of a memory cell included in a variable resistance nonvolatile memory device according to the present invention.

Here, one terminal of the variable resistance element is connected to a bit line, the other terminal of the variable resistance element and one terminal of the diode element are connected to each other, and the other terminal of the diode element is connected to a word line in FIGS. 1A and 1B; however, one terminal of the variable resistance element may be connected to a word line, the other terminal of the variable resistance element and one terminal of the diode element may be connected to each other, and the other terminal of the diode element may be connected to a bit line.

Figure 3A:
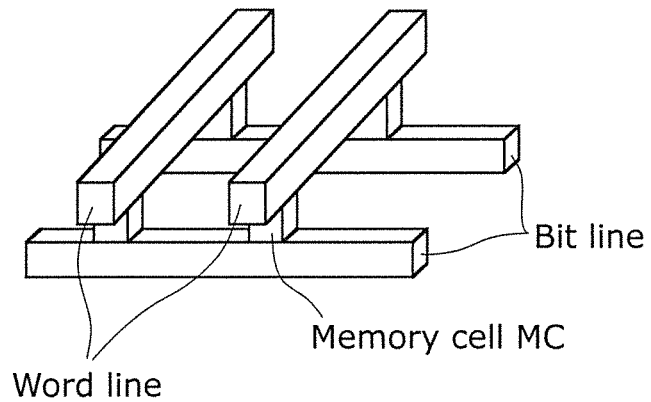
FIG. 3A shows a single-layer crosspoint structure.
Figure 3B:
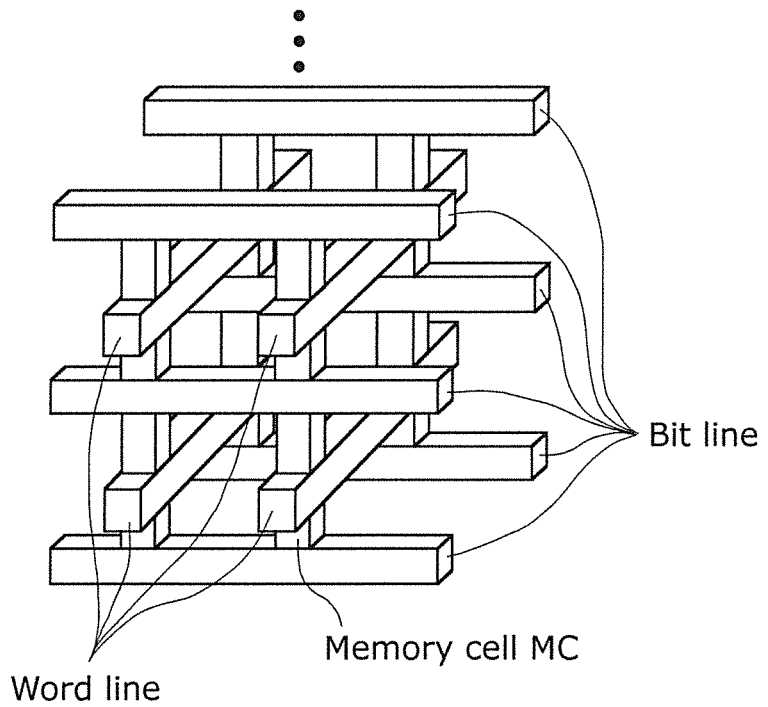
FIG. 3B shows a multilayer crosspoint structure.

FIGS. 3A and 3B are conceptual diagrams showing a three-dimensional structure including memory cells. FIG. 3A shows a three-dimensional structure which includes so-called single-layer crosspoint memory cells, and in which each memory cell MC is placed at a different one of crosspoints between bit lines and word lines that are orthogonally arranged so as to be interposed between a corresponding one of the bit lines and a corresponding one of the word lines. FIG. 3B shows a three-dimensional structure which includes so-called multilayer crosspoint memory cells, and in which the single-layer crosspoint memory cells in FIG. 3A are stacked.

Figure 4A:
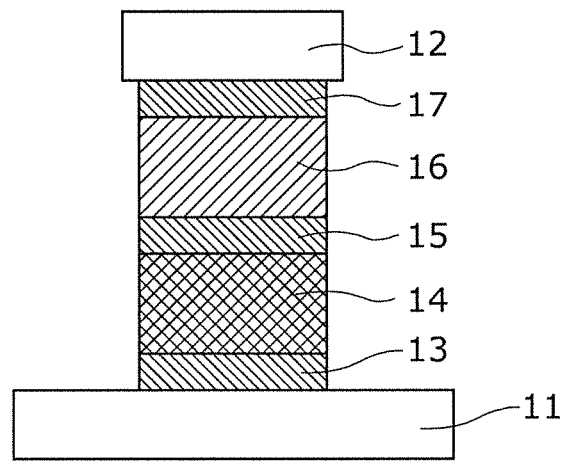
FIG. 4A shows an example of a cross-sectional structure of a memory cell in the embodiments of the present invention.

FIG. 4A shows an example of the cross-sectional structure of various memory cells in the embodiments of the present invention. In FIG. 4A, one of a lower wire 11 and an upper wire 12 is a bit line, and the other is a word line. Further, a lower electrode 13, a diode layer 14, an internal electrode 15, a variable resistance layer 16, and an upper electrode 17 are formed between the lower wire 11 and the upper wire 12, in this stated order. Specifically, in the configuration in FIG. 4A, the diode element 2 is composed of the lower electrode 13, the diode layer 14, and the internal electrode 15, and the variable resistance element 1 is composed of the internal electrode 15, the variable resistance layer 16, and the upper electrode 17.

It should be noted that an oxygen-deficient transition metal oxide can be used for the variable resistance layer 16. A tantalum oxide can be used for the transition metal oxide, and $0<x<2.5$ when the composition thereof is expressed by $TaO_x$. Specifically, the oxygen content needs to be lower than that of $Ta_2O_5$, which is a stoichiometric composition. In particular, a $TaO_x$ film where $0.8 \leq x \leq 1.9$ is desirable in the embodiments of the present invention.

A hafnium oxide or a zirconium oxide can be used as another transition metal oxide. When the composition of a hafnium oxide is expressed by $HfO_x$, at least $0<x<2.0$ needs to be satisfied. Furthermore, $0.9 \leq x \leq 1.6$ is desirable. When the composition of a zirconium oxide is expressed by $ZrO_x$, at least $0<x<2.0$ needs to be satisfied. Furthermore, $0.9 \leq x \leq 1.4$ is desirable.

Figure 4B:
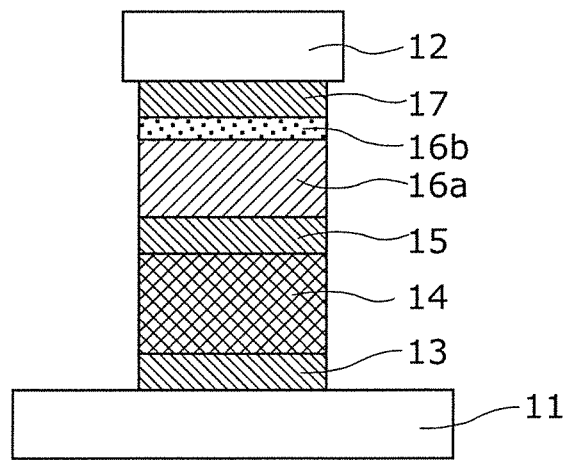
FIG. 4B shows another example of a cross-sectional structure of a memory cell in the embodiments of the present invention.

FIG. 4B shows another example of the cross-sectional structure of a memory cell in the embodiments of the present invention, and the variable resistance layer has a stack structure. Specifically, the variable resistance layer 16 has a stack structure including a first variable resistance layer 16a and a second variable resistance layer 16b. Here, it is preferable that the second variable resistance layer 16b has a higher oxygen content and is thinner than the first variable resistance layer 16a. For example, when a tantalum oxide is used, the stack structure includes a first tantalum oxide layer (composition: $TaO_x$) 16a and a second tantalum oxide layer (composition: $TaO_y$) 16b. Here, it is preferable that $0<x<2.5$ and $x<y$ are satisfied. More suitably, it is preferable that the second tantalum oxide layer ($TaO_y$) 16b is in contact with the upper electrode 17, and has a thickness of 1 nm to 8 nm both inclusive, and $0.8 \leq x \leq 1.9$ and $2.1 \leq y$ are satisfied.

When a hafnium oxide is used for the variable resistance layer of the stack structure, the stack structure includes a first hafnium oxide layer (composition: $HfO_x$) 16a and a second hafnium oxide layer (composition: $HfO_y$) 16b. Here, it is preferable that $0<x<2.0$ and $x<y$ are satisfied. More suitably, it is preferable that the second hafnium oxide layer ($HfO_y$) 16b is in contact with the upper electrode 17, and has a thickness of 4 nm to 5 nm both inclusive, and $0.9 \leq x \leq 1.6$ and $1.8<y$ are satisfied. When a zirconium oxide is used for the variable resistance layer of the stack structure, the stack structure includes a first zirconium oxide layer (composition: $ZrO_x$) 16a and a second zirconium oxide layer (composition: $ZrO_y$) 16b. Here, it is preferable that $0<x<2.0$ and $x<y$ are satisfied. More suitably, it is preferable that the second zirconium oxide layer ($ZrO_y$) 16b is in contact with the upper electrode 17, and has a thickness of 1 nm to 5 nm both inclusive, and $0.9 \leq x \leq 1.4$ and $1.9<y$ are satisfied.

Here, it is preferable that the upper electrode 17 in contact with the second variable resistance layer 16b comprises one or more materials, such as, for example, Au (gold), Pt (platinum), Ir (iridium), Pd (palladium), Cu (copper), and Ag (silver), each of which has a standard electrode potential higher than the standard electrode potential of the metal of the second variable resistance layer 16b (e.g., Ta, Hf, or Zr), and the internal electrode 15 comprises a material (such as, e.g., W, Ni, or TaN) having a standard electrode potential lower than the standard electrode potential of the material of the upper electrode 17.

Figure 4C:
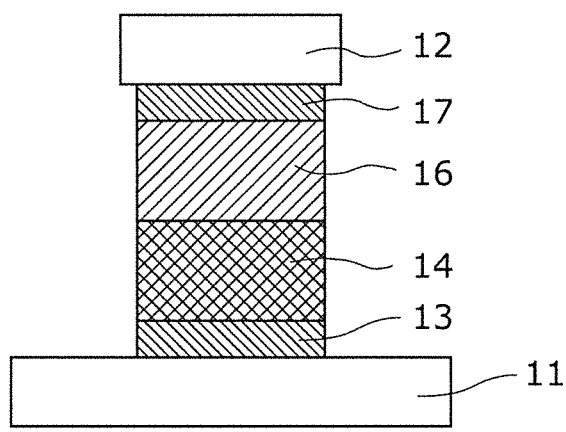
FIG. 4C shows another example of a cross-sectional structure of a memory cell in the embodiments of the present invention.
Figure 4D:
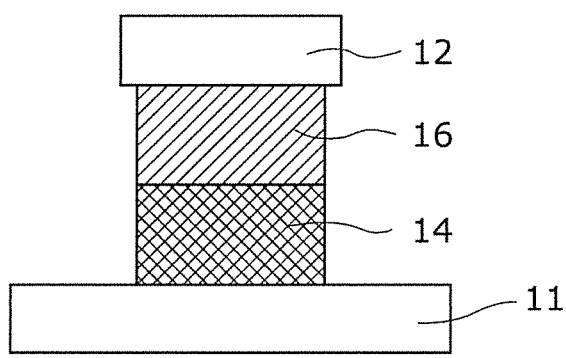
FIG. 4D shows another example of a cross-sectional structure of a memory cell in the embodiments of the present invention.

FIGS. 4C and 4D show other examples of the cross-sectional structure of memory cells in the embodiments of the present invention. The internal electrode 15 is excluded in FIG. 4C, and in FIG. 4D, the lower electrode 13 and the upper electrode 17 are further excluded, and the lower wire 11 and the upper wire 12 also serve as the lower electrode and the upper electrode, respectively. In the configuration of FIG. 4C, the diode element 2 is composed of the lower electrode 13, the diode layer 14, and the variable resistance layer 16 (also serving as the other electrode of the diode element 2), and the variable resistance element 1 is composed of the diode layer 14 (also serving as the other electrode of the variable resistance element 1), the variable resistance layer 16, and the upper electrode 17. In the configuration of FIG. 4D, the diode element 2 is composed of the lower wire 11, the diode layer 14, and the variable resistance layer 16 (also serving as the other electrode of the diode element 2), and the variable resistance element 1 is composed of the diode layer 14 (also serving as the other electrode of the variable resistance element 1), the variable resistance layer 16, and the upper wire 12. The material that can be used is limited as the structure of a memory cell is further simplified.

Figure 4E:
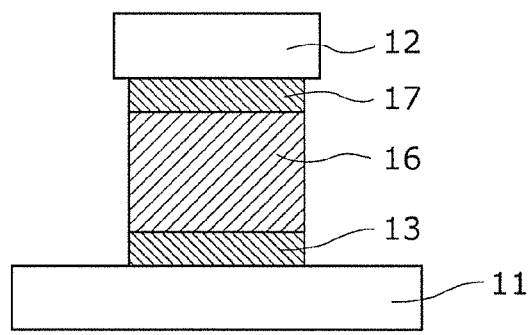
FIG. 4E shows an example of a cross-sectional structure of the diodeless memory cell in FIG. 1C, in the embodiments of the present invention.

FIG. 4E shows an example of the cross-sectional structure of the diodeless memory cell in FIG. 1C. It should be noted that it is possible to form the variable resistance layer 16 in the stack structure in all of FIGS. 4C, 4D, and 4E, as in FIG. 4B. It should be noted that although FIGS. 4A to 4E show a structure in which the variable resistance element is disposed over the diode element, a configuration may be adopted in which the diode element is disposed over the variable resistance element.

Figure 5:
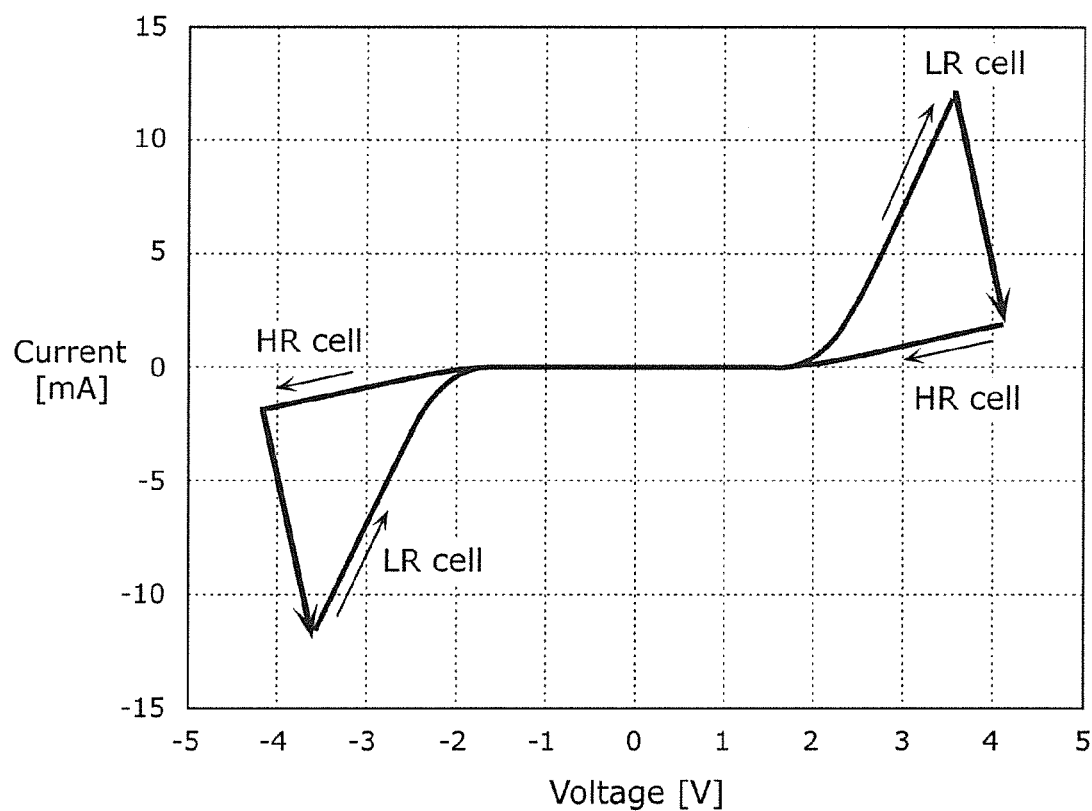
FIG. 5 is a graph showing a current-voltage relationship of a memory cell in the embodiments of the present invention.

FIG. 5 is a graph showing a current-voltage relationship of a memory cell in the embodiments of the present invention. The graph in FIG. 5 corresponds to the current-voltage characteristic of the memory cell in the circuit diagram of FIG. 1A. In FIG. 5, the horizontal axis represents a voltage applied between a bit line and a word line, and the vertical axis represents a current that flows through a memory cell. Further, an "LR cell" shown in FIG. 5 indicates that a memory cell (more strictly, the variable resistance element in the memory cell) is in the low resistance state, and an "HR cell" indicates that a memory cell (more strictly, the variable resistance element in the memory cell) is in the high resistance state. As shown in FIG. 5, now assuming that a memory cell is in the low resistance state (LR cell), when a voltage applied to the memory cell increases and exceeds about "2 V", a current greatly increases. When the voltage further increases and becomes close to about "4 V", the resistance value of the memory cell changes rapidly, and the memory cell enters the high resistance state (HR cell), and a current greatly decreases. On the other hand, when a voltage applied to the memory cell is decreased and becomes lower than about "−4 V", the resistance value of the memory cell changes rapidly, the memory cell enters the low resistance state (LR cell), and a current greatly increases. In this way, a resistance change occurs bidirectionally for the polarities of the applied voltage.

Embodiment 1

Figure 6:
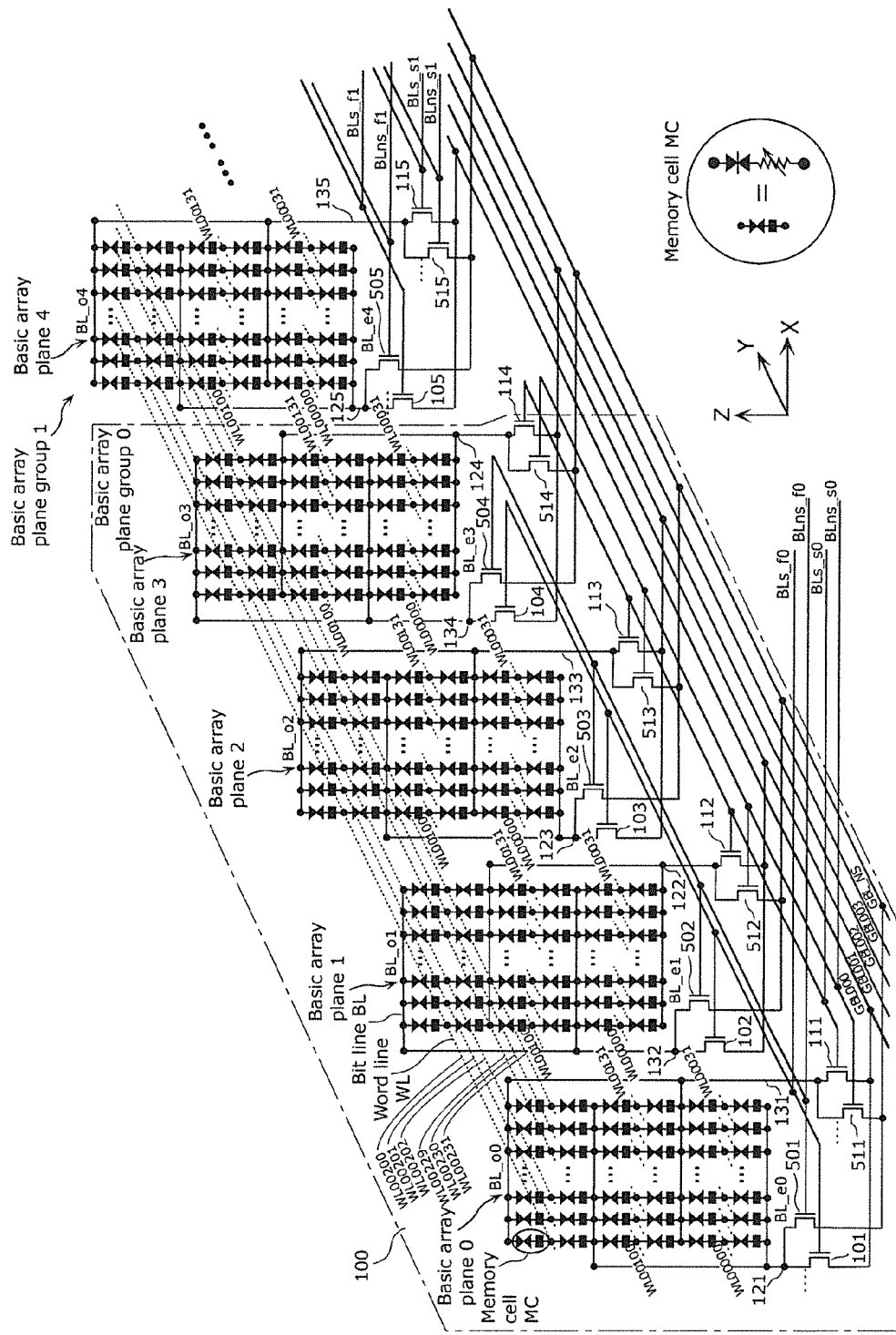
FIG. 6 is a circuit diagram showing an embodiment of a configuration of a basic array plane group according to Embodiment 2.

FIG. 6 is a circuit diagram showing the configuration of a basic array plane group 100 in the variable resistance nonvolatile memory device according to Embodiment 1. In FIG. 6, the X direction is a direction in which bit lines (also referred to as sub-bit lines) extend, the Y direction is a direction in which word lines extend, and the Z direction is a direction in which layers of the bit lines and the word lines are stacked. In other words, the X direction and the Y direction are directions orthogonal to each other on a plane parallel to the main surface of a substrate (not shown) serving as a base above which memory cells are formed, and the Z direction is a direction in which layers are stacked above the main surface of the substrate.

In FIG. 6, when each layer is a layer in which a plurality of bit lines that extend in the X direction are aligned in the Y direction, bit lines BL are formed in a plurality of layers stacked in the Z direction (which form a basic array plane, and basic array planes having four layers form one basic array plane group in FIG. 6). When each layer is a layer in which a plurality of word lines that extend in the Y direction are aligned in the X direction, word lines WL are formed in layers (three layers in FIG. 6) between the bit lines. Then, in the basic array plane group 100, each memory cell MC is formed at a different one of three-dimensional crosspoints between the bit lines BL and the word lines WL, so as to be interposed between a corresponding one of the bit lines BL and a corresponding one of the word lines WL. It should be noted that some of the memory cells MC and some of the word lines are omitted in the drawing for the sake of simplification.

For each group of bit lines BL in layers aligned in the Z direction (i.e., at the same position in the Y direction), a corresponding one of basic array planes 0 to 3 is formed using memory cells MC that are formed between the bit lines BL and the word lines WL. In other words, one basic array plane is constituted by a group of a plurality of memory cells disposed between bit lines in the plurality of layers at the same position in the Y direction among the bit lines BL in the plurality of layers and word lines WL crossing the bit lines at the same position. The word lines WL are common in the basic array planes 0 to 3. In the example in FIG. 6, 32 memory cells MC are arranged in the X direction, and 6 memory cells MC are arranged in the Z direction, in each of the basic array planes 0 to 3. Further, the basic array plane group 100 includes the four basic array planes 0 to 3 aligned in the Y direction. Here, a basic array plane 4 included in another basic array plane group (basic array plane group 1) adjacent to the basic array plane group 100 (basic array plane group 0) is also shown in FIG. 6. It should be noted that the number of memory cells in each basic array plane and the number of basic array planes aligned in the Y direction are not limited to this example. In the basic array planes 0 to 3, even-layer bit lines BL (BL_e0 to BL_e3) in the basic array planes are commonly connected via respective first via groups 121 to 124, whereas odd-layer bit lines BL (BL_o0 to BL_o3) are commonly connected via respective second via groups 131 to 134. Specifically, the basic array planes 0 to 3 each have a corresponding one of the first via groups 121 to 124 that interconnect only even-layer bit lines BL in the basic array plane in the Z direction, and a corresponding one of the second via groups 131 to 134 that interconnect only odd-layer bit lines in the basic array plane in the Z direction. It should be noted that the first via groups 121 to 124 are examples of "first internal wires" according to the present invention, and the second via groups 131 to 134 are examples of "second internal wires" according to the present invention.

It should be noted that as shown in FIG. 6, the "even-layer bit lines BL_e0" refer to bit lines in the second and fourth layers from the top layer among bit lines in four layers in the basic array plane 0, the "even-layer bit lines BL_e1" refer to bit lines in the second and fourth layers from the top layer among bit lines in four layers in the basic array plane 1, the "even-layer bit lines BL_e2" refer to bit lines in the second and fourth layers from the top layer among bit lines in four layers in the basic array plane 2, and the "even-layer bit lines BL_e3" refer to bit lines in the second and fourth layers from the top layer among bit lines in four layers in the basic array plane 3.

Also, the "odd-layer bit lines BL_o0" refer to bit lines in the first and third layers from the top layer among bit lines in four layers in the basic array plane 0, the "odd-layer bit lines BL_o1" refer to bit lines in the first and third layers from the top layer among bit lines in four layers in the basic array plane 1, the "odd-layer bit lines BL_o2" refer to bit lines in the first and third layers from the top layer among bit lines in four layers in the basic array plane 2, and the "odd-layer bit lines BL_o3" refer to bit lines in the first and third layers from the top layer among bit lines in four layers in the basic array plane 3.

Here, in the basic array planes 0 and 2, the first via groups 121 and 123 that commonly connect the even-layer bit lines BL (BL_e0 and BL_e2), respectively, are arranged on the left side in the basic array planes 0 and 2 when viewed in the Y direction, and the second via groups 131 and 133 that commonly connect the odd-layer bit lines BL (BL_o0 and BL_o2), respectively, are arranged on the right side in the basic array planes 0 and 2 when viewed in the Y direction. On the other hand, in the basic array planes 1 and 3, the first via groups 122 and 124 that commonly connect the even-layer bit lines BL (BL_e1 and BL_e3), respectively, are arranged on the right side in the basic array planes 1 and 3 when viewed in the Y direction, and the second via groups 132 and 134 that commonly connect the odd-layer bit lines BL (BL_o1 and BL_o3), respectively, are arranged on the left side in the basic array planes 1 and 3 when viewed in the Y direction. Specifically, when one of the basic array planes 0 to 3 that constitute the basic array plane group 0 is a first basic array plane, and another basic array plane adjacent to the first basic array plane in the Y direction is a second basic array plane, a corresponding one of the first via groups 121 to 124 in the first basic array plane and a corresponding one of the second via groups 131 to 134 in the second basic array plane are adjacent to each other in the Y direction, and a corresponding one of the second via groups 131 to 134 in the first basic array plane and a corresponding one of the first via groups 121 to 124 in the second basic array plane are adjacent to each other in the Y direction.

Furthermore, global bit lines GBL000 to GBL003 for supplying a predetermined voltage to a selected bit line during writing, erasing, and reading are formed to extend in the Y direction in one-to-one correspondence with the basic array planes 0 to 3. In addition, first selection switch elements 101 to 104 and second selection switch elements 111 to 114 are provided for the respective basic array planes 0 to 3. In FIG. 6, each of the first selection switch elements 101 to 104 and the second selection switch elements 111 to 114 includes an N-MOS transistor. Here, the reason for using N-MOS transistors as the selection switch elements is that when transistors have the same gate width and configuration, N-MOS transistors generally have a higher driving capability than P-MOS transistors. It should be noted that the global bit lines GBL000 to GBL003 are examples of "selected-bit-line dedicated global bit lines" according to the present invention. Specifically, "selected-bit-line dedicated global bit lines" are also simply referred to as "global bit lines" in this specification.

Further, in correspondence with all the basic array planes 0 to 3, an unselected-bit-line dedicated global bit line GBL_NS for supplying a fixed potential to unselected bit lines is formed to extend in the Y direction. In addition, the basic array plane 0 to 3 are provided with third selection switch elements 501 to 504 and fourth selection switch elements 511 to 514, respectively. In FIG. 6, each of the third selection switch elements 501 to 504 and the fourth selection switch elements 511 to 514 includes an N-MOS transistor. It should be noted that the unselected-bit-line dedicated global bit line GBL_NS is an example of an "unselected-bit-line dedicated global bit line" according to the present invention.

The gates of the first selection switch elements 101 to 104 are commonly connected, and switching between electrical connection and disconnection of the global bit lines GBL000 to GBL003 related to (corresponding to) the basic array planes to/from the via groups 121, 132, 123, and 134 of the basic array planes is all controlled in accordance with a first bit line selection signal BLs_f0 supplied to the gates. The gates of the second selection switch elements 111 to 114 are commonly connected, and switching between electrical connection and disconnection of the selected-bit-line dedicated global bit lines GBL000 to GBL003 related to (corresponding to) the basic array planes to/from the via groups 131, 122, 133, and 124 of the basic array planes is all controlled in accordance with a second bit line selection signal BLs_s0 supplied to the gates.

The first selection switch elements 101 to 104 and the second selection switch elements 111 to 114 form pairs, namely, the first selection switch element 101 and the second selection switch element 111, the first selection switch element 102 and the second selection switch element 112, the first selection switch element 103 and the second selection switch element 113, and the first selection switch element 104 and the second selection switch element 114.

When the first selection switch elements or the second selection switch elements are connected (turned ON) by one of the first bit line selection signal BLs_f0 and the second bit line selection signal BLs_s0, the second selection switch elements or the first selection switch elements that form pairs with the connected ones are disconnected (turned OFF), and even-layer bit lines or odd-layer bit lines are controlled so as to be each connected to a corresponding one of the global bit lines GBL000 to GBL003.

Furthermore, switching between electrical connection and disconnection of the third selection switch elements 501 to 504 to/from the unselected-bit-line dedicated global bit line GBL_NS and the via groups 121, 132, 123, and 134 of the basic array planes 0 to 3 is controlled in accordance with a common third bit line selection signal BLns_f0 supplied to the gates of the third selection switch elements. Switching between electrical connection/disconnection of the fourth selection switch elements 511 to 514 to/from the unselected-bit-line dedicated global bit line GBL_NS and the via groups 131, 122, 133, and 124 of the basic array planes 0 to 3 is controlled in accordance with a common fourth bit line selection signal BLns_s0 supplied to the gates of the fourth selection switch elements.

Here, the first selection switch elements 101 to 104 and the third selection switch elements 501 to 504 form pairs, namely, the first selection switch element 101 and the third selection switch element 501, the first selection switch element 102 and the third selection switch element 502, the first selection switch element 103 and the third selection switch element 503, and the first selection switch element 104 and the third selection switch element 504. Similarly, the second selection switch elements 111 to 114 and the fourth selection switch elements 511 to 514 form pairs, namely, the second selection switch element 111 and the fourth selection switch element 511, the second selection switch element 112 and the fourth selection switch element 512, the second selection switch element 113 and the fourth selection switch element 513, and the second selection switch element 114 and the fourth selection switch element 514.

When the first selection switch elements 101 to 104 or the third selection switch elements 501 to 504 are connected (turned ON) by one of the first bit line selection signal BLs_f0 and the third bit line selection signal BLns_f0, the third selection switch elements 501 to 504 or the first selection switch elements 101 to 104 that form pairs with the connected ones are controlled so as to be disconnected (turned OFF).

Similarly, when the second selection switch elements 111 to 114 or the fourth selection switch elements 511 to 514 are connected (turned ON) by one of the second bit line selection signal BLs_s0 and the fourth bit line selection signal BLns_s0, the fourth selection switch elements 511 to 514 or the second selection switch elements 111 to 114 that form pairs with the connected ones are controlled so as to be disconnected (turned OFF).

By controlling the first to fourth selection switch elements as described above, when even-layer bit lines or odd-layer bit lines are connected to a corresponding one of the global bit lines GBL000 to GBL003, the other bit lines, namely, even-layer bit lines or odd-layer bit lines are controlled so as to be connected to the unselected-bit-line dedicated global bit line GBL_NS, in the basic array planes.

Such a configuration of the selection switch elements allows the control below to be performed when two basic array planes adjacent to each other in the Y direction are focused on.

Specifically, in a first basic array plane that is one of the two adjacent basic array planes, a corresponding one of the via groups 121, 132, 123, and 134 in the first basic array plane is connected to one of the global bit lines GBL000 to GBL003 corresponding to the first basic array plane via one of the first selection switch elements 101 to 104 corresponding to the first basic array plane, or is connected to the unselected-bit-line dedicated global bit line GBL_NS via one of the third selection switch elements 501 to 504 corresponding to the first basic array plane, and furthermore a corresponding one of the via groups 131, 122, 133, and 124 in the first basic array plane is connected to one of the global bit lines GBL000 to GBL003 corresponding to the first basic array plane via one of the second selection switch elements 111 to 114 corresponding to the first basic array plane, or is connected to the unselected-bit-line dedicated global bit line GBL_NS via one of the fourth selection switch elements 511 to 514 corresponding to the first basic array plane.

In contrast, in a second basic array plane that is the other of the two adjacent basic array planes, a corresponding one of the via groups 121, 132, 123, and 134 in the second basic array plane is connected to one of the global bit lines GBL000 to GBL003 corresponding to the second basic array plane via one of the first selection switch elements 101 to 104 corresponding to the second basic array plane, or is connected to the unselected-bit-line dedicated global bit line GBL_NS via one of the third selection switch elements 501 to 504 corresponding to the first basic array plane, and furthermore a corresponding one of the via groups 131, 122, 133, and 124 in the second basic array plane is connected to one of the global bit lines GBL000 to GBL003 corresponding to the second basic array plane via one of the second selection switch elements 111 to 114 corresponding to the second basic array plane, or is connected to the unselected-bit-line dedicated global bit line GBL_NS via one of the fourth selection switch elements 511 to 514 corresponding to the second basic array plane.

With such a configuration, an unselected bit line adjacent to a selected bit line in the Y direction is always connected to the unselected-bit-line dedicated global bit line GBL_NS so that the potential thereof is fixed, and thus the influence on the read operation due to a change in the potential of the adjacent unselected bit line can be suppressed while reading a selected memory cell, thereby achieving a stable read operation. Specifically, as described above, the first via group in the first basic array plane and the second via group in the second basic array plane adjacent to the first basic array plane in the Y direction are adjacent to each other in the Y direction, and furthermore the second via group in the first basic array plane and the first via group in the second basic array plane are adjacent to each other in the Y direction, and thus irrespective of the position of a bit line to be selected, an unselected bit line adjacent to the selected bit line in the same wiring layer (i.e., in the Y direction) is connected to the unselected-bit-line dedicated global bit line, so that the potential thereof is fixed. Therefore, a problem does not occur that the behavior of a signal in a selected bit line differs depending on the position of the selected bit line. Also, bit lines and word lines of a memory cell array can be wired at minimum intervals allowed in the implementing process, without providing a margin in the design of a read circuit.

This configuration realizes the above-described multilayer crosspoint structure of the variable resistance nonvolatile memory device in the present embodiment. In addition, a hierarchical bit line system using the bit lines BL and the global bit lines GBL is realized. Furthermore, in each of the basic array planes 0 to 3, the number of the selection switch elements for realizing the hierarchical bit line system can be reduced to two by commonly connecting the even-layer bit lines BL and the odd-layer bit lines BL in the basic array plane via the first and second via groups, respectively. Accordingly, the basic array plane group of a small array size can be realized, without increasing the layout area therefor. By providing two more kinds of selection switch elements, namely, the third selection switch elements 501 to 504 and the fourth selection switch elements 511 to 514 in order to connect even-layer bit lines BL and odd-layer bit lines BL to the unselected-bit-line dedicated global bit line GBL_NS, it is possible to fix the potential of bit lines using the unselected-bit-line dedicated global bit line GBL_NS when the bit lines are unselected.

Embodiment 2

Figure 7:
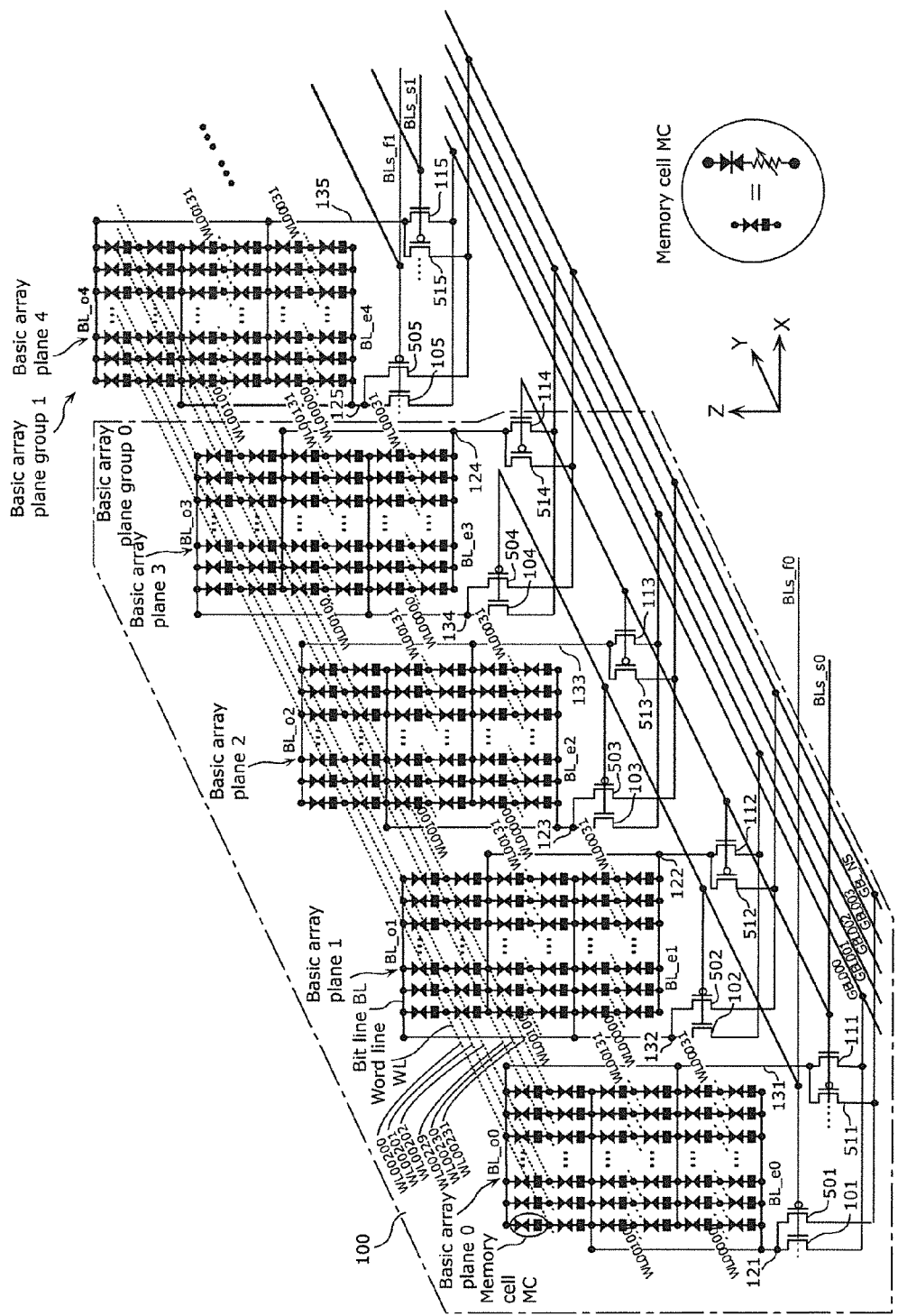
FIG. 7 is a circuit diagram showing an embodiment of a configuration of a basic array plane group according to Embodiment 2.

FIG. 7 is a circuit diagram showing the configuration of a basic array plane group 100 in a variable resistance nonvolatile memory device according to Embodiment 2. The configuration of the memory cell array portion of basic array planes 0 to 4 is the same as that in the case of FIG. 6. In FIG. 7, each of first selection switch elements 101 to 104 and second selection switch elements 111 to 114 includes an N-MOS transistor.

Furthermore, in correspondence with all the basic array planes 0 to 3, one unselected-bit-line dedicated global bit line GBL_NS is formed to extend in the Y direction. The basic array planes 0 to 3 are provided with third selection switch elements 501 to 504 and fourth selection switch elements 511 to 514, respectively. In FIG. 7, each of the third selection switch elements 501 to 504 and the fourth selection switch elements 511 to 514 includes a P-MOS transistor. The reason for using P-MOS transistors as the third and fourth selection switch elements here is because low driving capability is sufficient to fix the potential of an unselected bit line, and thus it is possible to use P-MOS transistors having lower driving capability than that of N-MOS transistors when the transistors have the same gate width. It should be noted that the unselected-bit-line dedicated global bit line GBL_NS is an example of an "unselected-bit-line dedicated global bit line" according to the present invention.

The gates of the first selection switch elements 101 to 104 are commonly connected, and switching between electrical connection and disconnection of global bit lines GBL000 to GBL003 related to (corresponding to) the basic array planes to/from via groups 121, 132, 123, and 134 of the basic array planes is all controlled in accordance with a first bit line selection signal BLs_f0 supplied to the gates. The gates of the second selection switch elements 111 to 114 are commonly connected, and switching between electrical connection and disconnection of the global bit lines GBL000 to GBL003 related to (corresponding to) the basic array planes to/from via groups 131, 122, 133, and 124 of the basic array planes is all controlled in accordance with a second bit line selection signal BLs_s0 supplied to the gates.

Each of the third selection switch elements 501 to 504 includes a P-MOS transistor, and switching between electrical connection and disconnection of the unselected-bit-line dedicated global bit line GBL_NS to/from the via groups 121, 132, 123, and 134 of the basic array planes 0 to 3 is controlled in accordance with a third bit line selection signal (here, first bit line selection signal BLs_f0). Specifically, by the first bit line selection signal BLs_f0, the first selection switch elements 101 to 104 are controlled such that the global bit lines GBL000 to GBL003 corresponding to the basic array planes 0 to 3 are electrically disconnected from the respective via groups 121, 132, 123, and 134 of the basic array planes 0 to 3, and at the same time, the third selection switch elements 501 to 504 are controlled such that the unselected-bit-line dedicated global bit line GBL_NS is connected to all the via groups 121, 132, 123, and 134 of the basic array planes 0 to 3. In this way, in the present embodiment, the first bit line selection signal BLs_f0 serves not only as a first bit line selection signal that commonly controls electrical connection and disconnection of the first selection switch elements 101 to 104, but also as a third bit line selection signal that commonly controls electrical connection and disconnection of the third selection switch elements 501 to 504. In other words, the same signal serves as the first bit line selection signal BLs_f0 and the third bit line selection signal.

Each of the fourth selection switch elements 511 to 514 includes a P-MOS transistor, and switching between electrical connection and disconnection of the unselected-bit-line dedicated global bit line GBL_NS to/from the via groups 131, 122, 133, and 124 of the basic array planes 0 to 3 is controlled in accordance with the fourth bit line selection signal (here, second bit line selection signal BLs_s0). Specifically, by the second bit line selection signal BLs_s0, the second selection switch elements 111 to 114 are controlled such that the global bit lines GBL000 to GBL003 corresponding to the basic array planes 0 to 3 are electrically disconnected from the via groups 131, 122, 133, and 124 of the basic array planes 0 to 3, and at the same time, the fourth selection switch elements 511 to 514 are controlled such that the unselected-bit-line dedicated global bit line GBL_NS is connected to the via groups 131, 122, 133, and 124 of the basic array planes 0 to 3. In this way, in the present embodiment, the second bit line selection signal BLs_s0 serves not only as a second bit line selection signal that commonly controls electrical connection and disconnection of the second selection switch elements 111 to 114, but also as a fourth bit line selection signal that commonly controls electrical connection and disconnection of the fourth selection switch elements 511 to 514. In other words, the same signal serves as the second bit line selection signal BLs_s0 and the fourth bit line selection signal.

This configuration realizes the above-described multilayer crosspoint structure of the variable resistance nonvolatile memory device in the present embodiment. In addition, a hierarchical bit line system using the bit lines BL and the global bit lines GBL is realized. Furthermore, in each of the basic array planes 0 to 3, the number of the selection switch elements for realizing the hierarchical bit line system can be reduced to two by commonly connecting the even-layer bit lines BL and the odd-layer bit lines BL in the basic array plane via the first and second via groups, respectively. Accordingly, the basic array plane group of a small array size can be realized, without increasing the layout area therefor. Further, although two more kinds of selection switch elements are necessary, namely, the third selection switch elements 501 to 504 and the fourth selection switch elements 511 to 514 in order to connect even-layer bit lines BL and odd-layer bit lines BL to the unselected-bit-line dedicated global bit line GBL_NS, the gates of the third selection switch elements 501 to 504 and the gates of the fourth selection switch elements 511 to 514 can be respectively shared with the gates of the first selection switch elements 101 to 104 and the gates of the second selection switch elements 111 to 114, and thus the gate pattern is made with ease (simplicity). Therefore, a circuit for fixing the potential of an unselected bit line can be fabricated with a small increase in the layout area.

With this configuration, in the basic array plane 0, even-layer bit lines BL_e0 are connected to the first selection switch element 101 and the third selection switch element 501 via the first via group 121, and odd-layer bit lines BL_o0 are connected to the second selection switch element 111 and the fourth selection switch element 511 via the second via group 131. In contrast, in the basic array plane 1 adjacent to the basic array plane 0 in the Y direction, even-layer bit lines BL_e1 are connected to the second selection switch element 112 and the fourth selection switch element 512 via the first via group 122, and odd-layer bit lines BL_o1 are connected to the first selection switch element 102 and the third selection switch element 502 via the second via group 132.

Further, the common first bit line selection signal BLs_f0 is supplied to the gates of the first selection switch elements 101 to 104 and the third selection switch elements 501 to 504 in the basic array planes in the basic array plane group 100, and electrical connection (ON) and disconnection (OFF) of the selection switch elements are controlled by the first bit line selection signal BLs_f0 supplied to the gate of each of the selection switch elements. When the first bit line selection signal BLs_f0 is selected (ON), and thus the first selection switch elements 101 to 104 are controlled so as to be connected (turned ON), the third selection switch elements 501 to 504 are controlled so as to be disconnected (turned OFF), whereas when the first bit line selection signal BLs_f0 is not selected (OFF), and thus the first selection switch elements 101 to 104 are controlled so as to be disconnected (turned OFF), the third selection switch elements 501 to 504 are controlled so as to be connected (turned ON). Similarly, the common second bit line selection signal BLs_s0 is supplied to the gates of the second selection switch elements 111 to 114 and the fourth selection switch elements 511 to 514, electrical connection (ON) and disconnection (OFF) of the selection switch elements is controlled by the second bit line selection signal BLs_s0 supplied to the gates of each of the selection switch elements. When the second bit line selection signal BLs_s0 is selected (ON), and thus the second selection switch elements 111 to 114 are controlled so as to be connected (turned ON), the fourth selection switch elements 511 to 514 are controlled so as to be disconnected (turned OFF), whereas when the second bit line selection signal BLs_s0 is not selected (OFF), and thus the second selection switch elements 111 to 114 are controlled so as to be disconnected (turned OFF), the fourth selection switch elements 511 to 514 are controlled so as to be connected (turned ON).

When one of the first bit line selection signal BLs_f0 and the second bit line selection signal BLs_s0 is selected, the other signal is controlled so as to be unselected, during the operation in the present embodiment.

Therefore, when the first bit line selection signal BLs_f0 is selected, in the basic array plane 0, the even-layer bit lines BL_e0 are connected to the global bit line GBL000 via the first via group 121 and the first selection switch element 101, the odd-layer bit lines BL_o0 are connected to the unselected-bit-line dedicated global bit line GBL_NS via the second via group 131 and the fourth selection switch element 511, whereas in the basic array plane 1, the odd-layer bit lines BL_o1 are connected to the global bit line GBL001 via the second via group 132 and the first selection switch element 102, and the even-layer bit lines BL_e1 are connected to the unselected-bit-line dedicated global bit line GBL_NS via the first via group 122 and the third selection switch element 512. The same as in the case of the basic array plane 0 applies to the basic array plane 2, and the same as in the case of the basic array plane 1 applies to the basic array plane 3.

Specifically, with this configuration, when the first bit line selection signal BLs_f0 for the basic array plane group 100 is selected, and even-layer bit lines in a certain basic array plane are connected to a corresponding global bit line, even-layer bit lines in two basic array planes adjacent to the basic array plane in the Y direction are electrically disconnected from respective global bit lines, and connected to the unselected-bit-line dedicated global bit line GBL_NS. It should be noted that a similar relationship to the above also holds for odd-layer bit lines, and furthermore this relationship always holds for any position of a basic array plane to be selected.

With such a configuration, one of the first via groups (121, 122, 123, and 124) in a corresponding first basic array plane 0, 1, 2, or 3 and one of the second via groups (131, 132, 133, and 134) in a corresponding second basic array plane 0, 1, 2, or 3 adjacent to the first basic array plane 0, 1, 2 or 3 in the Y direction are adjacent to each other in the Y direction (e.g., 121 and 132), and furthermore one of the second via groups (131, 132, 133, and 134) in the first basic array plane 0, 1, 2, or 3 and one of the first via groups (121, 122, 123, and 124) in the second basic array plane 0, 1, 2, or 3 are adjacent to each other in the Y direction (e.g., 131 and 122), and thus irrespective of the position of a bit line to be selected, an unselected bit line adjacent in the Y direction to the selected bit line in the same wiring layer in the Z direction is connected to the unselected-bit-line dedicated global bit line, and the potential of the unselected bit line is fixed. Therefore, a problem does not occur that the behavior of a signal in a selected bit line differs depending on the position of the selected bit line. Further, bit lines and word lines of a memory cell array can be wired at minimum intervals allowed in the implementing process, without providing a margin in the design of a read circuit.

It should be noted that although each of the first selection switch elements 101 to 104 and the second selection switch elements 111 to 114 includes an N-MOS transistor, and each of the third selection switch elements 501 to 504 and the fourth selection switch elements 511 to 514 includes a P-MOS transistor in the present embodiment, the variable resistance nonvolatile memory device according to the present invention is not limited to such a configuration. It is sufficient that the first selection switch elements 101 to 104 each include one of an N-MOS transistor and a P-MOS transistor, and the third selection switch elements 501 to 504 each include the other, and also the second selection switch elements 111 to 114 each include one of an N-MOS transistor and a P-MOS transistor, and the fourth selection switch elements 511 to 514 each include the other.

<Connecting Relationship with Peripheral Circuitry>

Figure 8:
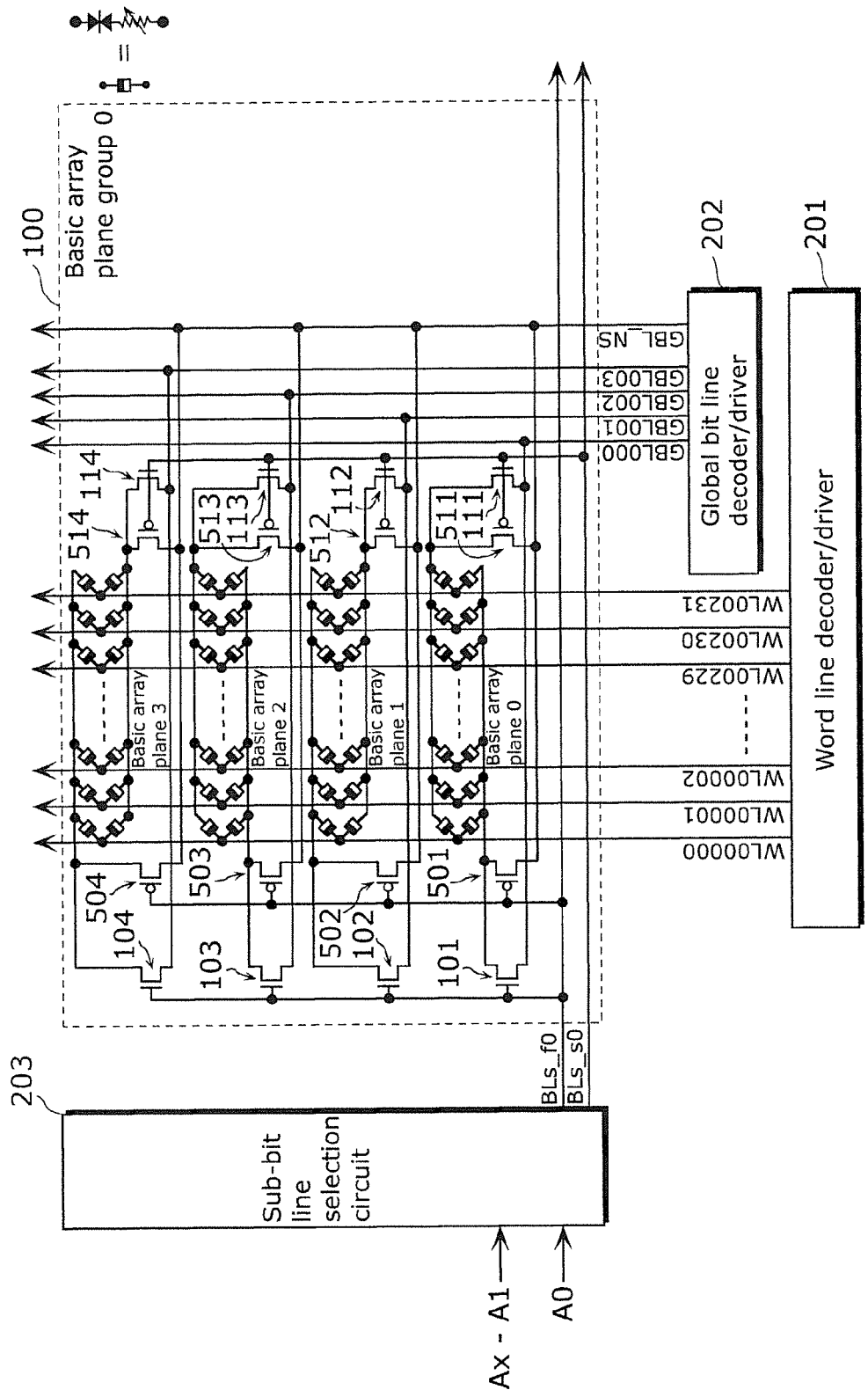
FIG. 8 is a circuit diagram showing the basic array plane group in FIG. 7 and its peripheral circuitry.

FIG. 8 is a circuit diagram showing the connecting relationship between the basic array plane group 100 in FIG. 7 described in Embodiment 2 and its peripheral circuitry. In FIG. 8, a global bit line decoder/driver 202 drives and controls the global bit lines GBL and the unselected-bit-line dedicated global bit line GBL_NS. Specifically, the global bit line decoder/driver 202 selects at least one of the global bit lines and applies a read voltage to the at least one selected global bit line, and also drives the unselected-bit-line dedicated global bit line GBL_NS. A sub-bit line selection circuit 203 controls the first bit line selection signal BLs_f0 and the second bit line selection signal BLs_s0 according to address signals A0 to Ax. It should be noted that the configuration of FIG. 8 is also applicable in Embodiment 1. In that case, the sub bit line selection circuit 203 further controls the third bit line selection signal BLns_f0 and the fourth bit line selection signal BLns_s0 in Embodiment 1. A word line decoder/driver 201 drives and controls the word lines WL.

Figure 9:
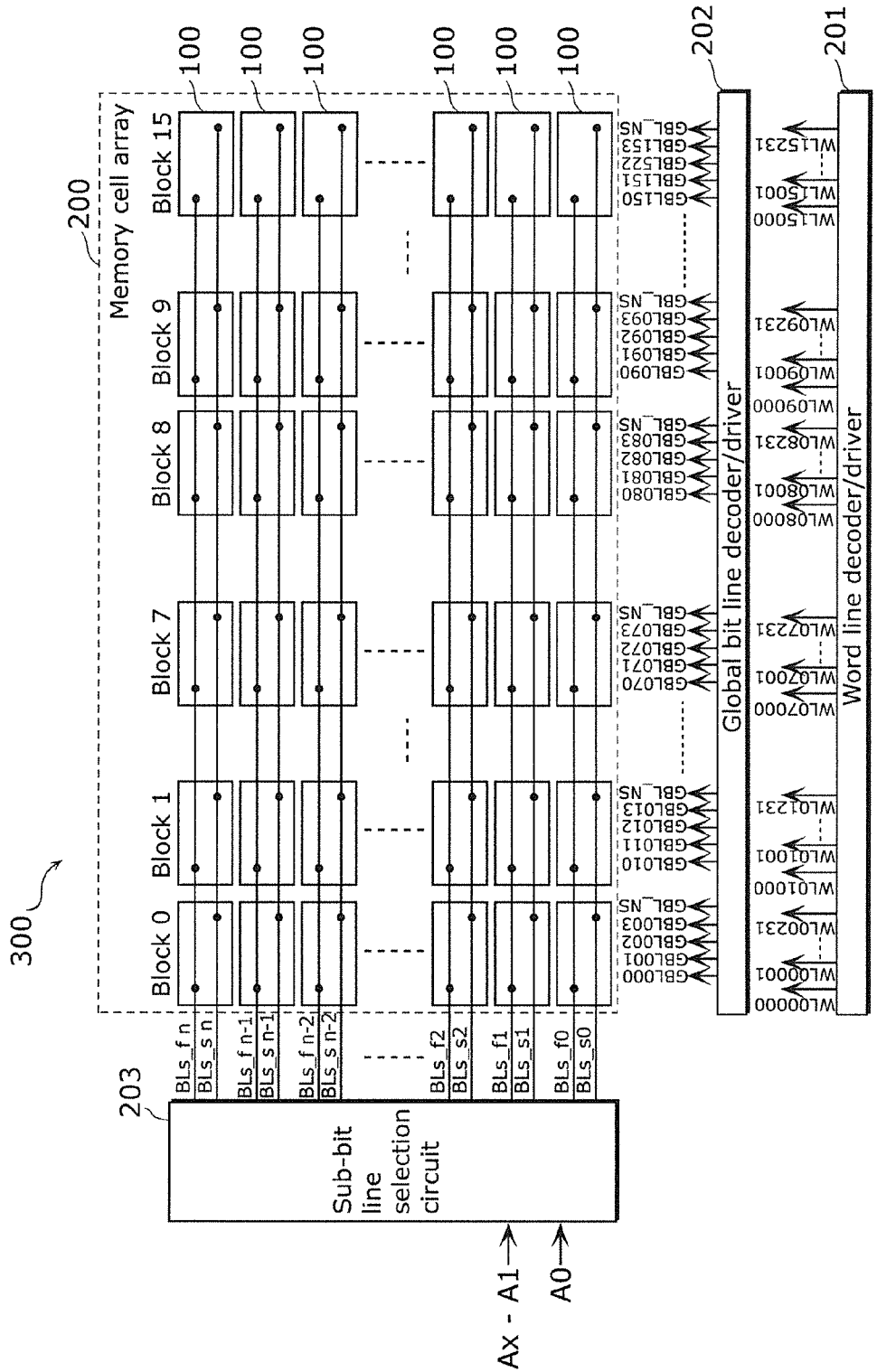
FIG. 9 is a circuit diagram showing a main part of a variable resistance nonvolatile memory device that uses a plurality of the basic array plane groups in FIG. 7.

FIG. 9 is a circuit diagram showing a main part 300 of the variable resistance nonvolatile memory device. As shown in FIG. 9, in the actual apparatus, a block is formed by arranging a plurality of the basic array plane groups 100 shown in FIG. 7 (n+1 groups in the vertical direction in FIG. 9), and a memory cell array 200 is formed by arranging a plurality of the blocks. Global bit lines and word lines are common in the blocks. In the example of FIG. 9, [(n+1)×16] basic array plane groups 100 are arranged. The word line decoder/driver 201 drives and controls word lines WL, and the global bit line decoder/driver 202 drives and controls global bit lines GBL and unselected-bit-line dedicated global bit lines GBL_NS. The sub-bit line selection circuit 203 controls first control signals BLs_f0 to BLs_fn and second control signals BLs_s0 to BLs_sn for the respective basic array plane groups 100 according to the address signals A0 to Ax. It should be noted that the configuration of FIG. 9 is also applicable in Embodiment 1. In that case, the sub bit line selection circuit 203 also controls the third bit line selection signal BLns_f0 and the fourth bit line selection signal BLns_s0 in Embodiment 1.

Although an unselected-bit-line dedicated global bit line GBL_NS is separately provided for each block in FIG. 9, a common global bit line GBL_NS for unselected bit line may be provided for a plurality of blocks.

<Variable Resistance Nonvolatile Memory Device>

Figure 10:
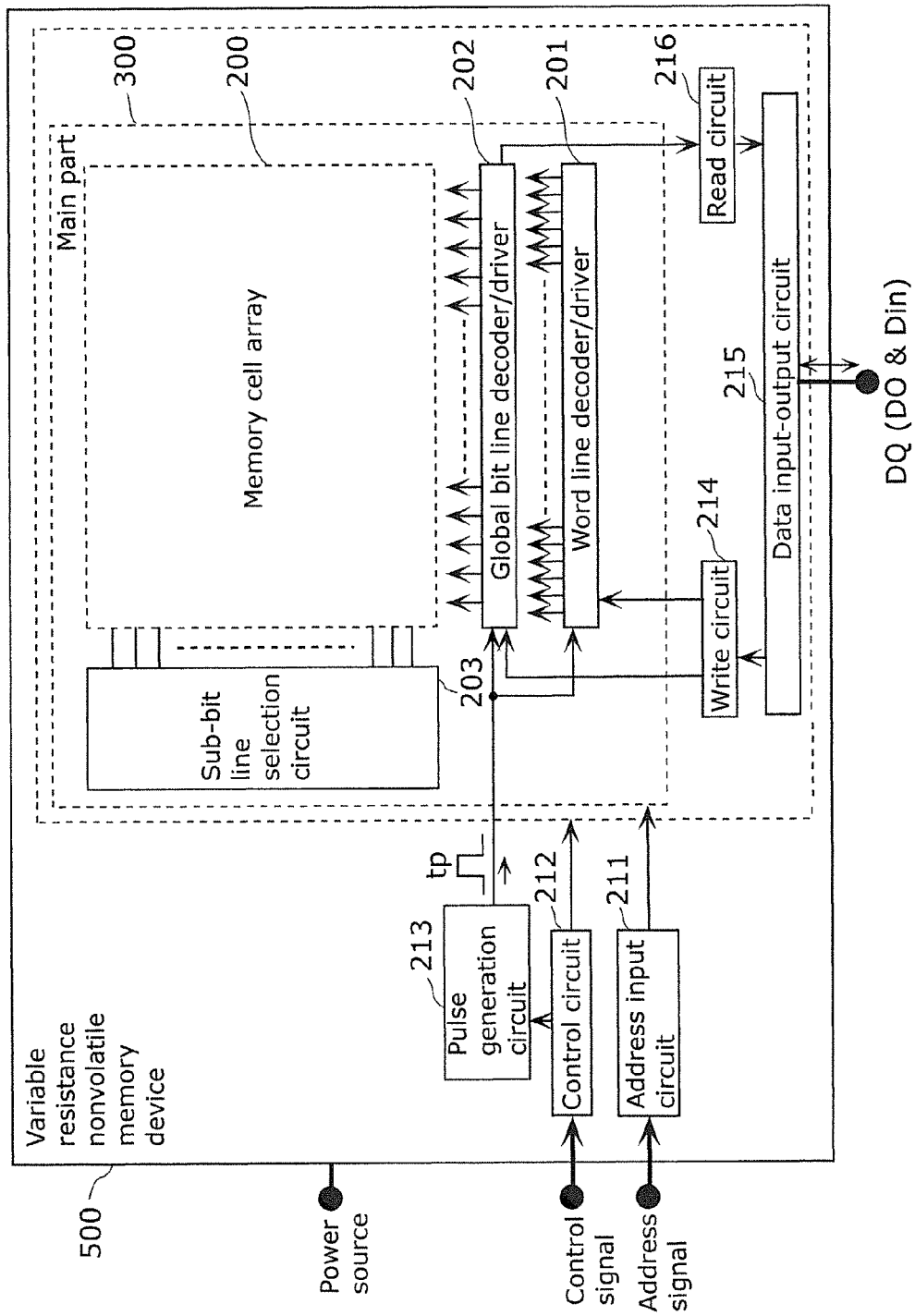
FIG. 10 is a circuit diagram showing an overall configuration of the variable resistance nonvolatile memory device according to the present invention.

FIG. 10 is a circuit diagram showing an overall configuration of a variable resistance nonvolatile memory device 500. In FIG. 10, the main part 300 corresponds to the configuration shown in FIG. 9.

In FIG. 10, an address input circuit 211 temporarily latches address signals from outside during an erase cycle (change to the high resistance state), a write cycle (change to the low resistance state), or a read cycle, and outputs the latched address signals to the sub-bit line selection circuit 203, the global bit line decoder/driver 202, and the word line decoder/driver 201. In response to a plurality of input signals, a control circuit 212 outputs a signal indicating a state in the erase cycle, the write cycle, the read cycle, or standby to the sub-bit line selection circuit 203, the global bit line decoder/driver 202, the word line decoder/driver 201, a write circuit 214, and a data input-output circuit 215, as a signal corresponding to each. Also, the control circuit 212 outputs an erase, write, or read pulse generating trigger signal in the erase, write, or read cycle to a pulse generation circuit 213. The pulse generation circuit 213 generates erase, write, or read time pulses in the erase, write, or read cycle during a given period (a period of tp_E, tp_W, or tp_R) and outputs the generated pulses to the global bit line decoder/driver 202 and the word line decoder/driver 201.

<Operation of Variable Resistance Nonvolatile Memory Device 500 According to Present Invention>

Figure 11:
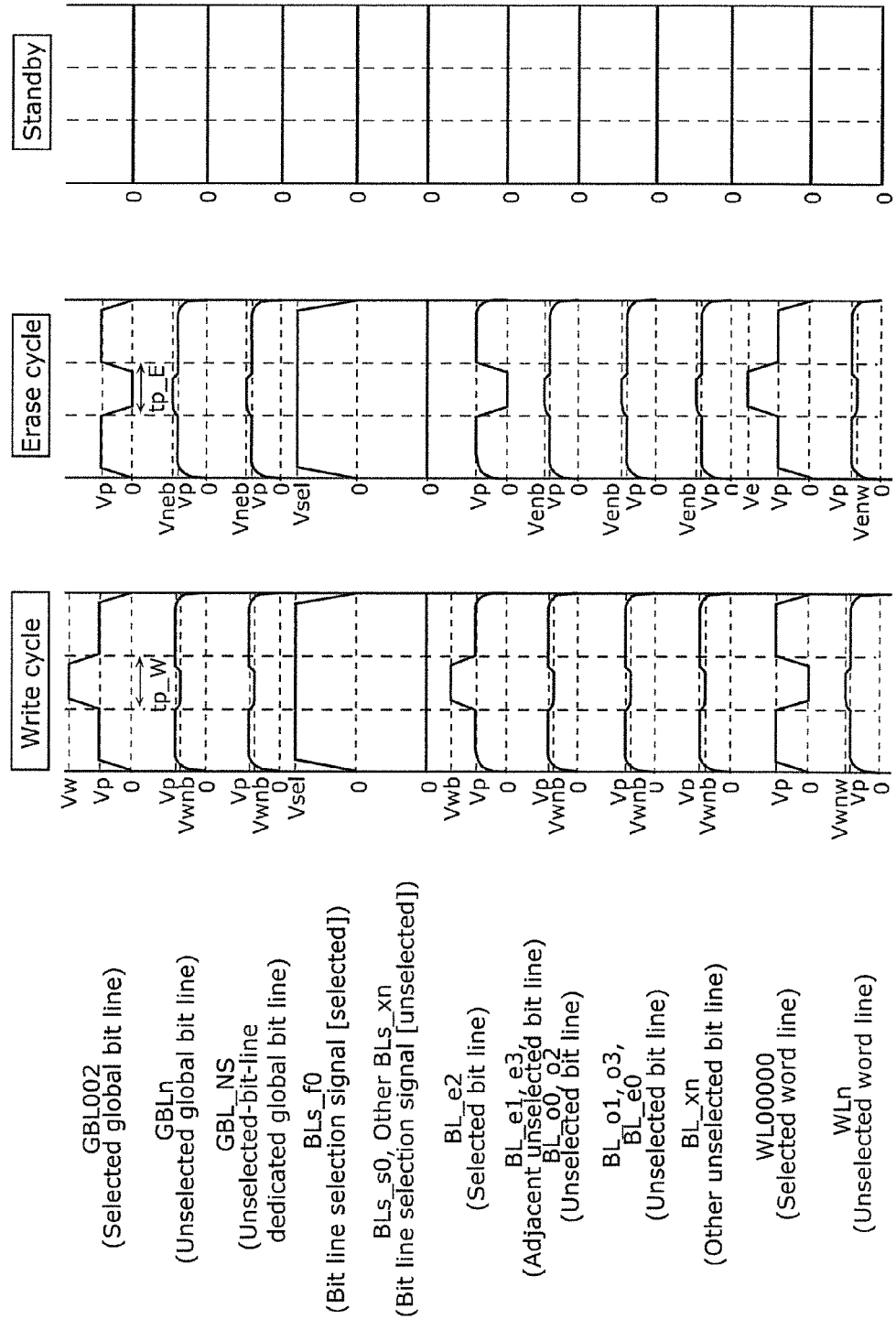
FIG. 11 is a timing waveform diagram for a write cycle, an erase cycle, and a standby operation of the basic array plane group in FIG. 7.
Figure 12A:
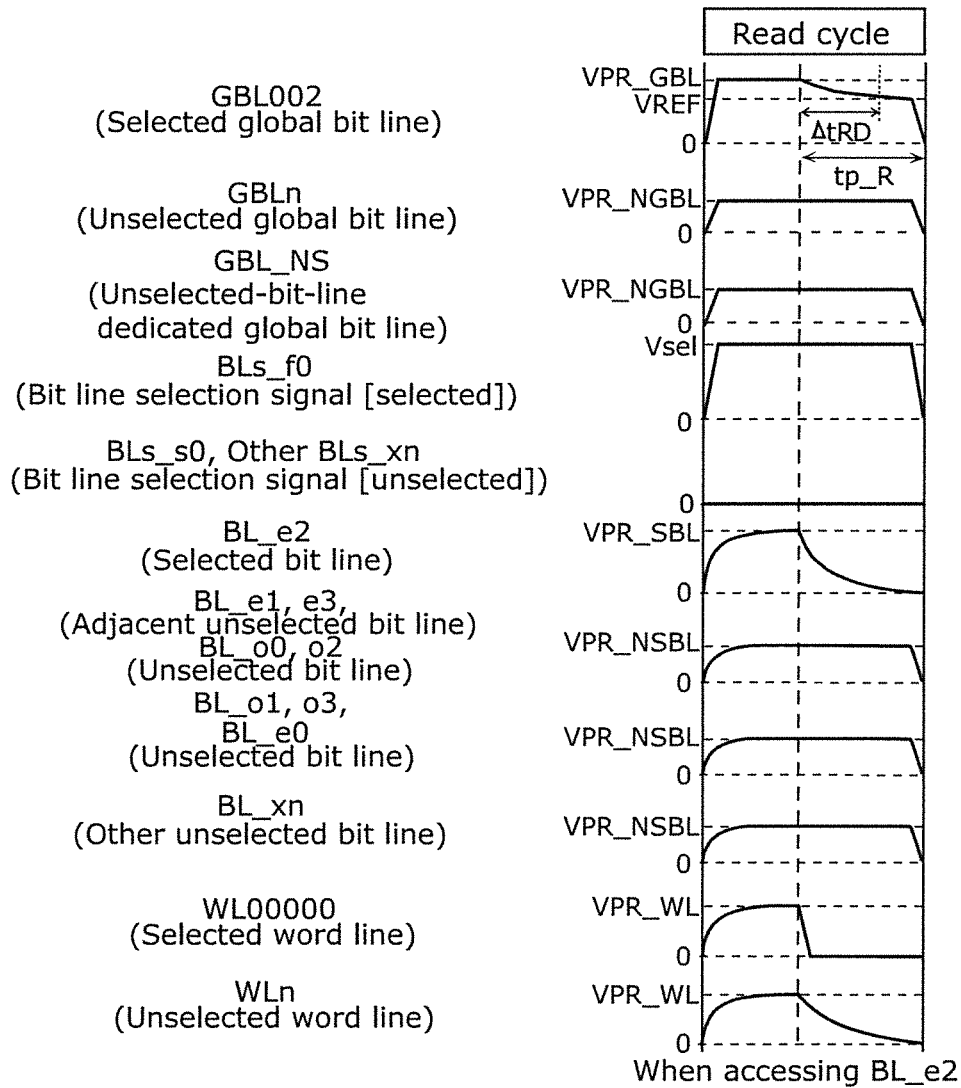
FIG. 12A is a timing waveform diagram for a read operation in the basic array plane group in FIG. 7 (when accessing BL_e2).
Figure 12B:
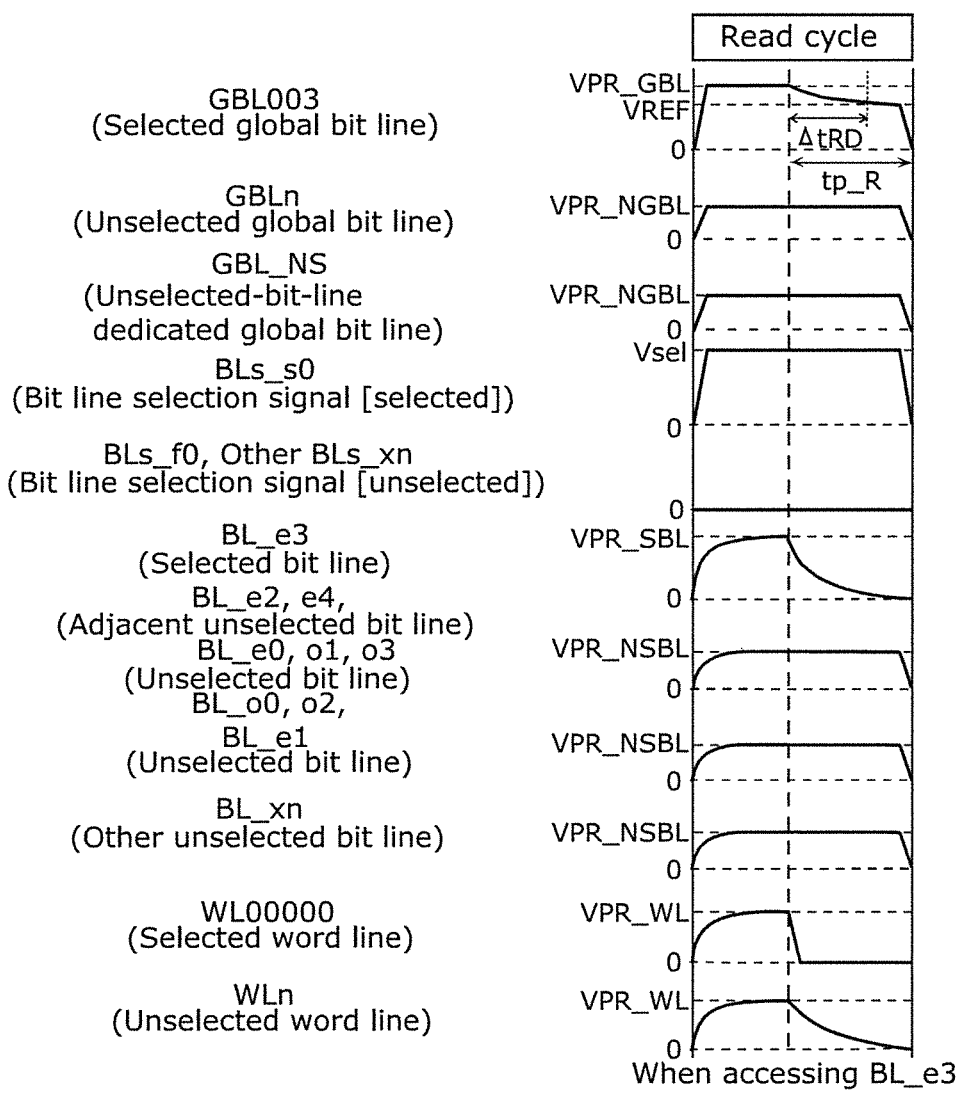
FIG. 12B is a timing waveform diagram for the read operation in the basic array plane group in FIG. 7 (when accessing BL_e3).

FIGS. 11, 12A, and 12B are operation timing diagrams of the basic array plane group shown in FIG. 7 and described in Embodiment 2. The memory operation is roughly divided into four, namely, the write cycle, the erase cycle, and standby which are shown in FIG. 11 and the read cycle shown in FIGS. 12A and 12B. The operation below can also be similarly described in the case of Embodiment 1. In Embodiment 1, when a selection voltage Vsel is applied to a selected one of the first bit line selection signal BLs_f0 and the second bit line selection signal BLs_s0, the same signals as the second bit line selection signal BLs_s0 and the first bit line selection signal BLs_f0 are further applied to the third bit line selection signal BLns_f0 and the fourth bit line selection signal BLns_s0, respectively.

First is a description of the write cycle. FIG. 11 shows the case of writing a memory cell (changing its state to the low resistance state) connected to the word line WL00000 and a corresponding one of the bit lines BL_e2, as an example of the write operation. In the write cycle, a variable resistance element of a selected memory cell changes its state from the high resistance state to the low resistance state. First, a precharge voltage Vp is applied to a selected global bit line (GBL002 in FIG. 11) and a selected word line (WL00000 in FIG. 11). The precharge voltage is not applied to unselected global bit lines, the unselected-bit-line dedicated global bit line GBL_NS, and unselected word lines, other than the above selected lines. Further, a selection voltage Vsel is applied to a selected one of the first bit line selection signal BLs_f0 and the second bit line selection signal BLs_s0 (BLs_f0 in FIG. 11), and selected bit lines (BL_e2 in FIG. 11) are precharged to the precharge voltage Vp. Unselected global bit lines, unselected bit lines, and unselected word lines are precharged to the precharge voltage Vp by sneak current that leaked from the selected bit lines and the selected word line via memory cells.

Next, a writing voltage Vw is applied to the selected global bit line GBL002, thereby applying a writing voltage Vw to the selected bit lines BL_e2. In addition, 0 V is applied to the selected word line WL00000, and the writing voltage Vw is applied to the memory cell connected to the selected word line WL00000 and a corresponding one of the selected bit lines BL_e2, thereby writing the memory cell. At this time, the voltage of the unselected bit lines changes to a stable voltage Vwnb which is determined based on the voltage Vw of the selected bit lines BL_e2 and a voltage of 0 V of the selected word line WL00000, and which is higher than 0 V and lower than Vw, and the voltage of the unselected word lines changes to a stable voltage Vwnw which is higher than 0 V and lower than Vw, as in the above case. Thus, only a voltage lower than the writing voltage Vwb is applied to unselected memory cells.

Next is a description of the erase cycle. FIG. 11 shows the case of easing a memory cell (changing its state to the high resistance state) connected to the word line WL00000 and a corresponding one of the bit lines BL_e2, as an example of the erase operation. Although a basic operation in the erase cycle is the same as that in the write cycle, a difference is that a voltage Ve of reverse polarity to the precharge voltage Vp is applied to the selected memory cell. First, a precharge voltage Vp is applied to a selected global bit line (GBL002 in FIG. 11) and a selected word line (WL00000 in FIG. 11). The precharge voltage is not applied to unselected global bit lines, the unselected-bit-line dedicated global bit line GBL_NS, and unselected word lines, other than the above selected lines. Further, a selection voltage Vsel is applied to a selected one of the first bit line selection signal BLs_f0 and the second bit line selection signal BLs_s0 (BLs_f0 in FIG. 11), and selected bit lines (BL_e2 in FIG. 11) are precharged to the precharge voltage Vp. Unselected global bit lines, unselected bit lines, and unselected word lines are precharged to the precharge voltage Vp by sneak current that leaked from the selected bit lines and the selected word line via memory cells.

Next, the erasing voltage Ve is applied to the selected word line WL00000. In addition, due to the application of 0 V to the selected global bit line, 0 V is applied to the selected bit lines BL_e2, and the erasing voltage Ve is applied to the memory cell connected to the selected word line WL00000 and a corresponding one of the selected bit lines BL_e2, thereby erasing the memory cell. At this time, the voltage of the unselected bit lines changes to a stable voltage Venb which is determined based on the voltage Ve of the selected word line WL00000 and a voltage of 0 V of the selected bit lines BL_e2, and which is higher than 0 V and lower than Ve, and the voltage of the unselected word lines changes to a stable voltage Venw which is higher than 0 V and lower than Ve, as in the above case. Thus, only a voltage lower than the erasing voltage Ve is applied to unselected memory cells.

Next is a description of the read cycle. FIG. 12A shows the case of reading a memory cell connected to the word line WL00000 and a corresponding one of the bit lines BL_e2, as an example of the read operation. In the read cycle, first, a precharge voltage VPR_GBL is applied to a selected global bit line (GBL002 in FIG. 12A), and a precharge voltage VPR_NGBL is applied to the other unselected global bit lines.

The precharge voltage VPR_NGBL is applied to the unselected-bit-line dedicated global bit line GBL_NS. Further, the selection voltage (Vsel in FIG. 12A) is applied to a selected one of the first bit line selection signal BLs_f0 and the second bit line selection signal BLs_s0 (BLs_f0 in FIG. 12A), and an unselection voltage (0 V in FIG. 12A) is applied to the other unselected bit line selection signal. In unselected basic array plane groups, an unselection voltage is applied to the first and second bit line selection signals. A voltage is not applied to the selected word line (WL00000 in FIG. 12A) and unselected word lines. As a result of the above voltage application, selected bit lines (BL_e2 in FIG. 12A) are precharged to a precharge voltage VPR_SBL via the selected global bit line GBL002, unselected bit lines are precharged to a precharge voltage VPR_NSBL via unselected global bit lines and the unselected-bit-line dedicated global bit line GBL_NS. Further, the selected word line and unselected word lines are precharged to VPR_WL from the selected bit lines and unselected bit lines via memory cells.

Here, although precharging may be performed using a selected global bit line and unselected global bit lines or using only a selected global bit line, precharging can be performed at a high speed by using a selected global bit line, unselected global bit lines, and the unselected-bit-line dedicated global bit line GBL_NS, as described above. Specifically, the control circuit 212 may control the global bit line decoder/driver 202 such that a precharge voltage is applied to bit lines of a basic array plane via the unselected-bit-line dedicated global bit line GBL_NS when an operation of reading from a memory cell in the basic array plane is performed.

Next, the application of a voltage to the selected global bit line GBL002 is stopped, and the voltage of the selected word line WL00000 is changed from VPR_WL to 0 V. A voltage is not applied to the other unselected word lines. Application of VPR_NGBL to the unselected-bit-line dedicated global bit line GBL_NS is continued. Accordingly, a read voltage VPR_SBL is applied to the selected memory cell, and the electric charge stored in the selected bit lines BL_e2 and the selected global bit line GBL002 is discharged according to the resistance value of the variable resistance element of the memory cell. A read circuit 216 in FIG. 10 detects a time ΔtRD until when the potential of the selected global bit line GBL002 reaches a determination voltage VREF, thereby determining whether the memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e2 and the selected word line WL00000.

At this time, unselected bit lines adjacent to the selected bit lines BL_e2 in the same layers (i.e., in the Y direction) are the bit lines BL_e1 and BL_e3, and both the unselected bit lines BL_e1 and BL_e3 are connected to the unselected-bit-line dedicated global bit line GBL_NS by the second bit line selection signal BLs_s0. Thus, the voltage thereof does not change from the precharge voltage VPR_NSBL, and does not exert an influence on the behavior of a signal in the selected bit lines.

It should be noted that although the application of VPR_NGBL to the unselected-bit-line dedicated global bit line GBL_NS is continued in the above, the capacitance of the unselected-bit-line dedicated global bit line GBL_NS is usually large, and thus a voltage thereof hardly changes in many cases even when the line is in a floating state. In such a case, it is possible to reduce the consumption of electric current by not driving the unselected-bit-line dedicated global bit line GBL_NS and causing the line to be in the floating state. Specifically, the control circuit 212 may control the global bit line decoder/driver 202 so as to cause the unselected-bit-line dedicated global bit line GBL_NS to be in the floating state when an operation of reading from a memory cell in a basic array plane is performed.

FIG. 12B shows the case of reading a memory cell connected to the word line WL00000 and a corresponding one of the bit lines BL_e3, as another example of the read operation. It is assumed that the resistance value of the variable resistance element is the same as that of the memory cell connected to the word line WL00000 and a corresponding one of the bit lines BL_e2 described above. In the read cycle, first, the precharge voltage VPR_GBL is applied to a selected global bit line (GBL003 in FIG. 12B), and the precharge voltage VPR_NGBL is applied to the other unselected global bit lines. The precharge voltage VPR_NGBL is applied to the unselected-bit-line dedicated global bit line GBL_NS. Further, a selection voltage (Vsel in FIG. 12B) is applied to a selected one of the first bit line selection signal BLs_f0 and the second bit line selection signal BLs_s0 (BLs_s0 in FIG. 12B), and an unselection voltage (0 V in FIG. 12B) is applied to the other unselected bit line selection signal. A voltage is not applied to a selected word line (WL00000 in FIG. 12B) and unselected word lines. As a result of the above voltage application, selected bit lines (BL_e3 in FIG. 12B) are precharged to the precharge voltage VPR_SBL via the global bit line GBL003, and unselected bit lines are precharged to the precharge voltage VPR_NSBL via unselected global bit lines and the unselected-bit-line dedicated global bit line GBL_NS. Further, the selected word line and unselected word lines are precharged to VPR_WL from the selected bit lines and unselected bit lines via memory cells.

It should be noted that precharging may be performed using a selected global bit line and unselected global bit lines or using only a selected global bit line, which is the same as in the case of reading a memory cell connected to the selected word line WL00000 and a corresponding one of the unselected bit lines BL_e2.

Next, the application of a voltage to the selected global bit line GBL003 is stopped, and the voltage of the selected word line WL00000 is changed from VPR_WL to 0 V. A voltage is not applied to the other unselected word lines. The application of VPR_NGBL to the unselected-bit-line dedicated global bit line GBL_NS is continued. Accordingly, the read voltage VPR_SBL is applied to the selected memory cell, and the electric charge stored in the selected bit lines BL_e3 and the selected global bit line GBL003 is discharged via the memory cell. The read circuit 216 in FIG. 10 detects a time $\Delta$tRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e3 and the selected word line WL00000.

At this time, unselected bit lines adjacent to the selected bit lines BL_e3 in the same layers (i.e., in the Y direction) are the bit lines BL_e2 and BL_e4, and both the unselected bit lines BL_e2 and BL_e4 are connected to the unselected-bit-line dedicated global bit line GBL_NS by the respective bit line selection signals BLs_f0 and BLs_f1, and thus the voltage of the lines does not change from the precharge voltage VPR_NSBL.

Specifically, as in the case of reading a memory cell connected to the selected word line WL00000 and a corresponding one of the selected bit lines BL_e2, the voltage of unselected bit lines adjacent to the selected bit lines does not change from the precharge voltage VPR_NSBL, which does not exert an influence on the behavior of a signal in the selected bit lines. Therefore, when the resistance value of the variable resistance element of a selected memory cell is the same, the time $\Delta$tRD until when the potential of a global bit line reaches the determination voltage VREF has substantially the same value as that in the case of reading the memory cell connected to the selected word line WL00000 and a corresponding one of the selected bit lines BL_e2.

Figure 25:
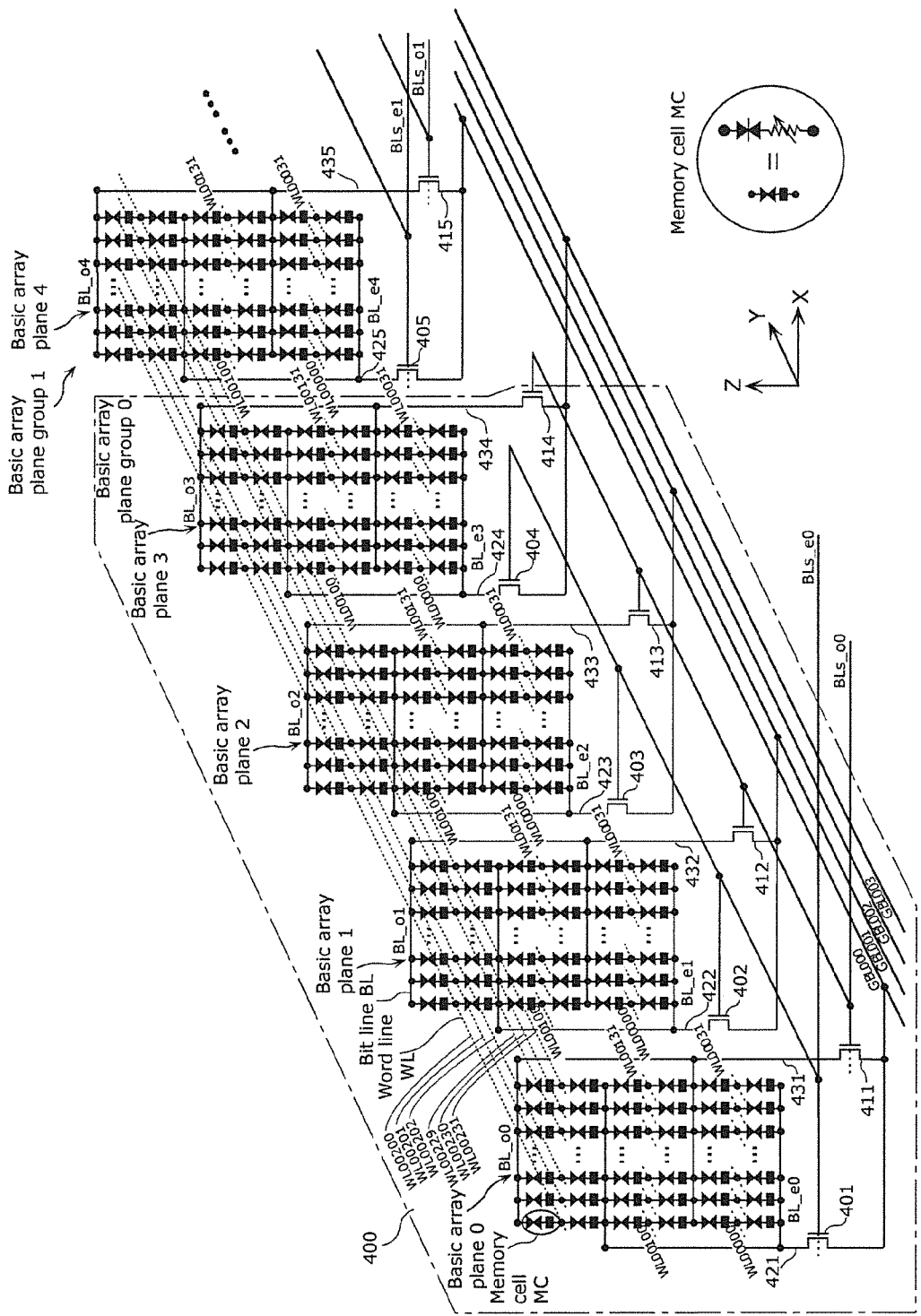
FIG. 25 is a circuit diagram showing a configuration of the conventional basic array plane group.

Now, consider the case of PTL 6 using a memory cell array according to a conventional example, or specifically, a configuration shown in FIG. 25.

Figure 26A:
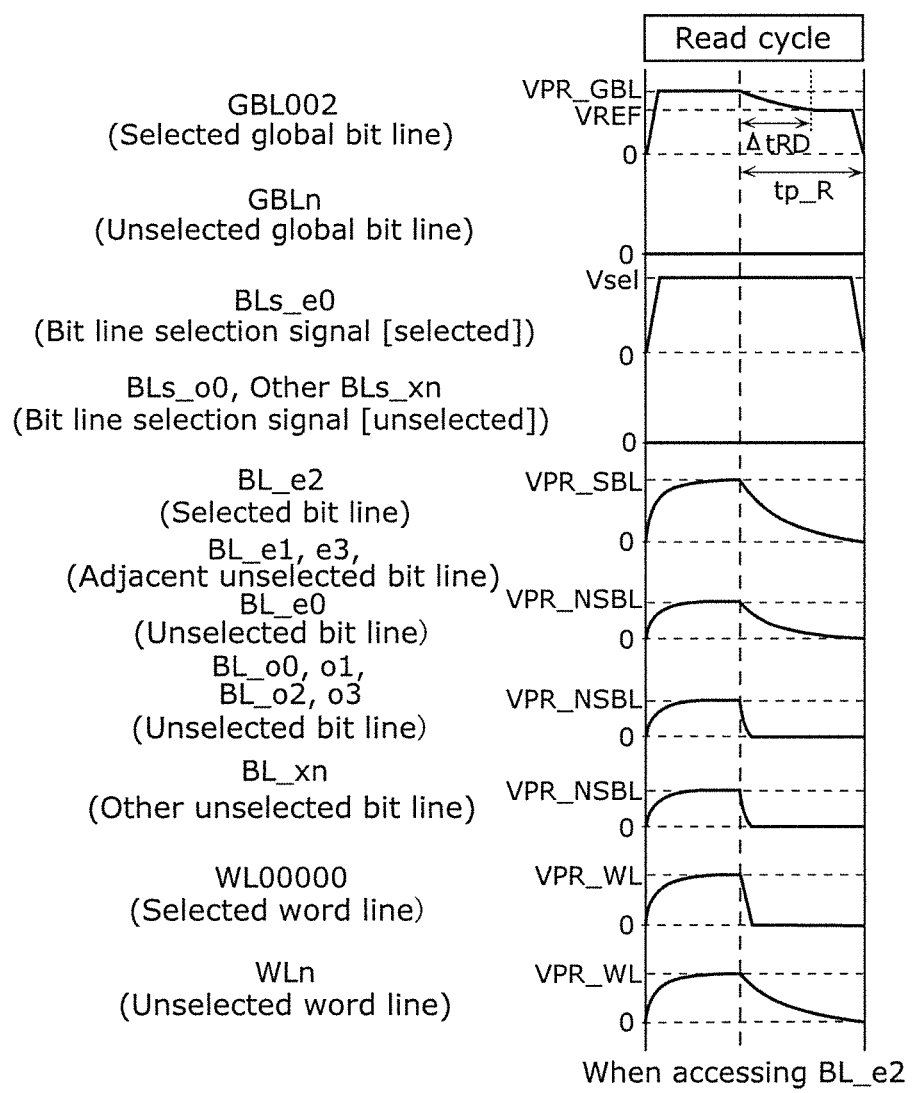
FIG. 26A is a timing waveform diagram for the read operation in the basic array plane group in FIG. 25 (when accessing BL_e2).

FIG. 26A shows the case of reading a memory cell connected to the word line WL00000 and a corresponding one of the bit lines BL_e2, as an example of the read operation. In the read cycle, first, a precharge voltage VPR_GBL is applied to a selected global bit line (GBL002 in FIG. 26A). A voltage may be applied or may not be applied to the other unselected global bit lines. Further, the selection voltage Vsel is applied to a selected one of an even-layer selection signal BLs_e0 and an odd-layer selection signal BLs_o0 (BLs_e0 in FIG. 26A), and an unselection voltage (0 V in FIG. 26A) is applied to the other unselected layer selection signal. A voltage is not applied to the selected word line (WL00000 in FIG. 26A) and unselected word lines. As a result of the above voltage application, the selected bit lines (BL_e2 in FIG. 26A) are precharged to a precharge voltage VPR_SBL via the global bit line GBL002, the selected word line WL00000 and unselected word lines are precharged to VPR_WL from the selected bit lines BL_e2 via a memory cell, and unselected bit lines are precharged to VPR_NSBL from selected and unselected word lines via memory cells.

Next, the application of a voltage to the selected global bit line GBL002 is stopped, and the voltage of the selected word line WL00000 is changed from VPR_WL to 0 V. A voltage is not applied to the other unselected word lines. Accordingly, the read voltage VPR_SBL is applied to the selected memory cell, and according to the resistance value of the variable resistance element of the memory cell, the electric charge stored in the selected bit lines BL_e2 and the selected global bit line GBL002 is discharged. The read circuit 216 in FIG. 10 detects a time $\Delta$tRD until when the potential of the selected global bit line GBL002 reaches the determination voltage VREF, thereby determining whether the memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e2 and the selected word line WL00000.

At this time, as shown in FIG. 25, unselected bit lines adjacent to the selected bit lines BL_e2 in the same layers (i.e., in the Y direction) are the bit lines BL_e1 and BL_e3. Although both the unselected bit lines BL_e1 and BL_e3 are respectively connected to the global bit lines GBL001 and GBL003 by the even-layer selection signal BLs_e0, the load capacitance of the global bit lines is larger, and thus signals in both the unselected bit lines BL_e1 and BL_e3 change toward the stable voltage at a lower speed. Although both changes in the voltages of the adjacent unselected bit lines BL_e1 and BL_e3 propagate to the selected bit lines BL_e2 via the interline capacitance between the selected bit lines BL_e2 and the adjacent unselected bit lines BL_e1 and between the selected bit lines BL_e2 and the adjacent unselected bit lines BL_e3, a signal in the selected bit lines BL_e2 changes at a higher speed, compared with the case of FIG. 12A.

Figure 26B:
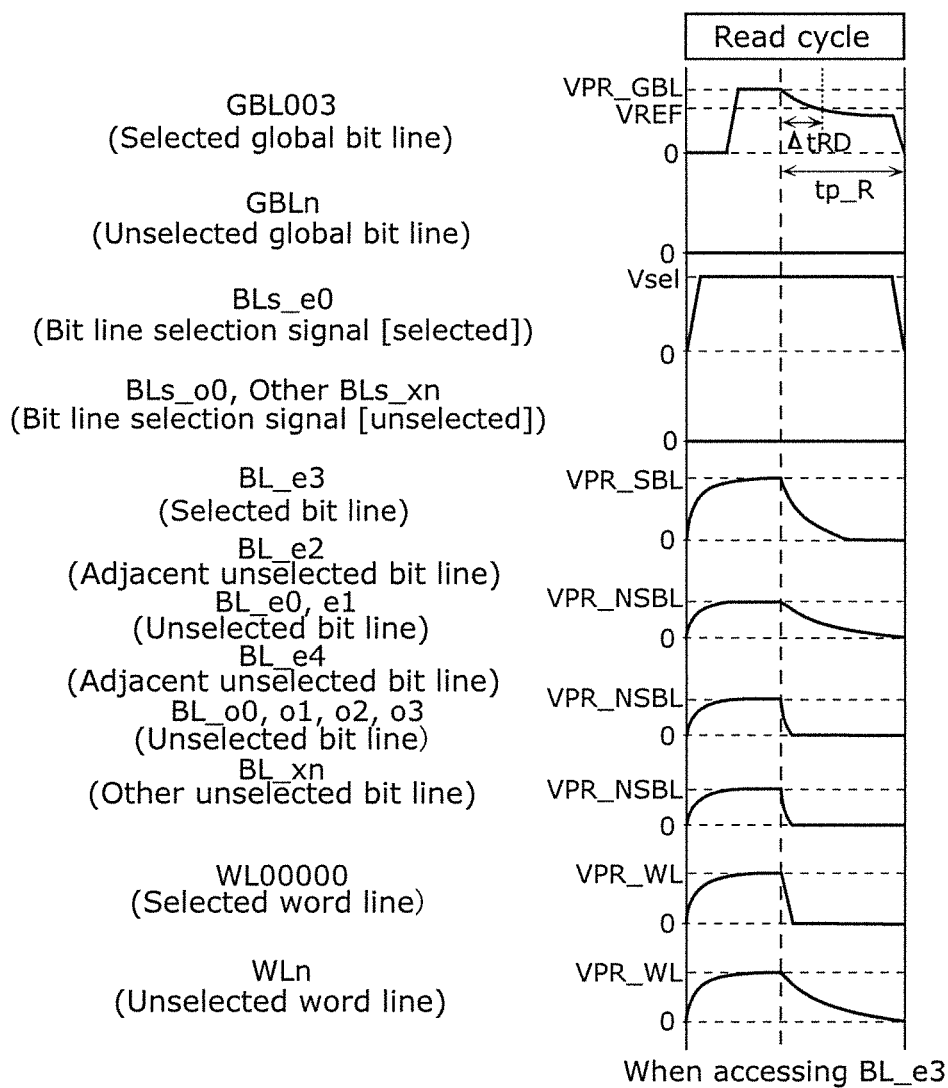
FIG. 26B is a timing waveform diagram for the read operation in the basic array plane group in FIG. 25 (when accessing BL_e3).

Further, FIG. 26B shows the case of reading a memory cell connected to the word line WL00000 and a corresponding one of the bit lines BL_e3 as another example of the read operation, when a memory cell array has a configuration according to a conventional example. It is assumed that the resistance value of the variable resistance element is the same as that of the memory cell connected to the word line WL00000 and a corresponding one of the bit lines BL_e2 described above. In the read cycle, first, the precharge voltage VPR_GBL is applied to a selected global bit line (GBL003 in FIG. 26B). A voltage may be applied or may not be applied to the other unselected global bit lines. Further, the selection voltage Vsel is applied to a selected one of the even-layer selection signal BLs_e0 and the odd-layer selection signal BLs_o0 (BLs_e0 in FIG. 26B), and an unselection voltage (0 V in FIG. 26B) is applied to the other unselected layer selection signal. A voltage is not applied to a selected word line (WL00000 in FIG. 26B) and unselected word lines. As a result of the above voltage application, the selected bit lines (BL_e3 in FIG. 26B) are precharged to the precharge voltage VPR_SBL via the global bit line GBL003, the selected word line WL00000 and unselected word lines are precharged to VPR_WL from the selected bit lines BL_e3 via a memory cell, and unselected bit lines are precharged to VPR_NSBL from selected and unselected word lines via memory cells.

After the end of the precharging, the application of a voltage to the selected global bit line GBL003 is stopped, thereby changing the voltage of the selected word line WL00000 from VPR_WL to 0 V. A voltage is not applied to the other unselected word lines. Accordingly, the read voltage VPR_SBL is applied to the selected memory cell, and the electric charge stored in the selected bit lines BL_e3 and the selected global bit line GBL003 is discharged via the memory cell. The read circuit 216 in FIG. 10 detects a time ΔtRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e3 and the selected word line WL00000.

At this time, as shown in FIG. 25, unselected bit lines adjacent to the selected bit lines BL_e3 in the same layers (i.e., in the Y direction) are the bit lines BL_e2 and BL_e4. The unselected bit lines BL_e2 are connected to a global bit line by the even-layer selection signal BLs_e0, and the load capacitance of the lines is larger. Thus, a signal in the unselected bit lines BL_e2 changes toward the stable voltage at a lower speed, as in the case of FIG. 26A. In contrast, the unselected bit lines BL_e4 are disconnected from a global bit line by the layer selection signal BLs_e1 (since the even-layer selection switch element 405 is in the disconnected state), the load capacitance of the lines is smaller, and thus a signal in the unselected bit lines BL_e4 changes toward the stable voltage at a higher speed. Although a change in the signals in the adjacent unselected bit lines propagates to the selected bit lines via the interline capacitance between the selected bit lines and the adjacent unselected bit lines, a signal in the adjacent unselected bit lines BL_e2 on one side changes at a higher speed, whereas a signal in the adjacent unselected bit lines BL_e4 on the other side changes at a lower speed, and thus the signal in the selected bit lines BL_e3 changes at a still higher speed than the case of FIG. 26A.

Specifically, the signal in the adjacent unselected bit lines BL_e2 changes at a lower speed, and the signal in the adjacent unselected bit lines BL_e4 changes at a higher speed. However, as described above, signals in both the adjacent unselected bit lines BL_e1 and BL_e3 change at a lower speed in the case of reading the memory cell connected to the word line WL00000 and a corresponding one of the bit lines BL_e2. Therefore, even if the resistance value of a variable resistance element of a selected memory cell is the same, a time ΔtRD until when the potential of a global bit line reaches the determination voltage VREF is shorter than that in the case of reading the memory cell connected to the word line WL00000 and a corresponding one of the bit lines BL_e2, which causes variations in the determination time.

As described above, when a memory cell array has a configuration according to a conventional example, even if the resistance value of the variable resistance elements of memory cells is the same, a read time varies depending on the position of the memory cell to be read. However, a memory cell array having a configuration according to the present embodiment has a feature that a read time does not vary, irrespective of the position of a memory cell to be read.

(Simultaneous Reading from Basic Array Planes that are Not Adjacent to Each Other)

The above is a description of the case of reading only one memory cell from one basic array plane in the basic array plane group 100 in the read cycle. Specifically, although a description has been given on the case in which only one global bit line is selected, and a read operation is performed, the circuit configuration of the basic array plane group shown in FIG. 7 includes global bit lines corresponding to, in number, the basic array planes included in the basic array plane group. The word lines are common in the basic array plane group, and thus in the read cycle, it is possible to simultaneously read memory cells connected to the same word line in a plurality of basic array planes by simultaneously selecting these global bit lines.

However, in the case of simultaneously selecting memory cells in a plurality of given basic array planes in the basic array plane group, there are three possible cases, namely, the case in which bit lines adjacent to a selected bit line on both sides in the Y direction are both unselected bit lines, the case in which one of such bit lines is a selected bit line, and the other is an unselected bit line, and the case in which both of such bit lines are selected bit lines. Accordingly, as with the case of the conventional circuit configuration described with reference to FIGS. 25, 26A, and 26B, the behavior of a signal in an adjacent line in the Y direction is different, depending on the position of a memory cell (bit line) to be selected, and thus a read speed varies, which is a problem.

This problem can be solved by simultaneously reading, when a bit in a certain basic array plane is to be read, a bit in a basic array plane that is not adjacent to the certain basic array plane on both sides in the Y direction. For example, in the case of the circuit configuration in FIG. 7, it is sufficient for the global bit line decoder/driver 202 to, under the control of the control circuit 212, simultaneously select a memory cell in the basic array plane 2 when selecting a memory cell in the basic array plane 0, and simultaneously select a memory cell in the basic array plane 3 when selecting a memory cell in the basic array plane 1. Specifically, a reading control circuit may be further provided which does not simultaneously perform, when an operation of reading from a memory cell in a first basic array plane is performed, an operation of reading from a memory cell in a second adjacent basic array plane, or in other words, which further performs, when an operation of reading from a memory cell in a first basic array plane is performed, an operation of simultaneously reading from a memory cell in a third basic array plane not adjacent to the first basic array plane in the Y direction. Such a reading control circuit is fabricated using the control circuit 212 and the global bit line decoder/driver 202.

Figure 13:
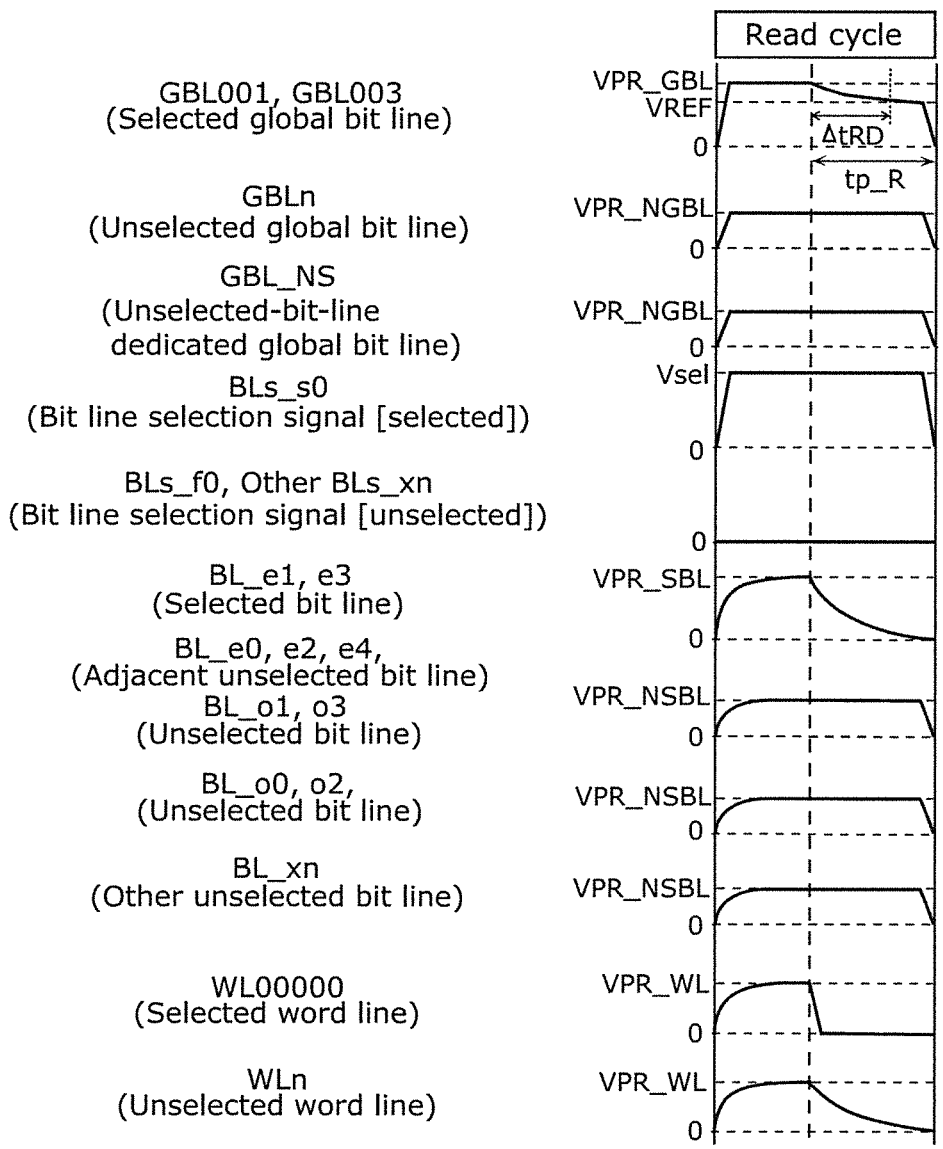
FIG. 13 is a timing waveform diagram for the read operation in the basic array plane group in FIG. 7.

FIG. 13 shows the case of simultaneously reading a memory cell connected to the selected word line WL00000 and a corresponding one of the selected bit lines BL_e1, and a memory cell connected to the selected word line WL00000 and a corresponding one of the selected bit lines BL_e3, as an example of the simultaneous read operation in the circuit configuration of FIG. 7. Although an overview of the operation is the same as in the case of FIG. 12B, a difference is that the global bit line decoder/driver 202 can simultaneously select the global bit line GBL001, in addition to the global bit line GBL003. At this time, unselected bit lines adjacent in the Y direction to BL_e1 which is one of the sets of the selected bit lines are bit lines BL_e0 and BL_e2, and both the unselected bit lines BL_e0 and BL_e2 are connected to the unselected-bit-line dedicated global bit line GBL_NS by the bit line selection signal BL_f0. In contrast, unselected bit lines adjacent in the Y direction to BL_e3 which is another set of the selected bit lines are the bit lines BL_e2 and BL_e4, and also both the unselected bit lines BL_e2 and BL_e4 are connected to the unselected-bit-line dedicated global bit line GBL_NS by the respective bit line selection signals BL_f0 and BL_f1. Therefore, unselected bit lines adjacent to the selected bit lines BL_e1 and BL_e3 in the Y direction are all connected to the unselected-bit-line dedicated global bit line GBL_NS, and thus as in the case of FIGS. 12A and 12B, if the resistance value of variable resistance elements of the selected memory cells is the same, a time ΔtRD until when the potential of the global bit lines reaches the determination voltage VREF has a substantially same value for both the global bit lines.

It should be noted that when a memory cell connected to the word line WL00000 and a corresponding one of the bit lines BL_e0 and a memory cell connected to the word line WL00000 and a corresponding one of the bit lines BL_e2 are simultaneously read, and also when a memory cell connected to the word line WL00000 and a corresponding one of the bit lines BL_e0 and a memory cell connected to the word line WL00000 and a corresponding one of the bit lines BL_e3 are simultaneously read, all unselected bit lines adjacent to the selected bit lines in the Y direction are connected to the unselected-bit-line dedicated global bit line GBL_NS, similarly. Thus, in the above three cases, if the resistance value of variable resistance elements of selected memory cells is the same, the time ΔtRD until when the potential of the global bit lines reaches the determination voltage VREF has substantially the same value for the three cases.

The above is a description of a method in which in the read operation, electric charge stored in a selected global bit line is discharged via a selected cell, and the read circuit 216 in FIG. 10 detects the time ΔtRD until when the potential of the selected global bit line GBL002 reaches the determination voltage VREF, thereby determining whether the memory cell is in the low resistance state or the high resistance state. However, a reading method is not limited to the above method. For example, a sense amplifier circuit may be provided in the read circuit 216, a selected global bit line may be connected to the sense amplifier circuit, and the above potential change may be amplified and detected. Further, a time period to determine whether a memory cell is in the low resistance state or the high resistance state may be generated using a replica circuit generally used.

Furthermore, a load current applying circuit may be provided in the read circuit 216, and a constant load current may be caused to flow into a selected global bit line from the load current applying circuit. In this case, the amount of load current is set such that a selected global bit line is not discharged when a selected cell is in the high resistance state, and a selected global bit line is discharged only when a selected cell is in the low resistance state, which enables the resistance state to be determined by comparing the potential of the selected global bit line after a specified time period elapses with a reference potential. The above amount of load current may be generated using a replica circuit generally used. With any of the reading methods, stable reading can be performed by connecting an unselected bit line adjacent to a selected bit line to the unselected-bit-line dedicated global bit line GBL_NS, when the read operation is performed.

<Physical Structure (Layout) of Basic Array Plane Group>

Figure 14:
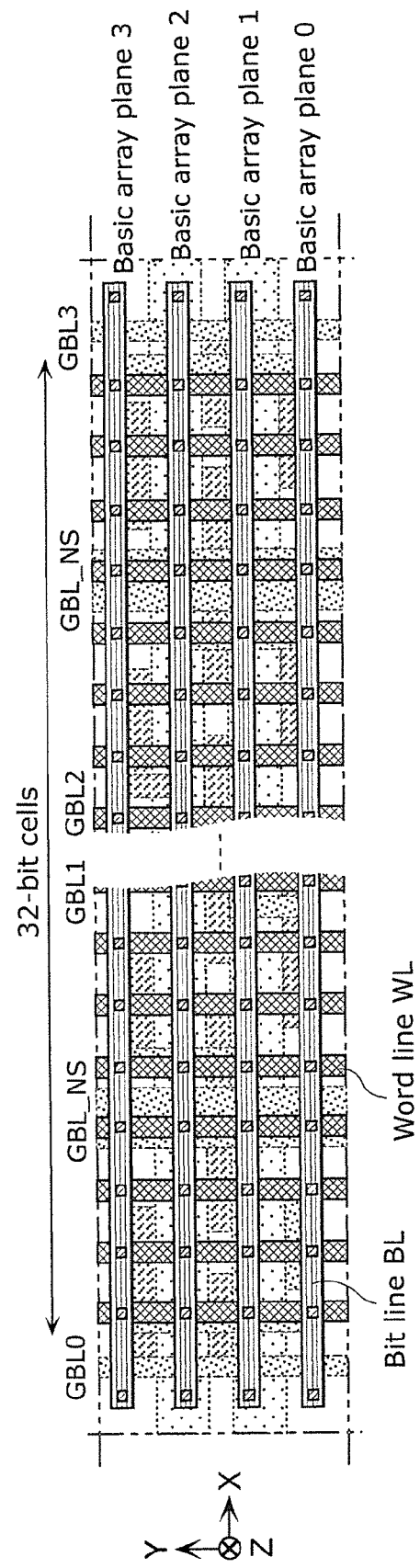
FIG. 14 is a plan view showing a physical structure of the basic array plane group according to the present invention.
Figure 15:
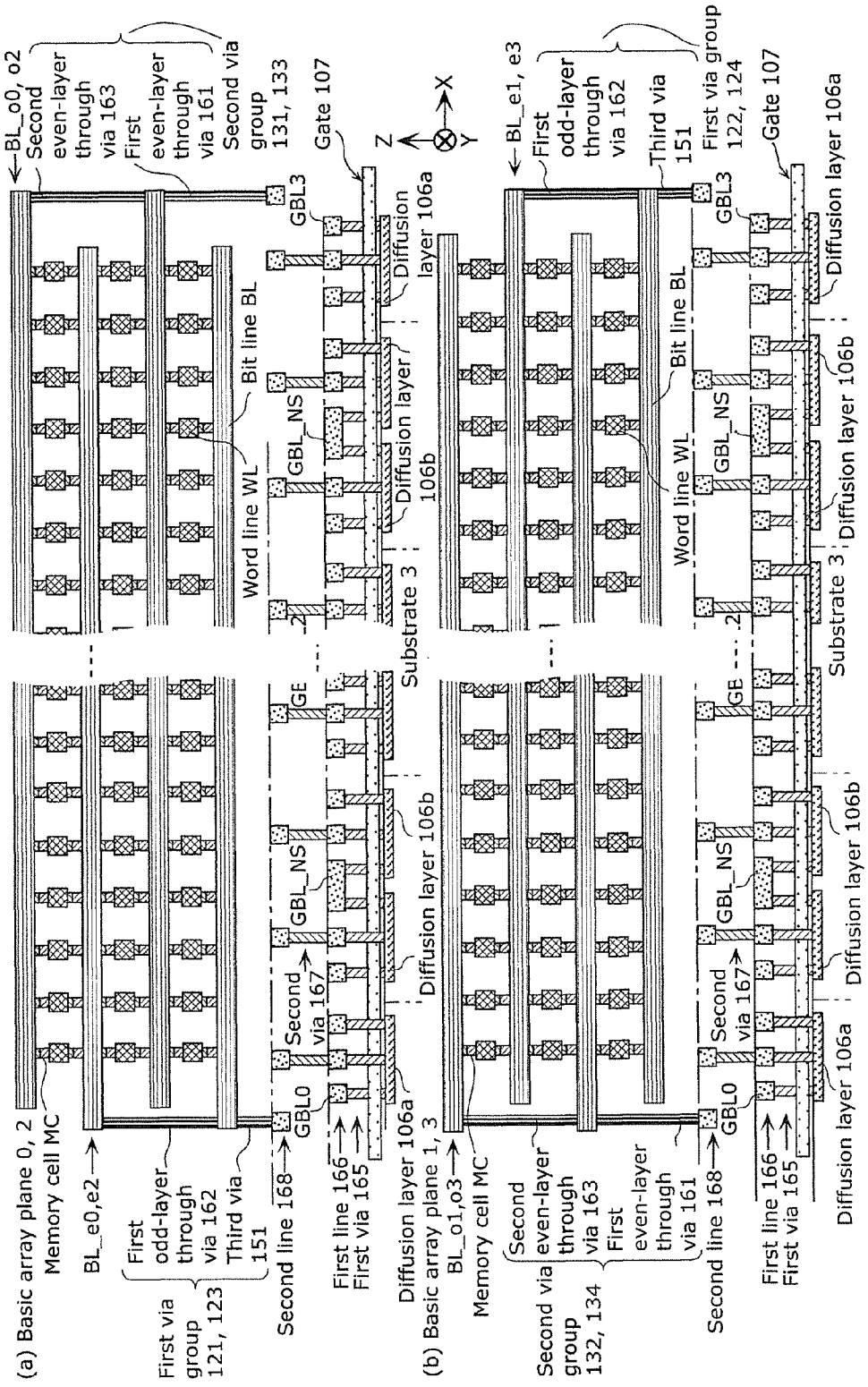
FIG. 15 shows cross-sectional views each showing a physical structure of the basic array plane group according to the present invention.

FIGS. 14 and 15 show an embodiment of a physical structure of a basic array plane group according to the Embodiment 2. FIG. 14 is a plan view, and FIG. 15 shows a cross-sectional view of basic array planes 0 and 2 and a cross-sectional view of basic array planes 1 and 3. In FIG. 14, a horizontal direction is the X direction in which bit lines BL_extend, a vertical direction is the Y direction in which word lines WL extend, and the direction orthogonal to the plane of the drawing is the Z direction. In FIG. 15, a horizontal direction is the X direction in which bit lines BL_extend, a vertical direction is the Z direction, and a direction orthogonal to the plane of the drawings is the Y direction in which word lines WL extend.

In the physical structure shown in FIGS. 14 and 15, a basic array plane group in which a plurality of memory cells MC are arranged is formed above a substrate 3. Global bit lines GBL0 to GBL3 and unselected-bit-line dedicated global bit lines GBL_NS are formed to extend in the Y direction in a layer (layer of first lines 166) under bit lines BL in the undermost layer. Further, each of the first and second selection switch elements includes an N-channel metal-oxide semiconductor field-effect transistor (N-MOSFET), and each of the third and fourth selection switch element includes a P-channel metal-oxide semiconductor field-effect transistor (P-MOSFET), and the selection switch elements are composed of diffusion layers 106a and 106b and a gate 107 which are formed over the substrate 3 and under the global bit lines GBL0 to GBL3 and the unselected-bit-line dedicated global bit lines GBL_NS. It should be noted that all the first, second, third, and fourth selection switch elements may each include an N-MOSFET or a P-MOSFET in Embodiment 1. The global bit lines GBL0 to GBL3 and the diffusion layers 106a, and the unselected-bit-line dedicated global bit lines GBL_NS and the diffusion layers 106b are connected via first vias 165.

Further, in the basic array planes 0 to 3, bit lines BL in even layers (here, bit lines in two layers) are commonly connected via a corresponding one of the first via groups 121 to 124 (including first odd-layer through vias 162) that connect the even-layer bit lines (BL_e0 to BL_e3). Similarly, bit lines BL in odd layers (here, bit lines in two layers) are commonly connected via a corresponding one of the second via groups 131 to 134 (second even-layer through vias 163) that connect the odd-layer bit lines (BL_o0 to BL_o3). Then, each set of the even-layer bit lines BL_e0 to BL_e3 that are commonly connected is connected to a second line 168 via a third via 151, and each set of the odd-layer bit lines BL_o0 to BL_o3 that are commonly connected is connected to a second line 168 via a first even-layer through via 161.

Here, (a) in FIG. 15 shows a cross-sectional view of the basic array planes 0 and 2, and (b) in FIG. 15 shows a cross-sectional view of the basic array planes 1 and 3. As shown in (a) in FIG. 15, in the basic array planes 0 and 2, the first via groups 121 and 123 that respectively connect the even-layer bit lines BL_e0 and BL_e2 to the second line 168 are arranged on the left side in the respective basic array planes, and the second via groups 131 and 133 that respectively connect the odd-layer bit lines BL_o0 and BL_o2 to the second line 168 are arranged on the right side in the respective basic array planes. In contrast, as shown in (b) in FIG. 15, in the basic array planes 1 and 3, the first via groups 122 and 124 that respectively connect the even-layer bit lines BL_e1 and BL_e3 to the second line 168 are arranged on the right side in the respective basic array planes, and the second via groups 132 and 134 that respectively connect the odd-layer bit lines BL_o1 and BL_o3 to the second line 168 are arranged on the left side in the respective basic array planes.

Figure 16:
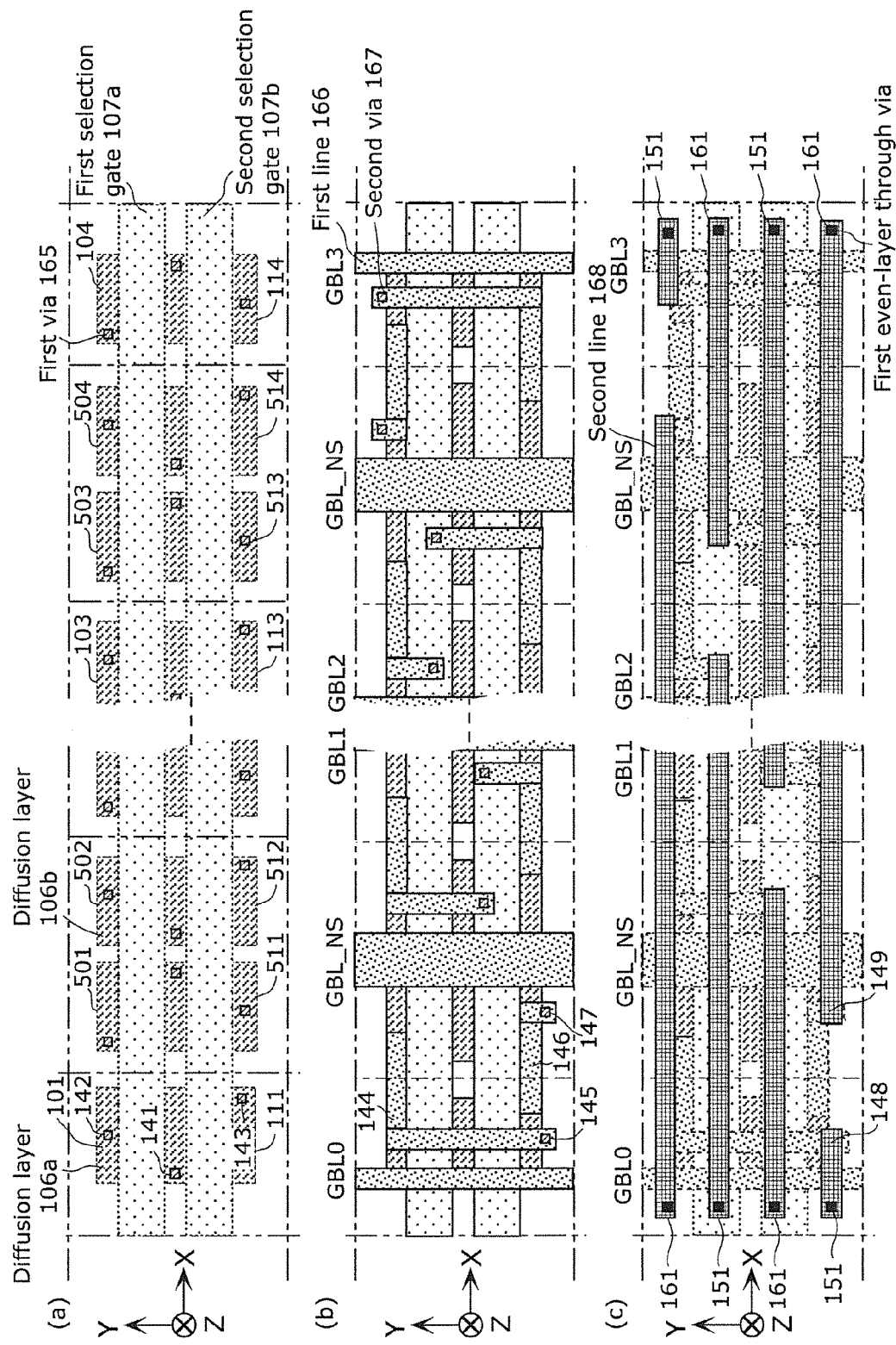
FIG. 16 shows plan views of layers obtained by dividing the physical structure of the basic array plane group according to the present invention.
Figure 17:
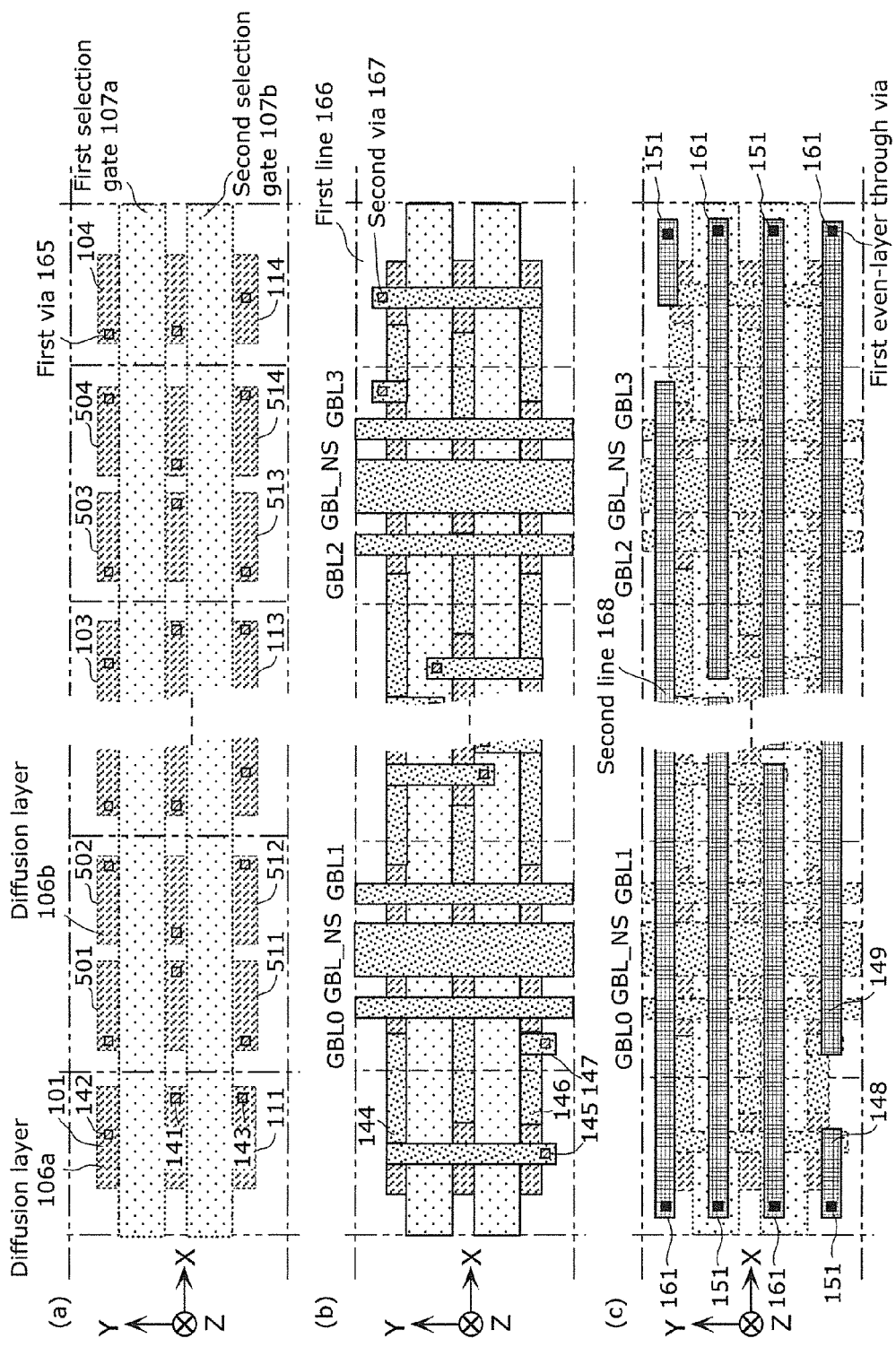
FIG. 17 shows plan views of layers obtained by dividing the physical structure of the basic array plane group according to the present invention.
Figure 18:
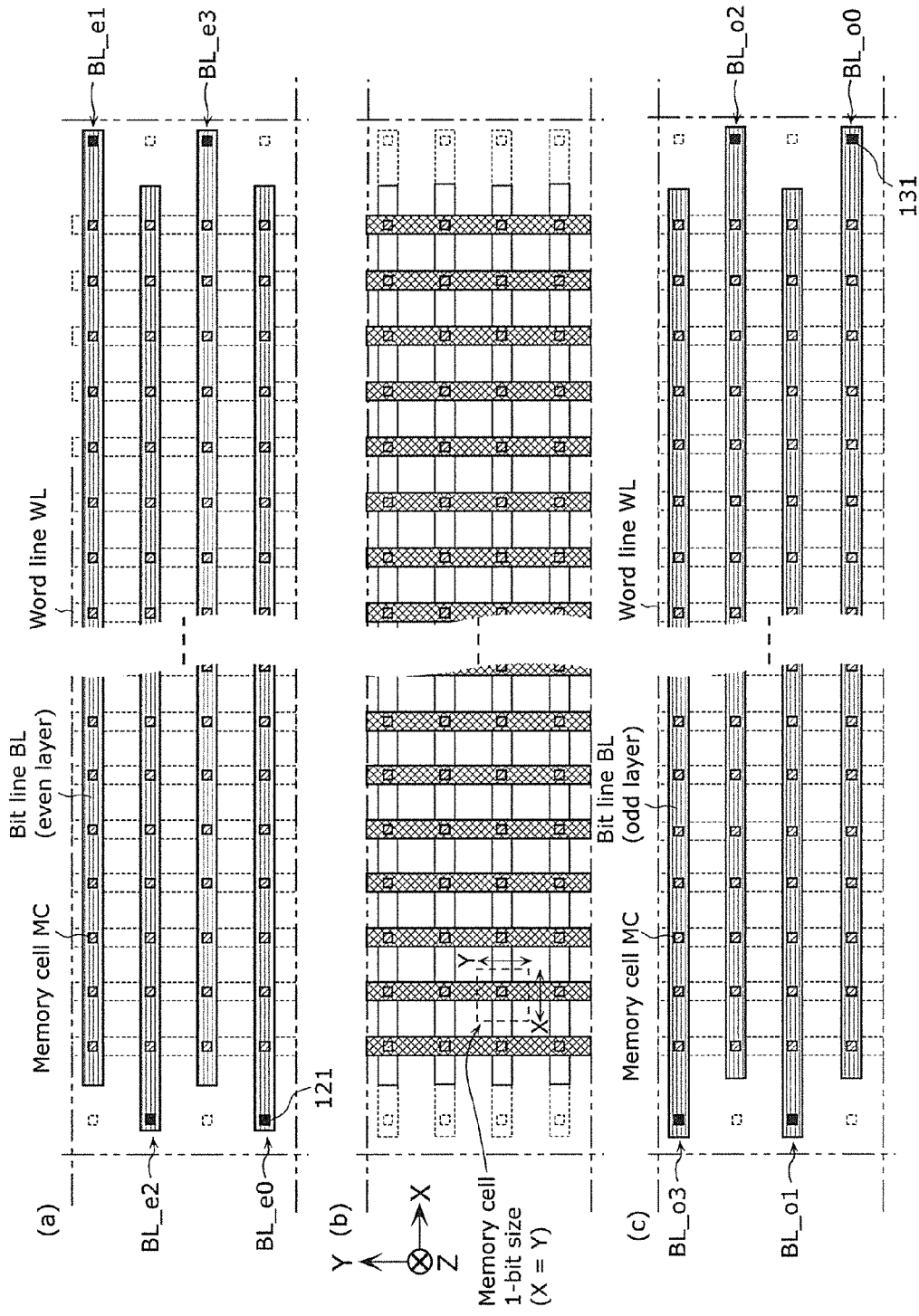
FIG. 18 shows plan views of layers obtained by dividing the physical structure of the basic array plane group according to the present invention.

FIGS. 16 and 17 are plan views showing layers obtained by dividing a layer portion under the third vias 151 and the first even-layer through vias 161 of the physical structure shown in FIGS. 14 and 15, and similarly, FIG. 18 shows plan views of layers obtained by dividing layers above the third vias 151 and the first even-layer through vias 161. It should be noted that FIG. 16 shows plan views corresponding to FIG. 15, and FIG. 17 shows plan views related to a modification in the case of causing the unselected-bit-line dedicated global bit lines GBL_NS to function as shielding wires for selected global bit lines. The following is a further detailed description of the physical structure of the basic array plane group according to the present embodiment, using FIGS. 16 to 18.

In FIG. 16, (a) is a plan view showing a state in which diffusion layers and gates that are included in the first, second, third, and fourth selection switch elements, and the first vias 165 are formed. As shown in (a) in FIG. 16, the first selection switch elements 101 to 104, the second selection switch elements 111 to 114, the third selection switch elements 501 to 504, and the fourth selection switch elements 511 to 514 shown in FIG. 7 includes MOSFETs composed of the diffusion layers 106a and 106b and the gate 107 (107a and 107b). Further, MOSFETs included in the first selection switch element 101 and the second selection switch element 111 in the basic array plane 0 form a MOSFET pair that shares one of diffusion regions serving as a sauce or a drain. Similarly, MOSFETs included in the third selection switch element 501 and the fourth selection switch element 511 form a MOSFET pair that shares one of diffusion regions serving as a sauce or a drain. Similarly, the first selection switch element 102 and the second selection switch element 112 in the basic array plane 1, the first selection switch element 103 and the second selection switch element 113 in the basic array plane 2, and the first selection switch element 104 and the second selection switch element 114 in the basic array plane 3 form respective MOSFET pairs that each share a diffusion region. Similarly, the third selection switch element 502 and the fourth selection switch element 512 in the basic array plane 1, the third selection switch element 503 and the fourth selection switch element 513 in the basic array plane 2, and the third selection switch element 504 and the fourth selection switch element 514 in the basic array plane 3 form respective MOSFET pairs that each share a diffusion region.

Furthermore, the third selection switch elements 501 and 502 and the fourth selection switch elements 511 and 512 of the basic array planes 0 and 1 are arranged adjacently in order to form a common well when both kinds of the selection switch elements each include a P-MOSFET. Similarly, the third selection switch elements 503 and 504 and the fourth selection switch elements 513 and 514 of the basic array planes 2 and 3 are arranged adjacently in order to form a common well when both kinds of the selection switch elements each include a P-MOSFET.

The eight MOSFET pairs are arranged such that the gate length direction thereof is the same as the Y direction, and aligned in the X direction. It should be noted that the number of MOSFET pairs is proportional to the number of basic array planes in a basic array plane group, and in the case of n basic array planes (n is an integer of 2 or more), 2×n MOSFET pairs will be aligned.

Further, in the eight MOSFET pairs, the gates of MOSFETs (here, N-MOSFETs) included in the first selection switch elements 101 to 104 and the gates of MOSFETs (here, P-MOSFETs) included in the third selection switch elements 501 to 504 are commonly connected to each other to form the first selection gate 107a, and also the gates of MOSFETs (here, N-MOSFETs) included in the second selection switch elements 111 to 114 and the gates of MOSFETs (here, P-MOSFETs) included in the fourth selection switch elements 511 to 514 are commonly connected to each other to form the second selection gate 107b. The first bit line selection signal BLs_f0 is given to the first selection gate 107a, and the second bit line selection signal BLs_s0 is given to the second selection gate 107b.

Here, it is sufficient for the third selection switch elements 501 to 504 and the fourth selection switch elements 511 to 514 to have driving capability to fix the potential of unselected bit lines, and the driving capability of the transistors thereof may be lower compared with that of the first selection switch elements 101 to 104 and the second selection switch elements 111 to 114. Therefore, compared to when only the first selection switch elements 101 to 104 and the second selection switch elements 111 to 114 are provided, it is possible to adopt a configuration using transistors with a small gate width, and to arrange the layout with a small increase in the area even when the third selection switch elements 501 to 504 and the fourth selection switch elements 511 to 514 are additionally provided.

Further, the first vias 141 and the like for connection to the global bit lines GBL0 to GBL3 and to the unselected-bit-line dedicated global bit lines GBL_NS are formed in the respective shared diffusion regions in the MOSFET pairs. Further, the first vias 142 and the like for connection to the bit lines BL_e0, BL_o1, BL_e2, and BL_o3 are formed in the respective other diffusion regions of the first selection switch elements 101 to 104 and the third selection switch elements 501 to 504, and the first vias 143 and the like for connection to the bit lines BL_o0, BL_e1, BL_o2, and BL_e3 are formed in the respective other diffusion regions of the second selection switch elements 111 to 114 and the fourth selection switch elements 511 to 514.

In (a) in FIG. 16, the basic array planes 0 to 3 (basic array plane group 0) are aligned in the Y direction, and the selection switch group corresponding to the basic array plane group 0 (16 selection switches in the above example) is arranged under the basic array plane group 0, and has a shape and a size equal to or smaller than a footprint of the basic array plane group 0.

In FIG. 16, (b) is a plan view showing a state in which the first lines 166 including the global bit lines and second vias 167 are formed over the structure in (a) in FIG. 16. As shown in (b) in FIG. 16, the global bit lines GBL0 to GBL3 and the unselected-bit-line dedicated global bit lines GBL_NS all extend in the Y direction, and are connected to the shared diffusion regions of the MOSFET pairs by the first vias 141 (the first vias arranged in the shared diffusion regions) and the like. Further, lines 144 and the like are provided which are connected to the other diffusion regions of the first selection switch elements 101 to 104 and the third selection switch elements 501 to 504 via the first vias 142 (the first vias arranged in the unshared diffusion regions) and the like. In addition, the second vias 167 (such as the vias 145 and 147) for connecting the lines to the bit lines BL_e0, BL_o1, BL_e2, and BL_o3 are formed. Furthermore, lines 146 and the like are provided which are connected to the other diffusion regions of the second selection switch elements 111 to 114 and the fourth selection switch elements 511 to 514 via the first vias 143 and the like. In addition, the second vias 167 (such as vias 147) for connecting the lines 146 and the like to the bit lines BL_o0, BL_e1, BL_o2, and BL_e3 are formed.

In FIG. 16, (c) is a plan view showing a state in which the second lines 168, the third vias 151, and the first even-layer through vias 161 are formed over the structure in (b) in FIG. 16. The second lines 168 are formed in a wiring layer provided between the basic array plane group and the global bit lines GBL and the unselected-bit-line dedicated global bit lines GBL_NS. As shown in (c) in FIG. 16, the third vias 151 of the basic array planes 0 and 2 and the first even-layer through vias 161 of the basic array planes 1 and 3 are aligned in the Y direction at the left ends of the second lines 168, and the first even-layer through vias 161 of the basic array planes 0 and 2 and the third vias 151 of the basic array planes 1 and 3 are aligned in the Y direction at the right ends of the second lines 168. Specifically, respective via regions for common connection of even-layer bit lines BL_e0 commonly connected in the basic array plane 0, the odd-layer bit lines BL_o1 commonly connected in the basic array plane 1, the even-layer bit lines BL_e2 commonly connected in the basic array plane 2, and the odd-layer bit lines BL_o3 commonly connected in the basic array plane 3 are disposed to be adjacent to each other in the Y direction at the left ends of the second lines 168, and also respective via regions for common connection of the odd-layer bit lines BL_o0 commonly connected in the basic array plane 0, the even-layer bit lines BL_e1 commonly connected in the basic array plane 1, the odd-layer bit lines BL_o2 commonly connected in the basic array plane 2, and the even-layer bit lines BL_e3 commonly connected in the basic array plane 3 are disposed to be adjacent to each other in the Y direction at the right ends of the second lines 168. Further, as is clear from the cross-sectional views of FIG. 15, the via groups of the bit lines BL that are commonly connected extend in a direction perpendicular to the substrate 3 from the via regions in the wiring layer.

A plurality of lines 148 are provided so as to connect the third vias 151 to the second vias 145 and the like connected to the other diffusion regions of the selection switch elements 101, 112, 103, and 114 and the selection switch elements 501, 512, 503, and 514. Further, a plurality of lines 149 are provided so as to connect the first even-layer through vias 161 to the second vias 147 and the like connected to the other diffusion regions of the selection switch elements 111, 102, 113, and 104 and the selection switch elements 511, 502, 513, and 504. Accordingly, the vias 151 and 161 are each connected to a corresponding one of the unshared diffusion regions of the first selection switch elements 101 to 104, the third selection switch elements 501 to 504, the second selection switch elements 111 to 114, and the fourth selection switch elements 511 to 514.

In this manner, a wiring layer is provided between the global bit lines and the basic array plane group, and the lines in this wiring layer are interposed for the electrical connection between the commonly-connected bit lines and a corresponding one of the selection switch elements. Consequently, the arrangement of the selection switch elements is not restricted due to the arrangement of the bit line contact regions, thus enabling the arrangement and a size configuration with high flexibility.

It should be noted that in a layer below the third vias 151 and the first even-layer through vias 161, an unselected-bit-line dedicated global bit line GBL_NS may be formed so as to be adjacent to and shared by and furthermore, parallel to two global bit lines adjacent in the Y direction, as shown in (b) in FIG. 17. Specifically, an unselected-bit-line dedicated global bit line GBL_NS may be arranged so as to be parallel and adjacent to the global bit line GBL0 corresponding to the first basic array plane 0 and furthermore, may also be arranged so as to be parallel and adjacent to the global bit line GBL1 corresponding to the second basic array plane 1. Here, the unselected-bit-line dedicated global bit lines GBL_NS are driven so as to have a constant voltage during the read operation, and the capacitance thereof is large. Therefore, using the above wiring structure enables the unselected-bit-line dedicated global bit lines GBL_NS to function as shielding wires for selected global bit lines, and reduction of noise from other lines during the read operation.

In FIG. 18, (a) is a plan view showing even-layer bit lines formed over the structure of (c) in FIG. 16 or (c) in FIG. 17. As shown in (a) in FIG. 18, the even-layer bit lines BL (BL_e0 to BL_e3) are commonly connected via the first via groups 121 to 124 that connect the bit lines in even layers in the common Z direction, and are further connected to the third vias 151 shown in (c) in FIG. 16 and (c) in FIG. 17. It should be noted that memory cells MC are represented using rectangles in (a) in FIG. 18 and other plan views, but have a circular shape in the actual finished dimension.

Here, at the point in time when even-layer bit lines are formed, odd-layer through vias are not formed (dotted-line squares in the drawing), and the interval between the sets of the even-layer bit lines in the via regions is twice as much as the interval between the basic array planes (in the drawing, between BL_e0 and BL_e2 and between BL_e1 and BL_e3), which achieves an advantage of allowing a process to be performed with ease.

In FIG. 18, (b) is a plan view showing word lines formed over the structure of (c) in FIG. 16 or (c) in FIG. 17. Further, in (b) in FIG. 18, a dashed-line rectangle shows a 1-bit (pitch) size of a memory cell MC. Although the pitch in the X direction (bit line direction) is the same as the pitch in the Y direction (word line direction) here, the pitches do not need to be the same.

In FIG. 18, (c) is a plan view showing odd-layer bit lines formed over the structure of (c) in FIG. 16 or (c) in FIG. 17. As shown in (c) in FIG. 18, the odd-layer bit lines BL (BL_o0 to BL_o3) are commonly connected via the second via groups 131 to 134 that connect the bit lines in odd layers in the common Z direction, and are further connected to the first even-layer through vias 161 shown in (c) in FIG. 16 and (c) in FIG. 17.

Further, at the point in time when the odd-layer bit lines are formed, the even-layer through vias are not formed (dotted-line squares in the drawing), and the interval between the sets of the odd-layer bit lines in the via regions is twice as much as the interval between the basic array planes (in the drawing, between BL_o0 and BL_o2 and between BL_o1 and BL_o3), which achieves an advantage of allowing a process to be performed with ease.

Figure 19:
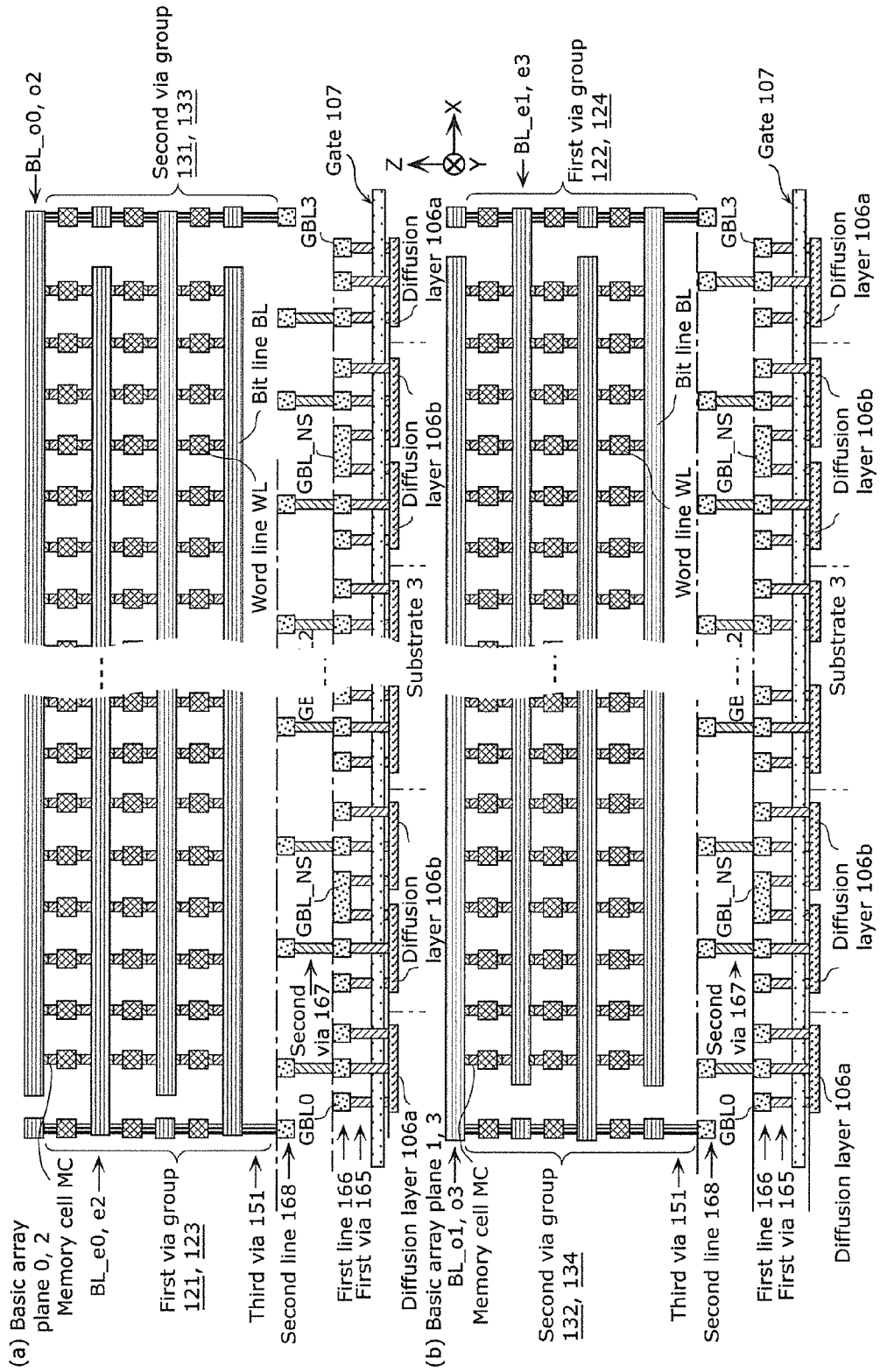
FIG. 19 shows cross-sectional views each showing a physical structure of the basic array plane group according to the present invention.
Figure 20:
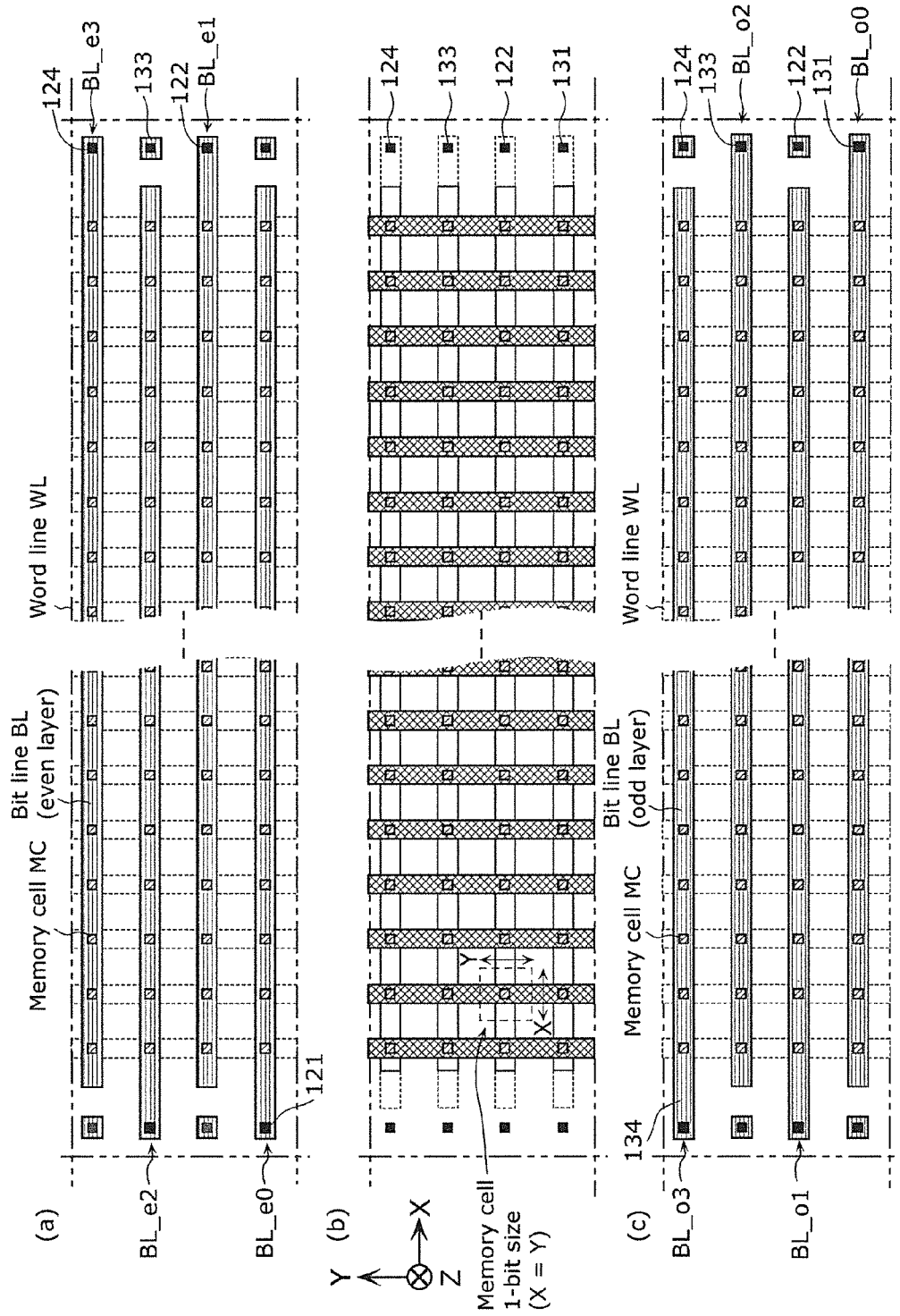
FIG. 20 shows plan views of layers obtained by dividing the physical structure of the basic array plane group according to the present invention.

It should be noted that each of the first via groups 121 to 124 and the second via groups 131 to 134 may be formed by disposing, in layers of word lines and bit lines that are not connected to the via group, separate wiring patterns for connecting upper and lower vias, and connecting the wiring layers using the vias, as shown in FIGS. 19 and 20. FIG. 19 shows modifications of the cross sections shown in FIG. 15, and FIG. 20 shows modifications of the planes shown in FIG. 18.

<Feature of Variable Resistance Nonvolatile Memory Device 500 According to Present Invention>

In considering the structure of multilayer hierarchical bit lines, inventors of the present invention noted the following points.

As the first point, the inventors thought that variations in the read speed can be eliminated by wiring lines, configuring circuits, and controlling the lines and the circuits, such that the behavior of signals is always fixed at a constant voltage in unselected bit lines adjacent to a selected bit line in the Y direction during a read operation, irrespective of the position of the selected bit line.

In the variable resistance nonvolatile memory device 500 according to the present invention, bit lines and bit line selection switches are arranged and controlled such that when an even-layer bit line is selected in a certain basic array plane, even-layer bit lines in basic array planes adjacent on both sides in the Y direction are always connected to the unselected-bit-line dedicated global bit line GBL_NS, whereas when an odd-layer bit line is selected in a certain basic array plane, odd-layer bit lines in basic array planes adjacent on both sides in the Y direction are always connected to the unselected-bit-line dedicated global bit line GBL_NS, thereby fixing the potential of unselected bit lines adjacent on both sides in the Y direction, using the unselected-bit-line dedicated global bit line GBL_NS, irrespective of the position of a bit line to be selected. This wiring and circuit configuration and control enables elimination of variations in the read speed depending on a selected position, and thus bit lines can be wired at minimum intervals.

As the second point, the inventors conceived the physical structure of vias in which in the Z direction that is a layer stacking direction, even-layer bit lines adjacent to each other with an odd layer interposed therebetween are connected using a single via (such as the first odd-layer through via 162), and similarly odd-layer bit lines adjacent to each other with an even layer interposed therebetween are connected using a single via (such as the second odd-layer through via 163), thereby preventing a wiring layer from being provided in a word line or bit line layer that is not connected to a via group. With this physical structure of vias, at the point in time when forming even-layer bit lines, the first odd-layer through vias are not formed, and an interval between sets of even-layer bit lines in via regions is twice as much as the interval between basic array planes, which achieves an advantage of allowing a process to be performed with ease. The same also applies to the case of forming odd layers.

Embodiment 3

In the variable resistance nonvolatile memory device, there are cases in which it is necessary to limit the amount of current flowing into a memory cell during the write operation or erase operation. For example, in the case of a variable resistance element for which a transition metal oxide is used and which is described as an example of the present invention, the amount of current is limited when the state of the variable resistance element is changed from the high resistance state to the low resistance state (when the write operation is performed). In this case, it is sufficient to provide, in the configuration of the basic array plane group according to the embodiment of the present invention shown in FIG. 7, current limiting circuits 171 to 175 and 181 to 185 between the global bit lines GBL000 to GBL003 and the first selection switch elements 101 to 105 and the second selection switch elements 111 to 115.

Specifically, for each of the basic array planes, a current limiting circuit is composed by inserting, between a corresponding one of the global bit lines GBL000 to GBL003 and a corresponding one of the connection points of the first selection switch elements 101 to 105 and the second selection switch elements 111 to 115, a parallel circuit including a corresponding one of the pairs of the N-MOS transistors 171 to 175 and the P-MOS transistors 181 to 185. This is because when an array is formed with all variable resistance elements having the same structure, a current is caused to flow into a memory cell in opposite directions when writing for an even-layer bit line and when writing for an odd-layer bit line, and thus a current for writing can be limited for a memory cell in either layer. In the write or erase operation, between an N-MOS transistor and a P-MOS transistor that form a pair, only one of the transistors that performs a source follower operation is turned ON, thereby causing the transistor that is ON to operate as a current limiting circuit due to a substrate bias effect, for example. Specifically, when a current is caused to flow from a memory cell towards a global bit line, only a P-MOS transistor is turned ON, whereas when a current is caused to flow from a global bit line towards a memory cell, only an N-MOS transistor is turned ON, thereby enabling limitation of a current to be flowed into a memory cell when a write operation is performed. Accordingly, it is possible to avoid a problem that when the state of a variable resistance element is changed from the high resistance state to the low resistance state, the resistance of the variable resistance element is excessively decreased due to an excessive current, and thus the following operations become unstable.

Figure 21:
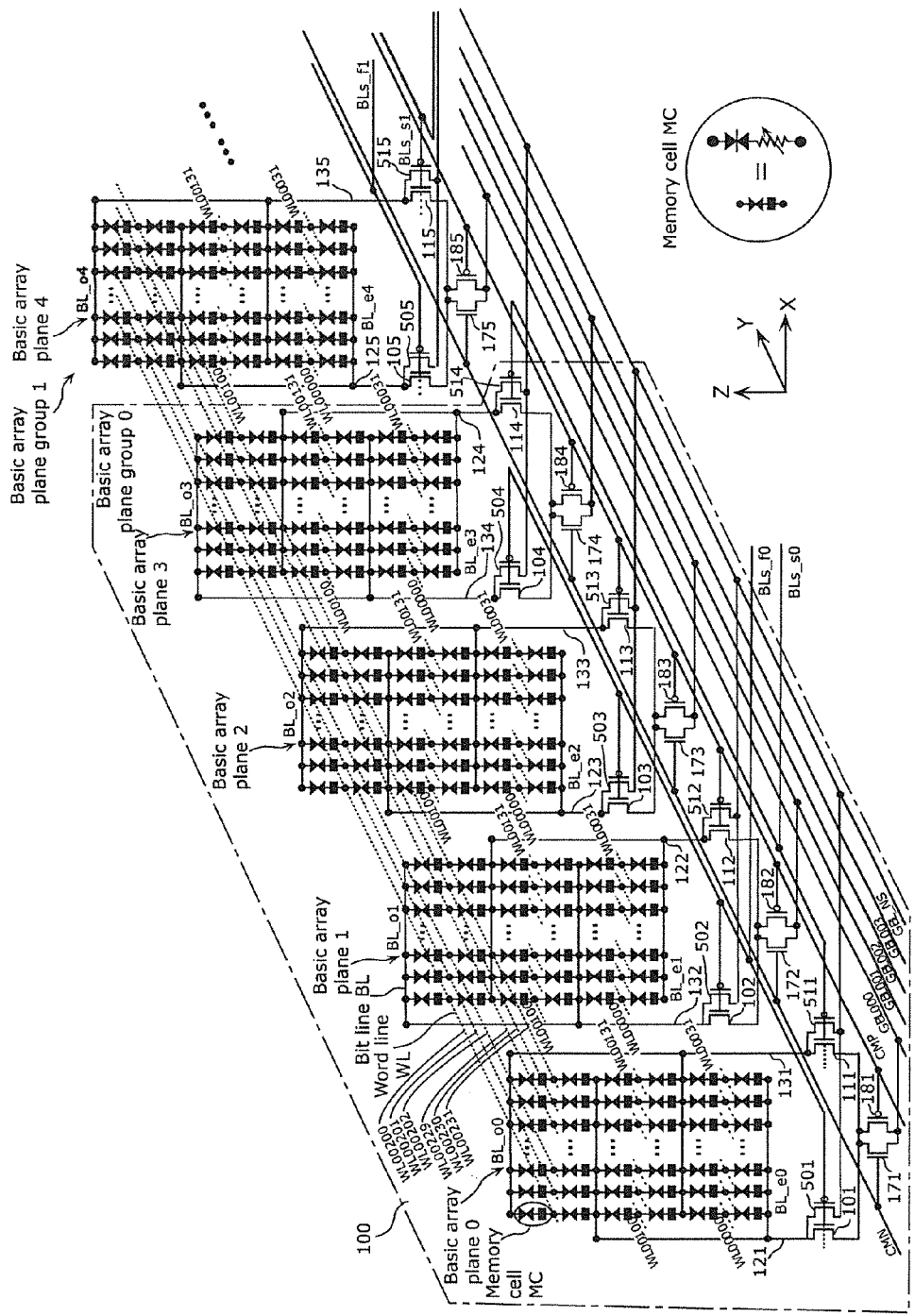
FIG. 21 is a circuit diagram showing an embodiment of a configuration of a basic array plane group according to Embodiment 3.

It should be noted that in the memory cell array composed of the basic array plane group shown in FIGS. 6, 7, and 21, although two basic array planes (the basic array planes 0 and 2 in the above example) are adjacent to a basic array plane (e.g., the basic array plane 1 in FIGS. 6, 7, and 21) that is not at the end portion, only one array plane (the basic the array plane 1 in FIGS. 6, 7, and 21) is adjacent to a basic array plane (the basic array plane 0 in FIGS. 6, 7, and 21) at the end portion. Therefore, although there is a concern that only when accessing the basic array plane 0 at the end portion, a read speed may be different from that when accessing another basic array plane, this concern can be solved by arranging, on the side where the basic array plane 1 is not provided, a dummy basic array plane adjacent to the basic array plane 0 in the Y direction. In this case, it is sufficient that both the first selection switch element and the second selection switch element of the above dummy basic array plane are fixed in the OFF state, and both the third selection switch element and the fourth selection switch element are fixed in the ON state, and bit lines are connected to the unselected-bit-line dedicated global bit line GBL_NS.

<Effect Achieved by Variable Resistance Nonvolatile Memory Device 500 According to Present Invention>

Next is a description of effects of the configuration of the memory cell array included in the variable resistance nonvolatile memory device 500 according to the present invention, taking particular notice of the behavior of signals in a selected bit line and an unselected bit line adjacent to the selected bit line in the Y direction during a read operation.

With the configuration of the conventional memory cell array shown in FIG. 25, depending on the position of a bit line to be selected, there are two cases, namely the case where both unselected bit lines adjacent to the selected bit line on both sides in the same wiring layer (i.e., in the Y direction) are connected to global bit lines by bit line selection switch elements (even-layer selection switch elements 401 to 405 or odd-layer selection switch elements 411 to 415), and the case where one of such unselected bit lines is connected to a global bit line by a corresponding bit line selection switch element, and the other of such unselected bit lines is disconnected from a global bit line. In contrast, the configuration of the memory cell array included in the variable resistance nonvolatile memory device 500 according to the present invention shown in FIGS. 6 and 7 has a feature that irrespective of the position of a bit line to be selected, both unselected bit lines adjacent to the selected bit line on both sides in the same wiring layer (i.e., in the Y direction) are connected to the unselected-bit-line dedicated global bit line GBL_NS by bit line selection switch elements (the third selection switch elements 501 to 505 and the fourth selection switch elements 511 to 515), and the voltage thereof is fixed at a constant voltage.

Figure 22A:
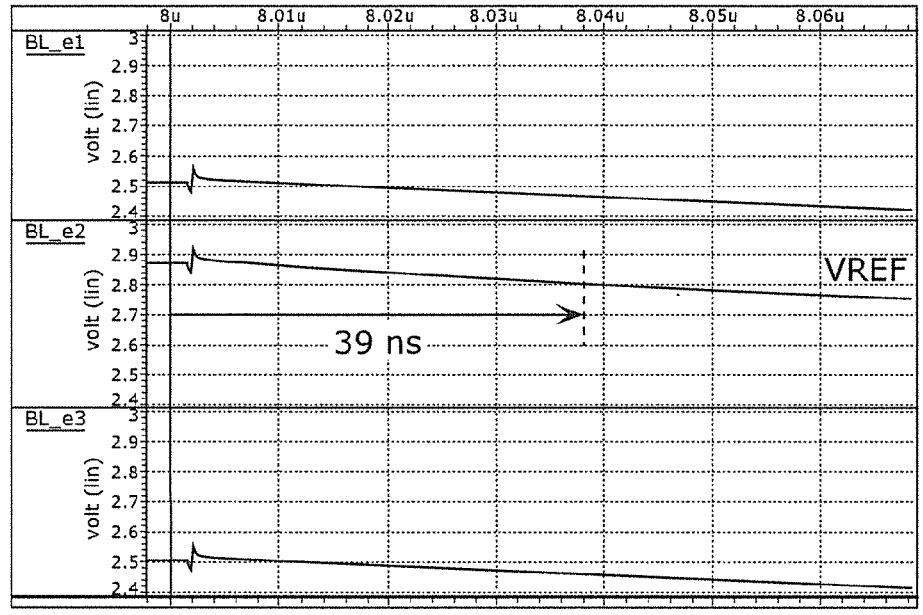
FIG. 22A is a waveform diagram showing a simulation result of a read operation in a conventional basic array plane group (when accessing BL_e2).
Figure 22B:
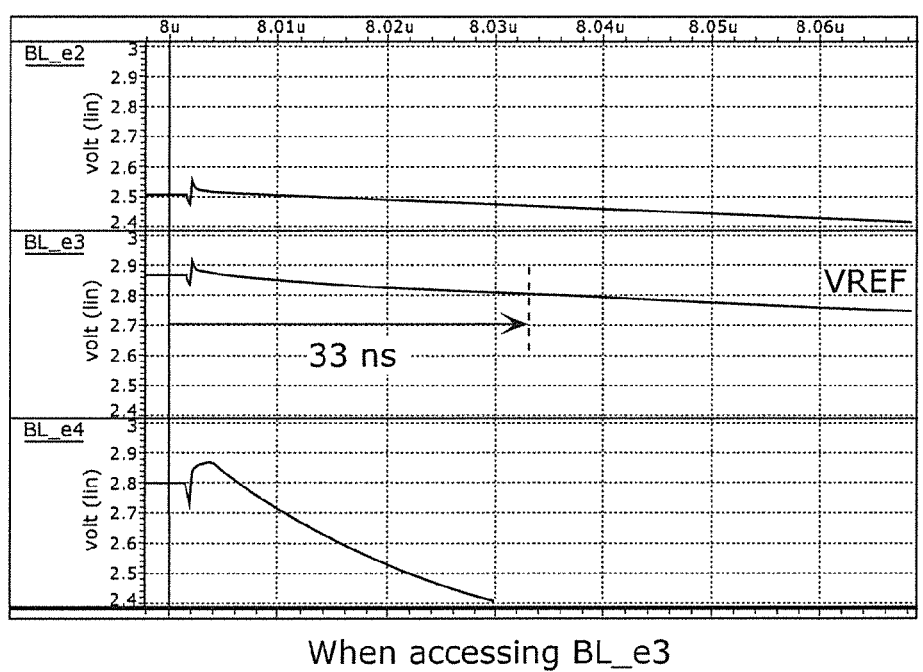
FIG. 22B is a waveform diagram showing a simulation result of the read operation in the conventional basic array plane group (when accessing BL_e3).

With the configuration of the conventional memory cell array, depending on the position of a bit line to be selected, the behavior of signals is different in unselected bit lines adjacent on both sides in the Y direction, which causes a difference in the influence from the unselected bit lines onto the selected bit line due to interline capacitance. Accordingly, even when the resistance value of variable resistance elements of selected memory cells is the same, depending on the selected position, a difference occurs in the behavior of signals in the selected bit lines, and variations in the read speed occur. FIG. 22A shows, in the case of the configuration of the basic array plane group shown in FIG. 25, the behavior of signals in the unselected bit lines BL_e1, the selected bit lines BL_e2, and the unselected bit lines BL_e3 when reading a memory cell connected to the selected word line WL00000 and a corresponding one of the selected bit lines BL_e2, the behavior being obtained as a result of simulation. Further, FIG. 22B shows the behavior of signals in the unselected bit lines BL_e2, the selected bit lines BL_e3, and the unselected bit lines BL_e4 when reading a memory cell connected to the selected word line WL00000 and a corresponding one of the selected bit lines BL_e3, the behavior being obtained as a result of simulation. As shown in FIG. 22A, when reading the memory cell connected to the selected word line WL00000 and a corresponding one of the selected bit lines BL_e2, signals in both adjacent unselected bit lines change toward a stable voltage at a lower speed, whereas as shown in FIG. 22B, when reading the memory cell connected to the selected word line WL00000 and a corresponding one of the selected bit lines BL_e3, it can be seen that a signal in one of the adjacent unselected bit lines changes toward a stable voltage at a lower speed, and a signal in the other changes toward a stable voltage at a higher speed. As described above, since there is a difference in the behavior of signals in unselected bit lines adjacent in the Y direction, a read time when reading the memory cell connected to the selected word line WL00000 and a corresponding one of the selected bit lines BL_e2 is 39 ns, whereas a read time when reading the memory cell connected to the selected word line WL00000 and a corresponding one of the selected bit lines BL_e3 is 33 ns. Thus, it can be seen that there is a difference of 6 ns depending on the selected position.

Figure 23A:
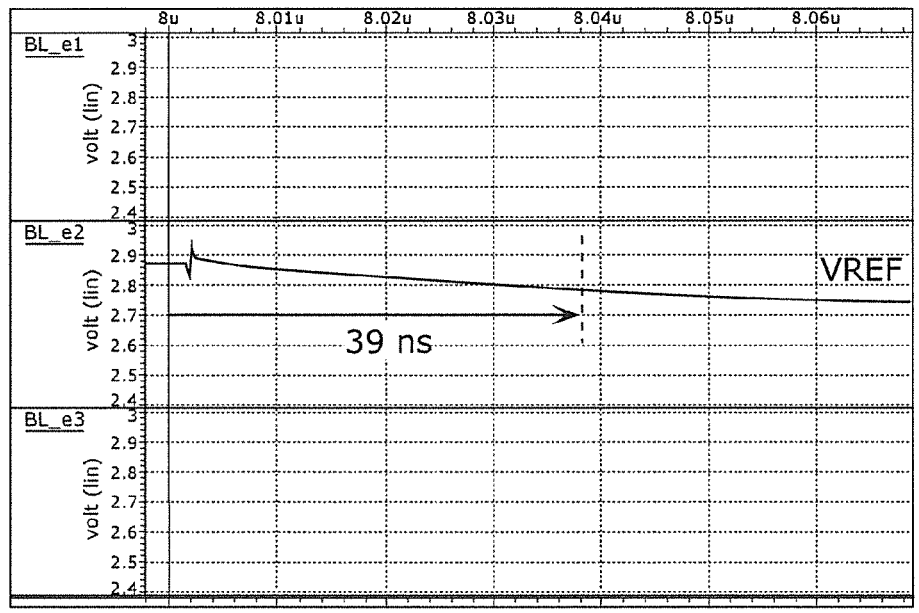
FIG. 23A is a waveform diagram showing a simulation result of the read operation in the basic array plane group according to the present invention (when accessing BL_e2).
Figure 23B:
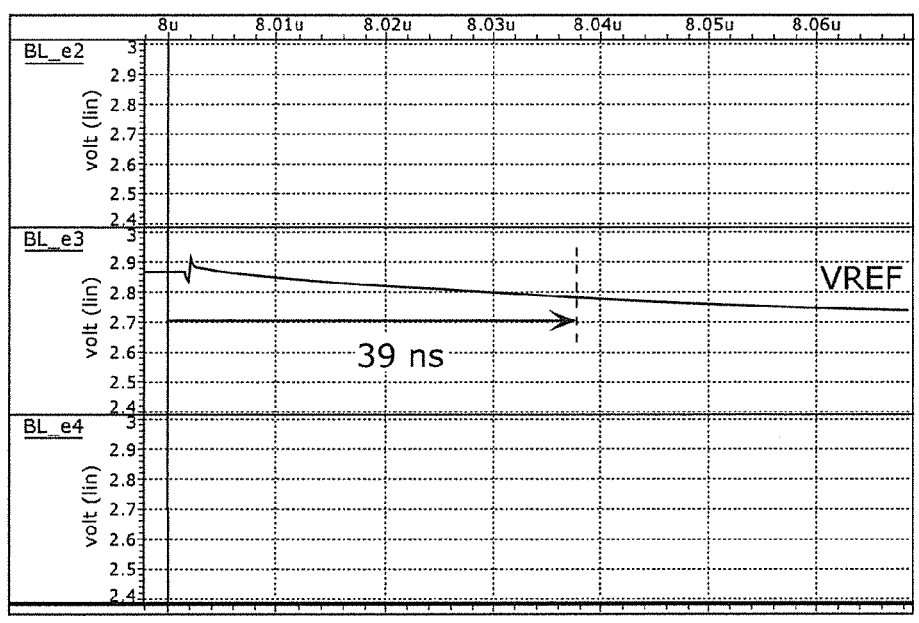
FIG. 23B is a waveform diagram showing a simulation result of the read operation in the basic array plane group according to the present invention (when accessing BL_e3).
Figure 24:
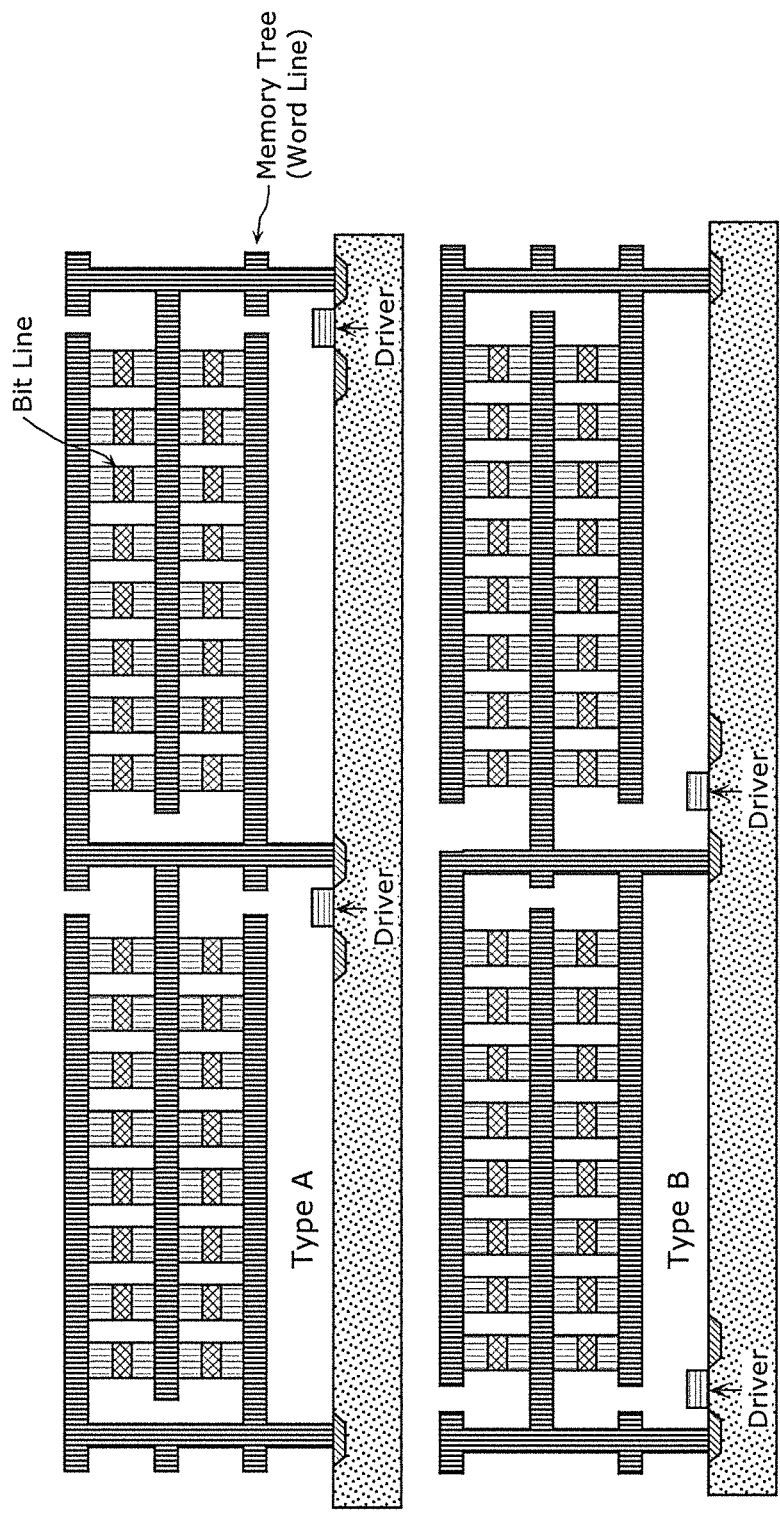
FIG. 24 is a cross-sectional view showing a configuration of a conventional basic array plane.

On the other hand, with the configuration of the memory cell array included in the variable resistance nonvolatile memory device 500 according to the present invention, irrespective of the position of a bit line to be selected, the voltage of unselected bit lines adjacent on both sides in the Y direction is fixed at a constant voltage, and thus there is no difference in the influence on the selected bit line due to interline capacitance. Accordingly, when the resistance value of variable resistance elements of selected memory cells is the same, there is no difference in the behavior of signals in selected bit lines depending on the selected position, and thus variations in the read speed do not occur. FIGS. 23A and 23B show, in the case of the configuration of the basic array plane group shown in FIG. 7, the behavior of signals in a selected bit line and adjacent unselected bit lines in both the cases where a memory cell connected to the selected word line WL00000 and a corresponding one of the selected bit lines BL_e2 is read and where a memory cell connected to the selected word line WL00000 and a corresponding one of the selected bit lines BL_e3 is read as in the cases of FIGS. 22A and 22B, the behavior being obtained as a result of simulation. As shown in FIGS. 23A and 23B, the voltage of both of adjacent unselected bit lines is fixed at a constant voltage (2.8 V in FIGS. 23A and 23B). Accordingly, a read time when reading the memory cell connected to the selected word line WL00000 and a corresponding one of the selected bit lines BL_e2 is 39 ns, and a read time when reading the memory cell connected to the selected word line WL00000 and a corresponding one of the selected bit lines BL_e3 is also 39 ns, which shows that selected positions do not make a difference.

As described above, with the configuration of the memory cell array included in the variable resistance nonvolatile memory device according to the present invention, a read time is constant, irrespective of the position to be selected, and it is not necessary to take into consideration the influence exerted by the behavior of a signal in an unselected bit line due to interline capacitance. Thus, it is possible to wire bit lines at minimum intervals without providing an extra margin in a read circuit. Further, although the above results are examples in the cases of the basic array plane group shown in FIGS. 6 and 7, if the number of wiring layers and the number of memory cells on the same bit line is further increased compared to those in the cases of FIGS. 6 and 7, the influence exerted due to interline capacitance will be more noticeable. Thus, the configuration of the memory cell array included in the variable resistance nonvolatile memory device according to the present invention which does not need to take such an influence into consideration will be more useful.

Although the above is a description of the variable resistance nonvolatile memory device according to the present invention based on three embodiments and the modifications thereof, the present invention is not limited to the embodiment and the modifications. Modifications obtained by applying various changes that can be conceived by a person skilled in the art to the embodiments and the modifications, and any combinations of the constituent elements in the embodiments and the modifications are also included in the present invention without departing from the scope of the present invention.

For example, although the memory cell array included in the variable resistance nonvolatile memory device in the embodiments of the present invention shown in FIGS. 6 and 7 is composed of a plurality of basic array plane groups, and each basic array plane group is composed of four basic array planes, the memory cell array included in the variable resistance nonvolatile memory device according to the present invention is not limited to such a configuration, and may be composed of at least one basic array plane group only, or one basic array plane group may be composed of at least two basic arrays. It is because if a memory cell array is composed of at least two basic array planes, a feature can be achieved that a first via group in a first basic array plane (a via group that connects even-layer bit lines) and a second via group in a second basic array plane (a via group that connects odd-layer bit lines) are adjacent to each other in the Y direction, and a second via group in the first basic array plane and a first via group in the second basic array plane are adjacent to each other in the Y direction.

INDUSTRIAL APPLICABILITY

As described above, a variable resistance nonvolatile memory device according to the present invention is useful to realize, for example, a high-integration and small-area memory, since it is possible to include a memory cell arrays using minimum wiring intervals in the configuration of a mufti-divided memory cell array.

REFERENCE SIGNS LIST

MC Memory cell
BL Bit line
WL Word line
GBL000 to GBL003 Selected-bit-line dedicated global bit line
GBL_NS Unselected-bit-line dedicated global bit line
BL_e0 to BL_e4 Even-layer bit line
BL_o0 to BL_o4 Odd-layer bit line
BLs_f0, BLs_f1 First bit line selection signal
BLs_s0, BLs_s1 Second bit line selection signal
BLns_f0, BLns_f1 Third bit line selection signal
BLns_s0, BLns_s1 Fourth bit line selection signal
BLs_e0, BLs_e1 Even-layer selection signal BLs_o0, BLs_o1 Odd-layer selection signal
CMP Current-limiting-control signal
VREF Read determination voltage
1 Variable resistance element
2 Bidirectional diode element
2a Unidirectional diode element
11 Lower wire
12 Upper wire
13 Lower electrode
14 Diode layer
15 Internal electrode
16 Variable resistance layer
16a First variable resistance layer (first tantalum oxide layer, first hafnium oxide layer, first zirconium oxide layer)
16b Second variable resistance layer (second tantalum oxide layer, second hafnium oxide layer, second zirconium oxide layer)
17 Upper electrode
100 Basic array plane group
101 to 105 First selection switch element
106a, 106b Diffusion layer
107 Gate
107a First selection gate
107b Second selection gate
111 to 115 Second selection switch element
121 to 125 First via group
131 to 135 Second via group
141 to 143, 145, 147, 151, 161 Via
144, 146, 148, 149 Line
171 to 175, 181 to 185 Current limiting circuit (N-MOS transistor, P-MOS transistor)
200 Memory cell array
201 Word line decoder/driver
202 Global bit line decoder/driver
203 Sub-bit line selection circuit
211 Address input circuit
212 Control circuit
213 Pulse generation circuit
214 Write circuit
215 Data input-output circuit
216 Read circuit
300 Main part
400 Basic array plane group
401 to 405 Even-layer selection switch element
411 to 415 Odd-layer selection switch element
421 to 425 Even-layer contact via
431 to 435 Odd-layer contact via
500 Variable resistance nonvolatile memory device
501 to 505 Third selection switch element
511 to 515 Fourth selection switch element

The invention claimed is:

1. A variable resistance nonvolatile memory device including memory cells each having a variable resistance element, a resistance state of which reversibly changes based on an electrical signal, said device comprising:

a substrate;

bit lines in a plurality of layers which are stacked in a Z direction, and in which said bit lines extending in an X direction are aligned in a Y direction, the X and Y directions being directions orthogonal to each other on a plane parallel to a main surface of said substrate, and the Z direction being a direction in which the layers are stacked above the main surface of said substrate;

word lines in a plurality of layers which are stacked in the Z direction and formed at respective intervals between the layers of said bit lines, and in which said word lines extending in the Y direction are aligned in the X direction;

a memory cell array having said memory cells which are formed at respective crosspoints of said bit lines in the layers and said word lines in the layers, and each of which is interposed between a corresponding one of said bit lines and a corresponding one of said word lines, said memory cell array including basic array plane groups arranged in a matrix in the X and Y directions, said basic array plane groups each including a plurality of basic array planes which are aligned in the Y direction and each of which has memory cells included in said memory cells and interposed between, among said bit lines in the layers, bit lines in the layers at the same position in the Y direction and said word lines crossing said bit lines at the same position;

selected-bit-line dedicated global bit lines provided in one-to-one correspondence with said basic array planes;

an unselected-bit-line dedicated global bit line provided in correspondence with said basic array planes; and sets each including a first selection switch element, a second selection switch element, a third selection switch element, and a fourth selection switch element, said sets being provided in one-to-one correspondence with said basic array planes, wherein each of said basic array planes further includes a first internal wire interconnecting only even-layer bit lines among said bit lines in said basic array plane, and a second internal wire interconnecting only odd-layer bit lines among said bit lines in said basic array plane, and for each of said basic array planes, said first internal wire in said basic array plane is connected to said selected-bit-line dedicated global bit line corresponding to said basic array plane via one of said first selection switch element and said second selection switch element that are included in said set corresponding to said basic array plane, and said second internal wire in said basic array plane is connected to said corresponding selected-bit-line dedicated global bit line via the other of said first selection switch element and said second selection switch element that are included in said corresponding set, and when one of said basic array planes included in said basic array plane groups is a first basic array plane, and a different one of said basic array planes is a second basic array plane, said different one being adjacent to said first basic array plane in the Y direction, said first internal wire in said first basic array plane and said second internal wire in said second basic array plane are adjacent to each other in the Y direction, and said second internal wire in said first basic array plane and said first internal wire in said second basic array plane are adjacent to each other in the Y direction, said first internal wire in said first basic array plane is connected to said selected-bit-line dedicated global bit line corresponding to said first basic array plane via said first selection switch element corresponding to said first basic array plane or is connected to said unselected-bit-line dedicated global bit line via said third selection switch element corresponding to said first basic array plane, and said second internal wire in said first basic array plane is connected to said selected-bit-line dedicated global bit line corresponding to said first basic array plane via said second selection switch element corresponding to said first basic array plane or is connected to said unselected-bit-line dedicated global bit line via said fourth selection switch element corresponding to said first basic array plane, said second internal wire in said second basic array plane is connected to said selected-bit-line dedicated global bit line corresponding to said second basic array plane via said first selection switch element corresponding to said second basic array plane or is connected to said unselected-bit-line dedicated global bit line via said third selection switch element corresponding to said second basic array plane, and said first internal wire in said second basic array plane is connected to said selected-bit-line dedicated global bit line corresponding to said second basic array plane via said second selection switch element corresponding to said second basic array plane or is connected to said unselected-bit-line dedicated global bit line via said fourth selection switch element corresponding to said second basic array plane, and with regard to said first selection switch elements, said second selection switch elements, said third selection switch elements, and said fourth selection switch elements corresponding to said basic array planes, electrical connection and disconnection of said first said selection switch elements are controlled by a common first bit line selection signal, electrical connection and disconnection of said second selection switch elements are controlled by a common second bit line selection signal, electrical connection and disconnection of said third selection switch elements are controlled by a common third bit line selection signal, and electrical connection and disconnection of said fourth selection switch elements are controlled by a common fourth bit line selection signal.

2. The variable resistance nonvolatile memory device according to claim 1, wherein in each of said basic array planes, said first selection switch element and said third selection switch element are respectively controlled by the first bit line selection signal and the third bit line selection signal, such that one of said first and third selection switch elements is disconnected when the other is connected, said second selection switch element and said fourth selection switch element are respectively controlled by the second bit line selection signal and the fourth bit line selection signal, such that one of said second and fourth selection switch elements is disconnected when the other is connected, and said first selection switch element and said second selection switch element are respectively controlled by the first bit line selection signal and the second bit line selection signal, such that one of said first and second selection switch elements is disconnected when the other is connected.

3. The variable resistance nonvolatile memory device according to claim 1, wherein said first selection switch elements each include one of an N-channel metal-oxide semiconductor (N-MOS) transistor and a P-channel metal-oxide semiconductor (P-MOS) transistor, and said third selection switch elements each include the other, said second selection switch elements each include one of the N-MOS transistor and the P-MOS transistor, and said fourth selection switch elements each include the other, the same signal serves as the first bit line selection signal and the third bit line selection signal, the same signal serves as the second bit line selection signal and the fourth bit line selection signal, one of the first bit line selection signal and the second bit line selection signal performs control such that corresponding ones of said first to fourth selection switch elements are connected, and the other of the first bit line selection signal and the second bit line selection signal performs control such that corresponding ones of said first to fourth selection switch elements are disconnected.

4. The variable resistance nonvolatile memory device according to claim 3, wherein said first selection switch elements and said second selection switch elements each include the N-MOS transistor, and said third selection switch elements and said fourth selection switch elements each include the P-MOS transistor.

5. The variable resistance nonvolatile memory device according to claim 1, further comprising:

a global bit line decoder/driver that selects at least one of said selected-bit-line dedicated global bit lines, applies a read voltage to said at least one selected-bit-line dedicated global bit line which is selected, and applies a precharge voltage previously determined to said unselected-bit-line dedicated global bit line;

a read circuit that reads a resistance state of a memory cell in said basic array plane corresponding to said at least one selected-bit-line dedicated global bit line selected by said global bit line decoder/driver; and a control circuit that controls said global bit line decoder/driver, wherein when an operation of reading from a memory cell in one of said basic array planes is performed, said control circuit controls said global bit line decoder/driver such that the precharge voltage is applied to a bit line of said basic array plane via said unselected-bit-line dedicated global bit line.

6. The variable resistance nonvolatile memory device according to claim 1, further comprising:

a global bit line decoder/driver that selects at least one of said selected-bit-line dedicated global bit lines, applies a read voltage to said at least one selected-bit-line dedicated global bit line which is selected, and drives said unselected-bit-line dedicated global bit line;

a read circuit that reads a resistance state of a memory cell in said basic array plane corresponding to said at least one selected-bit-line dedicated global bit line selected by said global bit line decoder/driver; and a control circuit that controls said global bit line decoder/driver, wherein when an operation of reading from a memory cell in one of said basic array planes is performed, said control circuit controls said global bit line decoder/driver such that said unselected-bit-line dedicated global bit line is caused to be in a floating state.

7. The variable resistance nonvolatile memory device according to claim 1, wherein said unselected-bit-line dedicated global bit line is disposed so as to be parallel and adjacent to said selected-bit-line dedicated global bit line corresponding to said first basic array plane, and to said selected-bit-line dedicated global bit line corresponding to said second basic array plane.

8. The variable resistance nonvolatile memory device according to claim 1, wherein for each of said basic array planes, said first internal wire in said basic array plane connects all said even-layer bit lines in said basic array plane using a single via, and said second internal wire in said basic array plane connects all said odd-layer bit lines in said basic array plane using a single via, said even-layer bit lines being adjacent to each other in the Z direction with said odd-layer bit lines in said basic array plane interposed, and said odd-layer bit lines being adjacent to each other in the Z direction with said even-layer bit lines in said basic array plane interposed.

9. The variable resistance nonvolatile memory device according to claim 1, further comprising, for each of said basic array planes, a current limiting circuit between said selected-bit-line dedicated global bit line corresponding to said basic array plane and terminals, one of the terminals being a terminal of said first selection switch element corresponding to said basic array plane, and the other of the terminals being a terminal of said second selection switch element corresponding to said basic array plane.

10. The variable resistance nonvolatile memory device according to claim 1, further comprising a reading control circuit that prevents, when an operation of reading from a memory cell in said first basic array plane is performed, an operation of reading from a memory cell in said second basic array plane from being simultaneously performed.

11. The variable resistance nonvolatile memory device according to claim 10, wherein when the operation of reading from a memory cell in said first basic array plane is performed, said reading control circuit further causes an operation of reading from a memory cell in a third basic array plane to be simultaneously performed, said third basic array plane not being adjacent to said first basic array plane in the Y direction.

* * * * *